US012619006B2

(12) United States Patent
Fukagawa et al.

(10) Patent No.: US 12,619,006 B2
(45) Date of Patent: May 5, 2026

(54) WAVELENGTH SELECTIVE ABSORPTION FILTER AND DISPLAY DEVICE

(71) Applicant: FUJIFILM Corporation, Tokyo (JP)

(72) Inventors: Nobutaka Fukagawa, Kanagawa (JP); Hiroki Kuwahara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 484 days.

(21) Appl. No.: 18/318,420

(22) Filed: May 16, 2023

(65) Prior Publication Data

US 2023/0288610 A1 Sep. 14, 2023

Related U.S. Application Data

(63) Continuation of application No. PCT/JP2021/048223, filed on Dec. 24, 2021.

(30) Foreign Application Priority Data

Dec. 25, 2020 (JP) ................................ 2020-217496
Aug. 12, 2021 (JP) ................................ 2021-131753

(51) Int. Cl.
*G02B 1/04* (2006.01)
*G02B 5/00* (2006.01)
(Continued)

(52) U.S. Cl.
CPC ............... *G02B 1/04* (2013.01); *G02B 5/003* (2013.01); *G02B 5/223* (2013.01); *G02B 5/287* (2013.01);
(Continued)

(58) Field of Classification Search
None
See application file for complete search history.

(56) References Cited

U.S. PATENT DOCUMENTS

2015/0093698 A1* 4/2015 Tian ................... G03G 9/08711 549/13
2016/0161801 A1 6/2016 Watano et al.
(Continued)

FOREIGN PATENT DOCUMENTS

JP 2008-203436 A 9/2008
JP 2014-210698 A 11/2014
(Continued)

OTHER PUBLICATIONS

Office Action, issued by the Japanese Patent Office on Sep. 16, 2025, in connection with Japanese Patent Application No. 2022-571686.
(Continued)

*Primary Examiner* — Jeffrey D Washville
(74) *Attorney, Agent, or Firm* — Edwards Neils LLC; Jean C. Edwards, Esq.

(57) ABSTRACT

A wavelength selective absorption filter contains a resin, a coloring agent, and a compound having at least one polar group of a carboxylic acid ester bond, a carboxylic acid amide bond, a sulfonic acid amide bond, a urethane bond, or a sulfonyl bond and a MW≤1,000 where dye includes at least one of dye A having a main absorption wavelength range at a wavelength of 390 to 440 nm and dye D having a main absorption wavelength range at a wavelength of 680 to 780 nm, a 20% value wavelength A with respect to an absorbance maximal value exhibited by a main absorption wavelength is 455 nm or less where dye A is contained, and a 20% value wavelength D with respect to the absorbance maximal value exhibited by the main absorption wavelength is 640 nm or more where dye D is contained, and a display device.

10 Claims, 1 Drawing Sheet

(51) Int. Cl.

| | |
|---|---|
| ***G02B 5/22*** | (2006.01) |
| ***G02B 5/28*** | (2006.01) |
| ***G02F 1/00*** | (2006.01) |
| ***G02F 1/01*** | (2006.01) |
| ***H10K 59/80*** | (2023.01) |
| ***H10W 90/00*** | (2026.01) |

(52) U.S. Cl.

CPC .......... *G02F 1/0063* (2013.01); *G02F 1/0105* (2013.01); *H10W 90/00* (2026.01); *H10K 59/8791* (2023.02)

(56) References Cited

U.S. PATENT DOCUMENTS

| | | | | |
|---|---|---|---|---|
| 2017/0235032 | A1 | 8/2017 | Miyazaki | |
| 2020/0032066 | A1 | 1/2020 | Kohsaka et al. | |
| 2020/0181363 | A1 | 6/2020 | Hu et al. | |
| 2022/0049068 | A1 * | 2/2022 | Sasaki ...................... | G02B 1/04 |

FOREIGN PATENT DOCUMENTS

| | | | |
|---|---|---|---|
| JP | 2015-036734 | A | 2/2015 |
| JP | 2015-091923 | A | 5/2015 |
| JP | 2017-142412 | A | 8/2017 |
| JP | 2019-049586 | A | 3/2019 |
| JP | 2019-215533 | A | 12/2019 |
| JP | 2020-530140 | A | 10/2020 |
| WO | 2012/043375 | A1 | 4/2012 |
| WO | 2014/208749 | A1 | 12/2014 |
| WO | 2018/186489 | A1 | 10/2018 |
| WO | 2020/235674 | A1 | 11/2020 |

OTHER PUBLICATIONS

International Search Report issued in PCT/JP2021/048223 on Mar. 15, 2022.

Written Opinion issued in PCT/JP2021/048223 on Mar. 15, 2022.

International Preliminary Report on Patentability completed by WIPO on Mar. 3, 2023 in connection with International Patent Application No. PCT/JP2021/048223.

* cited by examiner

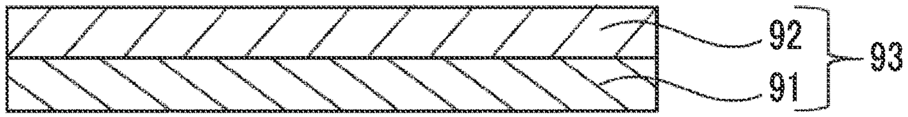
92
91
93

WAVELENGTH SELECTIVE ABSORPTION FILTER AND DISPLAY DEVICE

CROSS-REFERENCE TO RELATED APPLICATIONS

This application is a Continuation of PCT International Application No. PCT/JP2021/048223 filed on Dec. 24, 2021, which was published under PCT Article 21(2) in Japanese, and which claims priority under 35 U.S.C. § 119 (a) to Japanese Patent Application No. 2020-217496 filed in Japan on Dec. 25, 2020, and Japanese Patent Application No. 2021-131753 filed in Japan on Aug. 12, 2021. The above applications are hereby expressly incorporated by reference, in their entirety, into the present application.

BACKGROUND OF THE INVENTION

1. Field of the Invention

The present invention relates to a wavelength selective absorption filter and a display device.

2. Description of the Related Art

On the other hand, with the increase in the size of displays (display devices) or the spread of tablet personal computers (PCs) and smartphones, the environment in which displays are used has become more diverse, and thus it has become increasingly important to improve the visibility in bright places, for example, directly under sunlight or bright indoor lighting. In general, an antireflection function is provided in the display screen of the display so that an observer can easily see the image. Such a function is realized by an antireflection film or an antiglare film. Examples of the general antireflection film include an anti reflection (AR) film or a low reflection (LR) film, in which a film having a refractive index different from that of a base material is coated on the surface of the base material to reduce reflection by the effect of interference between the light reflected on the surface of the base material and the light reflected on the surface of the coated film. In addition, examples of the general antiglare film include an antiglare (AG) film including an antiglare layer, in which a film having a fine uneven pattern is coated on the surface of a base material to prevent the reflected glare of the image by using the light scattering effect.

However, a part of the light incident on the display is transmitted through the antireflection film or the antiglare film on the surface and then is reflected on the surface of the electrode, wire, or the like, or the glass surface of the cell. This is called internal reflection. In association with the increase in resolution of displays, the proportion of the area of the metal parts such as electrodes or wires to the area of the entire panel (the area of the metal parts such as electrodes or wires/the area of the entire panel) increases, and thus the prevention of the above-described internal reflection is a particularly important factor in ensuring high-quality display performance.

As a means for preventing the internal reflection, there is known a method of providing a λ/4 phase difference plate or a λ/2 phase difference plate between a polarizer of a polarizing plate and an internal reflection place and causing it to function as a circularly polarizing plate, for example, as described in WO2012/043375A. However, this method has a problem in that the transmittance of the display light is reduced to about 40% and in a case where scattering particles are present between the circularly polarizing plate and the internal reflection place, depolarization occurs and thus a sufficient antireflection effect cannot be obtained.

As a result, there is a demand for the development of an antireflection unit that does not use the λ/4 phase difference plate or the λ/2 phase difference plate.

For example, JP2015-36734A discloses a liquid crystal display device using a method of preventing the reflection of external light by adding an absorption material having an absorption peak having a half-width of 50 nm or less in a polarizing plate on a viewer side, the absorption material being at least one of a first absorption material having a maximum value of absorbance in a wavelength range of 470 to 510 nm or a second absorption material having a maximum value of absorbance in a wavelength range of 560 to 610 nm.

In addition, for the intended purpose of suppressing a decrease in contrast and improving color reproduction in a bright place for an image display device, particularly a self-luminous type image display device such as a plasma display, JP2008-203436A proposes using an optical filter having an absorption maximum in each of a wavelength range of 380 nm to 420 nm, a wavelength range of 480 nm to 520 nm, and a wavelength range of 585 nm to 620 nm.

On the other hand, an optical film having a function of cutting out blue light is also known. For example, JP2017-142412A discloses an optical film which contains an absorption material having an absorption maximum in a wavelength range of 380 nm to 420 nm and has selective absorption in a vicinity of 420 nm and in which a ratio of an absorbance at 450 nm to an absorbance at a wavelength of 420 nm is in a specified range. In addition, WO2014/208749A discloses a cured film containing a coloring agent having a specific chemical structure, and it describes that the cured film has excellent blue light cutting-out properties.

SUMMARY OF THE INVENTION

In recent years, in association with the development of a display (hereinafter, referred to as a "self-luminous display device") using self-luminous light from an organic light emitting diode (OLED) element, a micro light emitting diode (LED) element, a mini LED element, or the like has been promoted, there is a need for an antireflection unit different from the λ/4 phase difference plate or the λ/2 phase difference plate, which is capable of being applied to a self-luminous display device including this LED as a light emitting element.

As a result of carrying out repeated studies, the inventors of the present invention found that although the technique described in JP2015-36734A is a promising method in a display such as a liquid crystal display device, in which a polarizing plate of the liquid crystal display device or the like is essential, in a case of being applied to the above-described self-luminous display device, there is a problem that an absorption material is not covered by a polarizer since the polarizing plate is not provided, and thus the absorption material easily deteriorate by light, that is, improvement is required from the viewpoint of light resistance. In addition, it has been found that the method described in JP2008-203436A has a problem that the absorption material is easily deteriorated by light, and improvement is required from the viewpoint of light resistance.

Further, even in the optical film or the cured film described in JP2017-142412A or WO2014/208749A, the light resistance is insufficient, and improvement is required.

An object of the present invention is to provide a wavelength selective absorption filter that exhibits excellent light resistance, and a display device including this filter.

As a result of diligent studies in consideration of the above problems, the inventors of the present invention found that an absorption material (a dye) having an absorption maximum in a wavelength range of 390 to 440 nm or an absorption material (a dye) having an absorption maximum in a wavelength range of 680 to 780 nm in a wavelength selective absorption filter can sufficiently suppress a decrease in absorbance by containing a compound having a specific polar group and is effective in improving light resistance.

That is, the above object has been achieved by the following means.

<1> A wavelength selective absorption filter comprising:

a resin;

a coloring agent; and a compound that has at least one polar group of a carboxylic acid ester bond, a carboxylic acid amide bond, a sulfonic acid amide bond, a urethane bond, or a sulfonyl bond and has a molecular weight of 1,000 or less, in which the coloring agent includes at least one of the following dye A or the dye D, in a case of including the dye A, a wavelength of two wavelengths, on a long wavelength side, which provide an absorbance of 20% with respect to an absorbance maximal value at a wavelength of 390 to 440 nm is 455 nm or less, and in a case of including the dye D, a wavelength of two wavelengths, on a short wavelength side, which provide an absorbance of 20% with respect to an absorbance maximal value at a wavelength of 680 to 780 nm is 640 nm or more, the dye A: a coloring agent having a main absorption wavelength range at a wavelength of 390 to 440 nm the dye D: a coloring agent having a main absorption wavelength range at a wavelength of 680 to 780 nm.

<2> The wavelength selective absorption filter according to <1>, in which the coloring agent includes both the dye A and the dye D.

<3> The wavelength selective absorption filter according to <1> or <2>, in which the dye A is a coloring agent represented by General Formula (A1), General Formula (A1)

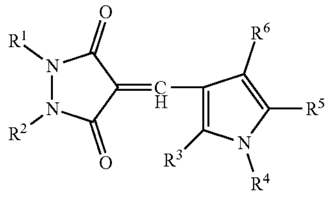

in the formula, $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

<4> The wavelength selective absorption filter according to any one of <1> to <3>, in which the dye D is a squaraine-based coloring agent represented by General Formula (1), General Formula (1)

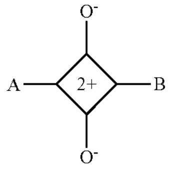

in the formula, A and B each independently represent an aryl group which may have a substituent, a heterocyclic group which may have a substituent, or —CH=G, and G represents a heterocyclic group which may have a substituent.

<5> The wavelength selective absorption filter according to any one of <1> to <4>, in which the compound having a polar group is a compound having a carboxylic acid ester bond.

<6> The wavelength selective absorption filter according to any one of <1> to <4>, in which the compound having a polar group is a compound having a carboxylic acid amide bond.

<7> The wavelength selective absorption filter according to any one of <1> to <6>, in which the resin includes a polystyrene resin.

<8> The wavelength selective absorption filter according to any one of <1> to <6>, in which the resin includes a cyclic polyolefin resin.

<9> A display device comprising the wavelength selective absorption filter according to any one of <1> to <8>.

<10> The display device according to <9>, in which the display device is a self-luminous display device.

In the present invention, in a case where there are a plurality of substituents, linking groups, and the like (hereinafter, referred to as substituents and the like) represented by specific reference numerals or formulae, or in a case where a plurality of substituents and the like are defined at the same time, the respective substituents and the like may be the same as or different from each other unless otherwise specified. The same applies to the definition of the number of substituents or the like. In addition, in a case where a plurality of substituents and the like are close to each other (particularly in a case where the substituents and the like are adjacent to each other), the substituents and the like may also be linked to each other to form a ring unless otherwise specified. In addition, unless otherwise specified, rings, for example, alicyclic rings, aromatic rings, and heterocyclic rings may be further fused to form a fused ring.

In the present invention, in a case where the number of carbon atoms of a certain group is defined, this number of carbon atoms means the number of carbon atoms of the entire group thereof unless otherwise specified in the present invention or the present specification. That is, in a case where this group is in a form of further having a substituent, the number of carbon atoms means the number of carbon atoms of the entire group including this substituent.

In the present invention, unless otherwise specified, the wavelength selective absorption filter may contain one kind of each of the components (a dye, a resin, an association inhibitor, another component, and the like) constituting the wavelength selective absorption filter or may contain two or more kinds thereof. Similarly, unless otherwise specified, one kind of each of components (a crystalline resin and the like) constituting the gas barrier layer may be contained in the gas barrier layer, or two or more kinds thereof may be contained therein.

In the present invention, in a case where an E type double bond and a Z type double bond are present in a molecule, the double bond may be any one thereof or may be a mixture thereof, unless otherwise specified.

In the present invention, the representation of a compound (including a complex) is used to mean not only the compound itself but also a salt thereof, and an ion thereof. In addition, it is meant to include those in which a part of the structure is changed as long as the effect of the present invention is not impaired. Furthermore, it is meant that a compound, which is not specified to be substituted or unsubstituted, may have any substituent as long as the effect of the present invention is not impaired. The same applies to the definition of a substituent or a linking group.

In addition, in the present invention, the numerical range indicated by using "to" means a range including the numerical values before and after "to" as the lower limit value and the upper limit value, respectively.

In the present invention, the "composition" includes a mixture in which the component concentration varies within a range in which a desired function is not impaired, in addition to a mixture in which the component concentration is constant (each component is uniformly dispersed).

In the present invention, the description of "having a main absorption wavelength range at a wavelength XX to YY nm" means that a wavelength at which the maximal absorption is exhibited (that is, the maximal absorption wavelength) is present in the wavelength range of XX to YY nm.

Therefore, in a case where the maximal absorption wavelength is present in the above-described wavelength range, the entire absorption band including this wavelength may be in the above-described wavelength range or may also extend up to the outside of the above-described wavelength range. In addition, in a case where there are a plurality of maximal absorption wavelengths, it suffices that a maximal absorption wavelength at which the highest absorbance is exhibited is present in the above-described wavelength range. That is, the maximal absorption wavelength other than the maximal absorption wavelength at which the highest absorbance is exhibited may be present either inside or outside the above-described wavelength range of XX to YY nm.

In the present invention, the main absorption wavelength range of a dye is a main absorption wavelength range of a dye, which is measured in a state of being a wavelength selective absorption filter. Specifically, in Examples described later, it is measured in a state of being a wavelength selective absorption filter under the conditions described in the sections of the absorbance maximal value of the wavelength selective absorption filter and 20% value wavelength.

In addition, in the present invention, the absorbance maximal value at a wavelength of XX to YY nm means an absorbance at the maximal absorption wavelength that is present at the wavelength of XX to YY nm described above, and it is also referred to as the absorption maximum value.

In addition, the two wavelengths that provide an absorbance of 20% with respect to an absorbance maximal value at a wavelength of XX to YY nm mean, in an absorption peak where the maximum absorbance is the maximum absorbance at a wavelength of XX to YY nm, wavelengths exhibiting an absorbance having an intensity of 20% of this absorbance maximal value, which are located on both sides (the short wavelength side and the long wavelength side) of the maximal absorption wavelength at which the absorbance maximal value is exhibited. It is noted that the wavelength located on the long wavelength side of the maximal absorption wavelength at which the absorbance maximal value is exhibited means a shortest-waved wavelength which is located on a long wavelength side with respect to the maximal absorption wavelength and at which an absorbance having an intensity of 20% of the above-described absorbance maximal value is exhibited. Similarly, the wavelength located on the short wavelength side of the maximal absorption wavelength at which the absorbance maximal value is exhibited means a longest-waved wavelength which is located on a short wavelength side with respect to the maximal absorption wavelength and at which an absorbance having an intensity of 20% of the above-described absorbance maximal value is exhibited.

In the present invention, an absorbance maximal value of a dye and two wavelengths that provide an absorbance of 20% with respect to this absorbance maximal value are each a value measured in a state of a wavelength selective absorption filter. Specifically, in Examples described later, it is measured in a state of being a wavelength selective absorption filter under the conditions described in the sections of the absorbance maximal value of the wavelength selective absorption filter and 20% value wavelength.

The wavelength selective absorption filter according to the aspect of the present invention exhibits excellent light resistance.

In addition, the display device according to the aspect of the present invention includes the wavelength selective absorption filter having excellent light resistance.

BRIEF DESCRIPTION OF THE DRAWINGS

FIG. 1 is a schematic cross-sectional view illustrating an example of a laminate including a wavelength selective absorption filter according to the present invention.

DESCRIPTION OF THE PREFERRED EMBODIMENTS

[Wavelength Selective Absorption Filter]

The wavelength selective absorption filter (hereinafter, also referred to as a wavelength selective absorption layer) according to the embodiment of the present invention contains a resin, a coloring agent, and a compound (an association inhibitor) that has at least one polar group (in the present invention, a "group" has a meaning including a "bond") of a carboxylic acid ester bond, a carboxylic acid amide bond, a sulfonic acid amide bond, a urethane bond, or a sulfonyl bond and has a molecular weight of 1,000 or less, where the coloring agent contains at least one of the following dye A or dye D, which has a main absorption wavelength range in a different wavelength range.

Dye A: A dye having a main absorption wavelength range at a wavelength of 390 to 440 nm Dye D: A dye having a main absorption wavelength range at a wavelength of 680 to 780 nm The wavelength selective absorption filter according to the embodiment of the present invention may further contain at least one of the following dye B or C.

Dye B: A dye having a main absorption wavelength range at a wavelength of 480 to 520 nm Dye C: A dye having a main absorption wavelength range at a wavelength of 580 to 620 nm In the wavelength selective absorption filter, the "dye" is dispersed (preferably dissolved) in the resin to allow the wavelength selective absorption filter to be a filter that shows a specific absorption spectrum derived from the dye.

The above-described dye A or dye D having a main absorption wavelength range in a specific wavelength range includes dyes, many of which easily allow the occurrence of the association between molecules, and thus the dye is conceived to be present in a state of being intermolecularly associated even in a form of a wavelength selective absorption filter dispersed (preferably dissolved) in a resin. In the present invention, by providing a wavelength selective absorption filter that includes a resin and a coloring agent including at least one of the dye A or the dye D, and additionally a compound (an association inhibitor) that has at least one polar group of a carboxylic acid ester bond, a carboxylic acid amide bond, a sulfonic acid amide bond, a urethane bond, or a sulfonyl bond and has a molecular weight of 1,000 or less, the compound having a specific polar group suppresses or prevents the association of the dyes, and the absorption waveform derived from the dye A or the dye D can be sharpened. The wavelength selective absorption filter according to the embodiment of the present invention is a wavelength selective absorption filter that contains a coloring agent including at least one of the dye A or the dye D and the association inhibitor and is adjusted so that a wavelength on the long wavelength side, at which an intensity of 20% of the absorbance of the dye A at the maximal absorption wavelength, is 455 nm or less in a case where the dye Ais included, and a wavelength on the short wavelength side, at which an intensity of 20% of the absorbance of the dye D at the maximal absorption wavelength, is 640 nm or more in a case where the dye D is included. It is conceived that the energy levels of the excited state and the ground state of the dye presumably change by suppressing the association of the dye A or the dye D in this way, and the excited state can be quickly returned to the ground state, and as a result, the light resistance of the dye is improved.

As described above, since the wavelength selective absorption filter according to the embodiment of the present invention is excellent in light resistance, it can exhibit excellent light resistance even in a case of being applied to a display device. In addition, as described in JP2015-36734A or JP2008-203436A, in a case of applying a wavelength selective absorption filter, in which a dye to be contained is adjusted, to a display device, it is possible to achieve both the suppression of external light reflection and the suppression of brightness decrease while exhibiting excellent light resistance, and it is possible to sufficiently suppress the influence of the display image on the tint.

<Coloring Agent (Dye)>

The wavelength selective absorption filter according to the embodiment of the present invention is a filter (a layer) containing at least one of the dye A or the dye D.

It is noted that in a case where the wavelength selective absorption filter according to the embodiment of the present invention contains the dye A, the dye A contained in the wavelength selective absorption filter according to the embodiment of the present invention may be one kind or may be two or more kinds. In addition, in a case where the wavelength selective absorption filter according to the embodiment of the present invention contains the dye D, the dye D contained in the wavelength selective absorption filter according to the embodiment of the present invention may be one kind or may be two or more kinds. Similar to the dye A and the dye D, the dye B and dye C described above which can be contained in the wavelength selective absorption filter according to the embodiment of the present invention may be also each independently one kind or may be two or more kinds.

The wavelength selective absorption filter according to the embodiment of the present invention can also contain a dye other than the dyes A to D.

In the form of the wavelength selective absorption filter according to the embodiment of the present invention, it suffices that the dye in the wavelength selective absorption filter can be sharpened by the association described later to show an absorption spectrum. It preferably suffices that both the suppression of external light reflection and the suppression of brightness decrease can be achieved, and it more preferably suffices that, additionally, the original tint of the display image is difficult to be affected. Examples of one form of the wavelength selective absorption filter according to the embodiment of the present invention include a form in which at least one of the dye A or the dye D is dispersed (preferably dissolved) in the resin. The dispersion may be any type of dispersion, such as a random type or a regular type.

In the wavelength selective absorption filter according to the embodiment of the present invention, the dyes A to D respectively have main absorption wavelength ranges in 390 to 440 nm, 480 to 520 nm, 580 to 620 nm, and 680 to 780 nm, which are wavelength ranges other than Blue (B, 440 nm to 470 nm), Green (G, 520 nm to 560 nm), and Red (R, 620 nm to 660 nm) which are used as light emitting sources of a display device or wavelength ranges that do not significantly overlap with these wavelength ranges. Therefore, by containing at least one of this dye A or D (further, at least one of the dye B or C in addition to at least one of the dye A or D), the wavelength selective absorption filter according to the embodiment of the present invention emits light can suppress the reflection of external light without impairing the color reproduction range of the light emitted from the light emitting element. Among the above, it is preferable to contain both the dyes A and D from the viewpoint of adjusting the tint of the reflected light.

In a case where the dyes A to D are contained in the wavelength selective absorption filter as described above, there may be a problem that the light resistance is decreased due to the mixing of the dyes due to the chain transfer of radicals generated at the time of dye decomposition. Even with respect to such a problem, the wavelength selective absorption filter according to the embodiment of the present invention can exhibit an excellent level of light resistance, which outweighs the decrease in light resistance in association with mixing of dyes, in a case where a specific gas barrier layer described later is provided.

Here, in a case where the wavelength selective absorption filter according to the embodiment of the present invention includes the dye A, a wavelength of two wavelengths, on the long wavelength side, which provide an absorbance of 20% with respect to an absorbance maximal value at a wavelength of 390 to 440 nm shall be referred to as "20% value wavelength A". In addition, in a case where the wavelength selective absorption filter according to the embodiment of the present invention includes the dye D, a wavelength of two wavelengths, on the short wavelength side, which provide an absorbance of 20% with respect to an absorbance maximal value at a wavelength of 680 to 780 nm shall be referred to as "20% value wavelength D".

In a case where the wavelength selective absorption filter according to the embodiment of the present invention contains the dye A, the 20% value wavelength A is 455 nm or less, and in a case where the wavelength selective absorption filter according to the embodiment of the present invention contains the dye D, the 20% value wavelength D is 640 nm or more.

From the viewpoint of achieving both the antireflection and the suppression of brightness decrease, in the wavelength selective absorption filter according to the embodiment of the present invention, the 20% value wavelength A preferably satisfies Relational Expression (I), and the 20% value wavelength D preferably satisfies Relational Expression (II).

Relational expression (I) 410 nm≤20% value wavelength A≤455 nm

In Relational Expression (I), the upper limit value of the 20% value wavelength A is preferably 453 nm or less and more preferably 450 nm or less. The lower limit value thereof is preferably 415 nm or more and more preferably 420 nm or more.

Relational expression (II) 640 nm≤20% value wavelength D≤700 nm

In Relational Expression (II), the upper limit value of the 20% value wavelength D is preferably 690 nm or less and more preferably 680 nm or less. The lower limit value thereof is preferably 645 nm or more and more preferably 650 nm or more.

(Dye A)

The dye A is not particularly limited as long as it has a main absorption wavelength range in a wavelength of 390 to 440 nm in the wavelength selective absorption filter, and various dyes can be used, where it is preferably a dye having a main absorption wavelength range in a wavelength of 395 to 430 nm and more preferably a dye having a main absorption wavelength range in a wavelength of 400 to 430 nm in the wavelength selective absorption filter.

The dye A is preferably a coloring agent represented by General Formula (A1) since an absorption waveform in the main absorption wavelength range is sharp.

General Formula (A1)

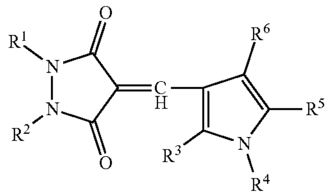

In General Formula (A1), $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

The alkyl group that can be employed as $R^1$ and $R^2$ may be any one of an unsubstituted alkyl group or a substituted alkyl group having a substituent, may be linear or branched, and may have a cyclic structure.

Examples of the unsubstituted alkyl group include a methyl group, an ethyl group, a normal propyl group, an isopropyl group, and a cyclohexyl group. The number of carbon atoms in the unsubstituted alkyl group is preferably 1 to 12 and more preferably 1 to 6.

Examples of the substituent that can be employed by the substituted alkyl group include a substituent included in the substituent group A below.

(Substituent Group A)

A halogen atom, an alkyl group, a cycloalkyl group, an aralkyl group, an alkenyl group, an alkynyl group, an aryl group, a heterocyclic group, a cyano group, a hydroxy group, a nitro group, a carboxy group (which may have a form of a salt), an alkoxy group, an aryloxy group, a silyloxy group, a heterocyclic oxy group, an acyloxy group, a carbamoyloxy group, a sulfonyloxy group, an alkoxycarbonyloxy group, an aryloxycarbonyloxy group, an amino group (which includes, in addition to $-NH_2$, a substituted amino group represented by $-NR^a_2$, where $R^a$'s each independently represent a hydrogen atom, an alkyl group, an aryl group, or a heteroaryl group, provided that at least one $R^a$ is an alkyl group, an aryl group, or a heteroaryl group), an acylamino group, an aminocarbonylamino group, an alkylcarbonylamino group, an alkoxycarbonylamino group, an aryloxycarbonylamino group, a sulfamoylamino group, an alkylsulfonylamino group, an arylsulfonylamino group, a sulfonamide group, a mercapto group, an alkylthio group, an arylthio group, a heterocyclic thio group, a sulfamoyl group, a sulfo group (which may have a form of a salt), an alkylsulfinyl group, an arylsulfinyl group, an alkylsulfonyl group, an arylsulfonyl group, an acyl group, an aryloxycarbonyl group, an alkoxycarbonyl group, a carbamoyl group, an imide group, a phosphino group, a phosphinyl group, a phosphinyloxy group, a phosphinylamino group, and a silyl group, as well as a monovalent group in which at least two of these are linked.

Among the substituent group A, preferred examples of the substituent that can be contained in the substituted alkyl group include a halogen atom, an aryl group, an alkoxy group, an acyl group, and a hydroxy group.

The total number of carbon atoms in the substituted alkyl group is preferably 1 to 12. Examples thereof include a benzyl group, a hydroxybenzyl group, and a methoxyethyl group.

The total number of carbon atoms in the substituted alkyl group means the number of carbon atoms in the entire substituted alkyl group including the substituent that can be contained in the substituted alkyl group. Hereinafter, this will be used in the same meaning in regard to other groups as well.

In a case where both $R^1$ and $R^2$ represent an alkyl group, the alkyl groups may be the same or different from each other.

The aryl group that can be employed as $R^1$ and $R^2$ may be any one of an unsubstituted aryl group or a substituted aryl group having a substituent.

The unsubstituted aryl group is preferably an aryl group having 6 to 12 carbon atoms, and examples thereof include a phenyl group.

Examples of the substituent that can be employed by the substituted aryl group include a substituent included in the substituent group A below.

Among the substituent group A, preferred examples of the substituent that can be contained in the substituted aryl group include a halogen atom (for example, a chlorine atom, a bromine atom, or an iodine atom), a hydroxy group, a carboxy group, a sulfonamide group, or an amino group, (preferably, a substituted amino group represented by $-NR^a_2$, where $R^a$'s each independently represents a hydrogen atom or an alkyl group, provided that at least one $R^a$ is an alkyl group, and the amino group preferably has 1 to 4 carbon atoms), an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The substituted aryl group is preferably an aryl group having a total number of carbon atoms of 6 to 18.

Examples thereof include a 4-chlorophenyl group, a 2,5-dichlorophenyl group, a hydroxyphenyl group, a 4-carboxyphenyl group, a 3,5-dicarboxyphenyl group, a 4-methanesulfonamidophenyl group, a 4-methylphenyl group, a 4-methoxyphenyl group, a 4-(2-hydroxyethoxy)phenyl group, an N,N-dimethylaminophenyl group, a 4-(N-carboxymethyl-N-ethylamino)phenyl group, a 4-ethoxycarbonylphenyl group, and a 4-methanesulfonyloxyphenyl group.

In a case where both $R^1$ and $R^2$ represent an aryl group, the aryl groups may be the same or different from each other.

Examples of the substituent that can be employed as $R^3$, $R^4$, $R^5$, and $R^6$ include substituents included in the substituent group A.

Among the substituent group A, $R^3$, $R^5$, and $R^6$ are preferably an alkyl group or an aryl group. That is, $R^3$, $R^5$, and $R^6$ are each independently preferably a hydrogen atom, an alkyl group, or an aryl group.

In addition, in the substituent group A, $R^4$ is preferably an alkyl group or an aryl group. That is, $R^4$ is preferably a hydrogen atom, an alkyl group, or an aryl group.

The alkyl group that can be employed as $R^3$, $R^5$, and $R^6$ may be any of an unsubstituted alkyl group or a substituted alkyl group having a substituent, and any of linear or branched, and may have a cyclic structure.

Examples of the unsubstituted alkyl group that can be employed as $R^3$, $R^5$, and $R^6$ include a methyl group, an ethyl group, a normal propyl group, and an isopropyl group. The number of carbon atoms of the unsubstituted alkyl group that can be employed as $R^3$, $R^5$, and $R^6$ is preferably 1 to 8 and more preferably 1 to 4.

Examples of the substituent that can be contained in the substituted alkyl group as $R^3$, $R^5$, and $R^6$ include substituents included in the substituent group A.

Preferred examples of the substituent that can be contained in the substituted alkyl group as $R^3$, $R^5$, and $R^6$ include an aryl group (preferably a phenyl group), a halogen atom, an acyl group, an amino group, an alkoxycarbonyl group, a carboxy group, and a hydroxy group.

The total number of carbon atoms in the substituted alkyl group that can be employed as $R^3$, $R^5$, and $R^6$ is preferably 1 to 8. For example, a benzyl group, a carboxymethyl group, and a hydroxymethyl group are exemplified.

In a case where all of $R^3$, $R^5$, and $R^6$ represent alkyl groups, the alkyl groups may be the same or different from each other.

The aryl group that can be employed as $R^3$, $R^5$, and $R^6$ may be any one of an unsubstituted aryl group or a substituted aryl group which has been substituted.

The unsubstituted aryl group that can be employed as $R^3$, $R^5$, and $R^6$ is preferably an aryl group having 6 to 10 carbon atoms, and examples thereof include a phenyl group.

Examples of the substituent that can be contained in the substituted aryl group as $R^3$, $R^5$, and $R^6$ include substituents included in the substituent group A.

Preferred examples of the substituent that can be contained in the substituted aryl group as $R^3$, $R^5$, and $R^6$ include a halogen atom (for example, a fluorine atom, a chlorine atom, a bromine atom, or an iodine atom), a hydroxy group, a carboxy group, an alkyl group (preferably an alkyl groups having 1 to 4 carbon atoms; for example, methyl, ethyl, normal propyl, or isopropyl).

The substituted aryl group that can be employed as $R^3$, $R^5$, and $R^6$ is preferably an aryl group having a total number of carbon atoms of 6 to 10. Examples thereof include a 2-fluorophenyl group, a 4-chlorophenyl group, a 2,5-dichlorophenyl group, a hydroxyphenyl group, a carboxyphenyl group, a 3,5-dicarboxyphenyl group, and a 4-methylphenyl group.

In a case where both $R^5$ and $R^6$ are a substituent, $R^3$ is preferably a hydrogen atom from the viewpoint of light resistance and heat resistance.

In a case where $R^3$, $R^5$, and $R^6$ are all aryl groups, the aryl groups may be the same or different from each other.

The alkyl group that can be employed as $R^4$ may be any one of an unsubstituted alkyl group or a substituted alkyl group having a substituent, may be linear or branched, and may have a cyclic structure.

Examples of the unsubstituted alkyl group that can be employed as $R^4$ include a methyl group, an ethyl group, a normal propyl group, an isopropyl group, and a cyclohexyl group. The number of carbon atoms of the unsubstituted alkyl group that can be employed as $R^4$ is preferably 1 to 8 and more preferably 1 to 4.

Examples of the substituent that can be contained in the substituted alkyl group as $R^4$ include substituents included in the substituent group A.

Preferred examples of the substituent that can be contained in the substituted alkyl group as $R^4$ include an aryl group (preferably, a phenyl group), a heterocyclic group, a carboxy group, a hydroxy group, an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an aryloxy group, an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), an alkylamino group (preferably an alkylamino group having 1 to 4 carbon atoms; for example, a dimethylamino group), an alkylcarbonylamino group (preferably, an alkylcarbonylamino group having 1 to 4 carbon atoms; for example, a methylcarbonylamino group), a cyano group, and an acyl group (for example, an acetyl group, a propionyl group, a benzoyl group, or a mesyl group), as well as a monovalent group in which at least the two thereof are linked to each other.

The total number of carbon atoms in the substituted alkyl group that can be employed as $R^4$ is preferably 1 to 18.

For example, a benzyl group, a carboxybenzyl group, a hydroxybenzyl group, a methoxycarbonylethyl group, an ethoxycarbonylmethyl group, a 2-cyanoethyl group, a 2-propionylaminoethyl group, a dimethylaminomethyl group, a methylcarbonylaminopropyl group, a di(methoxycarbonylmethyl)aminopropyl group, and a phenacyl group are exemplified.

The aryl group that can be employed as $R^4$ may be any one of an unsubstituted aryl group or a substituted aryl group having a substituent.

The unsubstituted aryl group that can be employed as $R^4$ is preferably an aryl group having 6 to 12 carbon atoms, and examples thereof include a phenyl group.

Examples of the substituent that can be contained in the substituted aryl group as $R^4$ include substituents included in the substituent group A.

Preferred examples of the substituent that can be contained in the substituted aryl group as $R^4$ include a halogen atom (for example, a chlorine atom, a bromine atom, or an iodine atom), a hydroxy group, a carboxy group, a sulfonamide group, an amino group, an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The amino group that can be contained in the substituted aryl group as $R^4$ may be any one of an unsubstituted amino group ($—NH_2$) or a substituted amino group having a substituent ($—NR^a{}_2$ in the substituent group A).

In the amino group ($—NR^a{}_2$) that can be contained in the substituted aryl group as $R^4$, examples of $R^a$ include the same group as the substituted alkyl group as $R^4$.

The substituted amino group is preferably an alkylamino group in which one or two hydrogen atoms in the amino group are substituted with an alkyl group.

Examples of the alkylamino group include a methylamino group, a dimethylamino group, a diethylamino group, and a pyrrolidino group. The number of carbon atoms in the alkylamino group is preferably 1 to 8 and more preferably 1 to 4.

Further, the alkyl group in the alkylamino group may be further substituted, and for example, a di(alkoxycarbonylalkyl)amino group is preferably mentioned. The di(alkoxycarbonylalkyl)amino group preferably has 6 to 10 carbon atoms and more preferably has 6 to 8 carbon atoms.

The substituted aryl group that can be employed as $R^4$ is preferably an aryl group having a total number of carbon atoms of 6 to 22. Examples thereof include a 4-chlorophenyl group, a 2,5-dichlorophenyl group, a hydroxyphenyl group, a 2,5-methoxyphenyl group, a 2-methoxy-5-ethoxycarbonylphenyl group, a 4-ethyloxycarbonylphenyl group, a 4-butoxycarbonylphenyl group, a 4-octyloxycarbonylphenyl group, a 4-carboxyphenyl group, a 3,5-dicarboxyphenyl group, a 4-methanesulfonamidophenyl group, a 4-methylphenyl group, a 4-methoxyphenyl group, a 4-ethoxyphenyl group, a 4-(2-hydroxyethoxy)phenyl group, an N,N-dimethylaminophenyl group, an N,N-diethylaminophenyl group, a 4-(N-carboxymethyl-N-ethylamino)phenyl group, a 4-{N,N-di(ethoxycarbonylmethyl)amino}phenyl group, a 4-{di(ethoxycarbonylmethyl)amino}carbonylphenyl group, a 4-ethoxycarbonylphenyl group, a 4-methanesulfonyloxyphenyl group, a 4-acetylsulfamoylphenyl group, a 4-propionylsulfamoylphenyl group, and a 4-methanesulfonamidophenyl group.

$R^5$ and $R^6$ may be bonded to each other to form a 6-membered ring. Hydrogen atoms may be eliminated during the formation of the ring to form an aromatic ring or an aliphatic ring having an unsaturated bond.

The 6-membered ring formed by $R^5$ and $R^6$ being bonded to each other is preferably a benzene ring.

In particular, from the viewpoint of light resistance, among $R^1$ and $R^2$ in General Formula (A1), it is preferable that $R^1$ is an alkyl group, and it is more preferable that $R^1$ is an alkyl group and $R^2$ is an alkyl group or an aryl group. In addition, from the same viewpoint, it is still more preferable that both $R^1$ and $R^2$ are each independently an alkyl group, and it is particularly preferable that both $R^1$ and $R^2$ are an alkyl group having 1 to 8 carbon atoms.

Further, from the viewpoint of heat resistance and light resistance, it is also preferable that both $R^1$ and $R^2$ in General Formula (A1) are an aryl group.

In a case where $R^1$ and $R^2$ each independently represent an aryl group, it is preferable that $R^3$, $R^5$, and $R^6$ are each independently a hydrogen atom, an alkyl group, or an aryl group and that at least one of $R^3$ or $R^6$ is a hydrogen atom. Among the above, from the viewpoint of heat resistance and light resistance, a case where $R^3$ represents a hydrogen atom, and $R^5$ and $R^6$ each independently represent an alkyl group or an aryl group is more preferable. A case where $R^3$ represents a hydrogen atom and $R^5$ and $R^6$ each independently represent an alkyl group is still more preferable. A case where $R^3$ represents a hydrogen atom, $R^5$ and $R^6$ each independently represent an alkyl group, and $R^5$ and $R^6$ are bonded to each other to form a ring and fused with a pyrrole ring to form an indole ring together with the pyrrole ring is particularly preferable. That is, the coloring agent represented by General Formula (A1) is particularly preferably a coloring agent represented by General Formula (A2).

General Formula (A2)

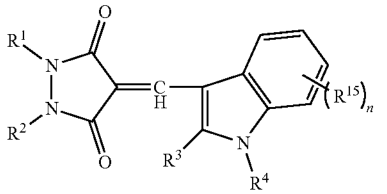

In General Formula (A2), $R^1$ to $R^4$ respectively have the same meanings as $R^1$ to $R^4$ in General Formula (A1), and the same applies to the preferred aspects thereof.

In General Formula (A2), $R^{15}$ represents a substituent. Examples of the substituent that can be adopted as $R^{15}$ include substituents included in the substituent group A. $R^{15}$ is preferably an alkyl group, an aryl group, a halogen atom, an acyl group, an amino group, or an alkoxycarbonyl group.

As the alkyl group and the aryl group, which can be adopted as $R^{15}$, the descriptions for the alkyl group and the aryl group, which can be adopted as $R^3$, $R^5$, and $R^6$, can be applied respectively.

Examples of the halogen atom that can be adopted as $R^{15}$ include a chlorine atom, a bromine atom, and an iodine atom.

Examples of the acyl group that can be adopted as $R^{15}$ include an acetyl group, a propionyl group, and a butyroyl group.

For the amino group that can be adopted as $R^1$, the description regarding the amino group that can be contained in the substituted aryl group as $R^4$ can be applied. Further, a nitrogen-containing heterocyclic group having a 5-membered to 7-membered ring in which an alkyl group on the nitrogen atom of the amino group is bonded to form a ring is also preferable.

The alkoxycarbonyl group that can be adopted as $R^{15}$, is preferably an alkoxycarbonyl group having 2 to 5 carbon atoms, and examples thereof include methoxycarbonyl, ethoxycarbonyl, normal propoxycarbonyl, and isopropoxycarbonyl.

n represents an integer of 0 to 4. n is not particularly limited, and is, for example, preferably 0 or 1.

Specific examples of the coloring agent represented by General Formula (A1) are shown below. However, the present invention is not limited thereto.

In the specific examples below, Me represents a methyl group.
E-1
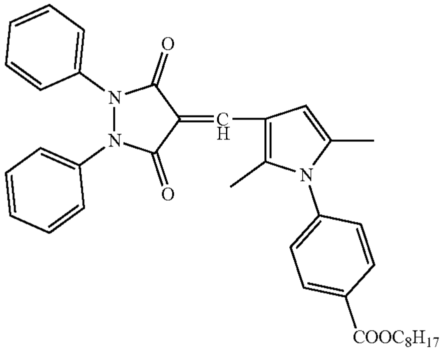
E-2
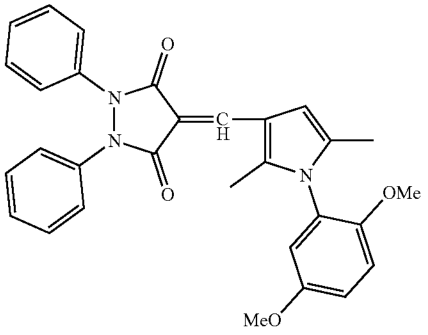
E-3
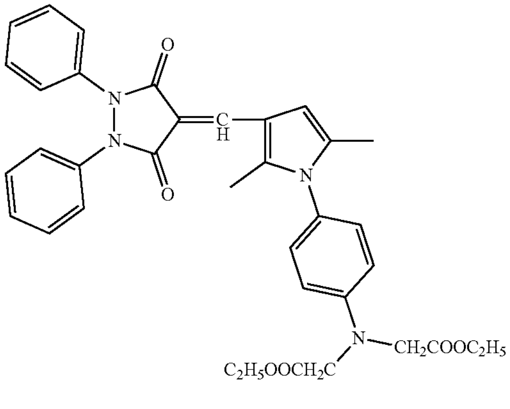
E-4
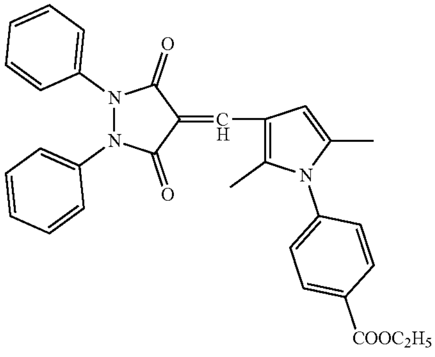
-continued
E-5
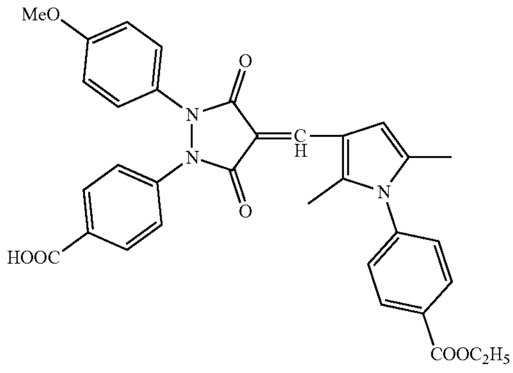
E-6
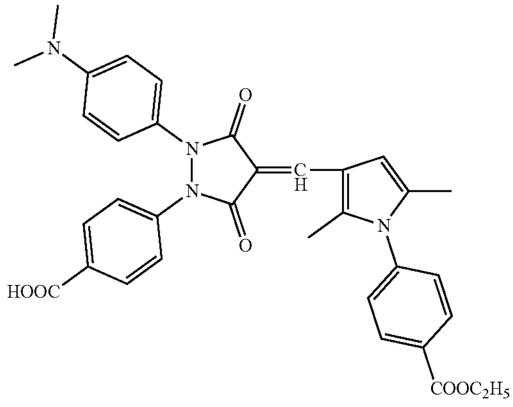
E-7
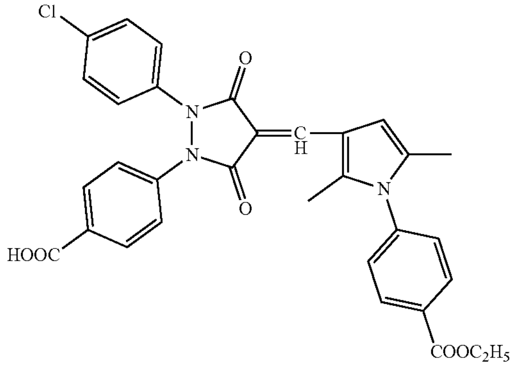
E-8
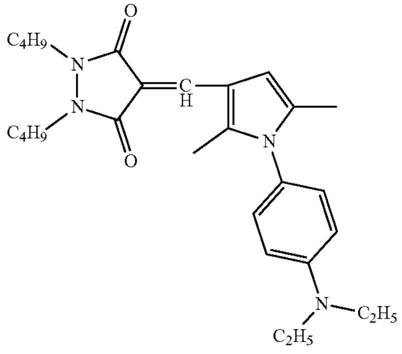

-continued
E-9
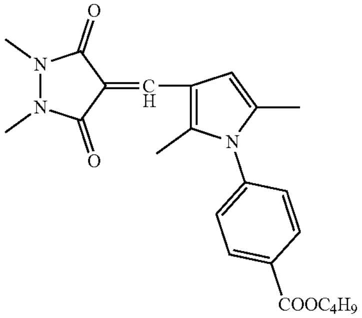
E-10
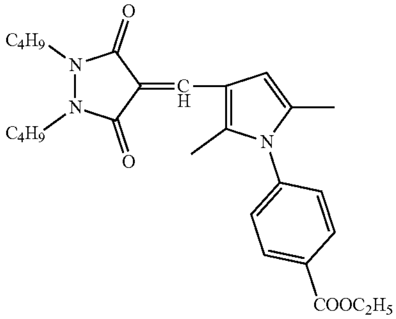
E-11
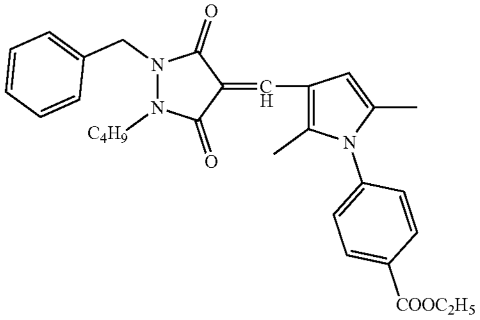
E-12
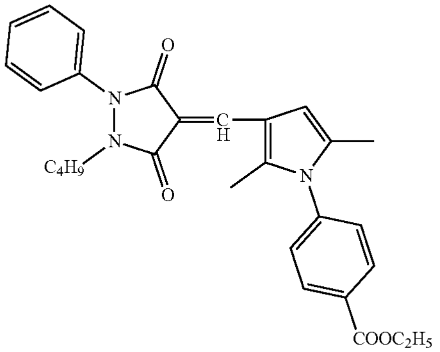
E-13
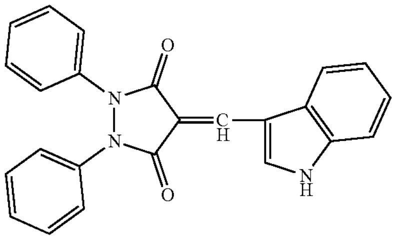
-continued
E-14
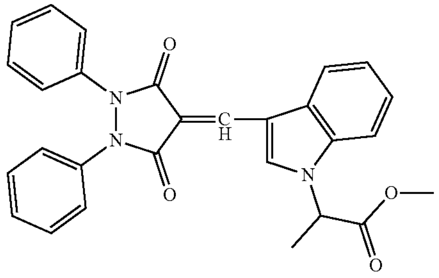
E-15
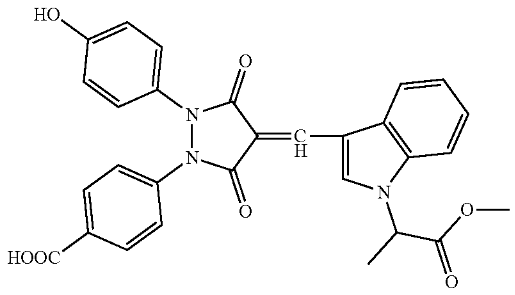
E-16
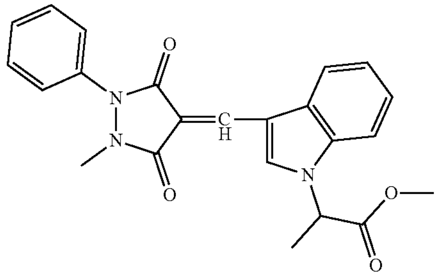
E-17
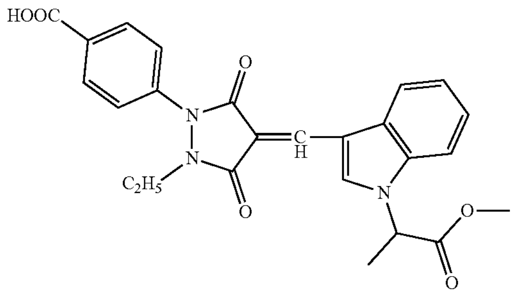
E-18
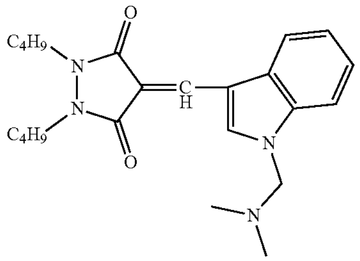

-continued
E-19
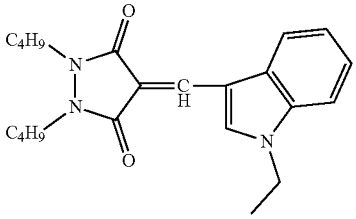
E-20
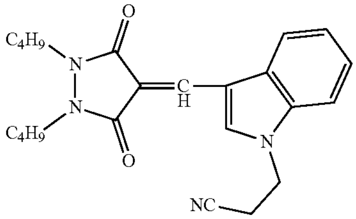
E-21
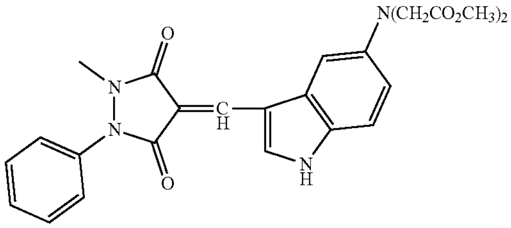
E-22
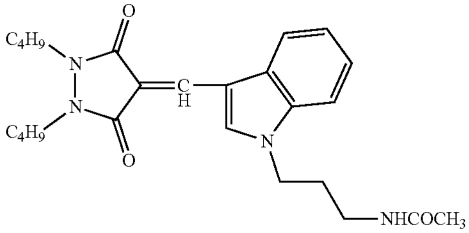
E-23
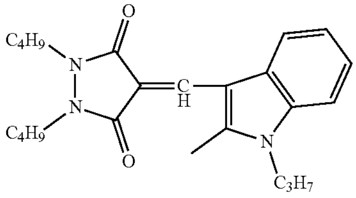
E-24
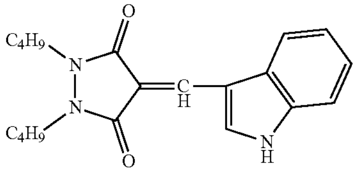
E-25
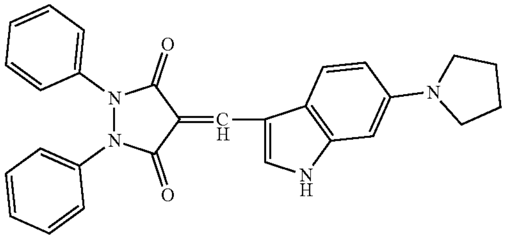
-continued
E-26
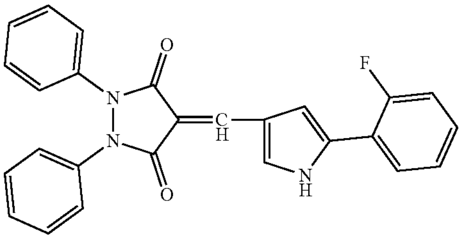
E-27
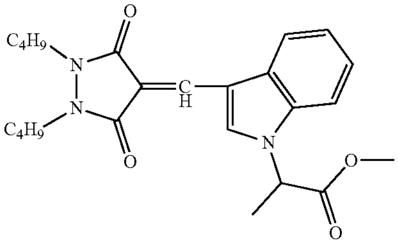
E-28
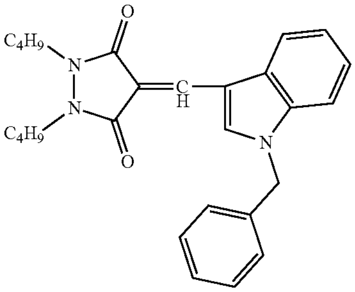
E-29
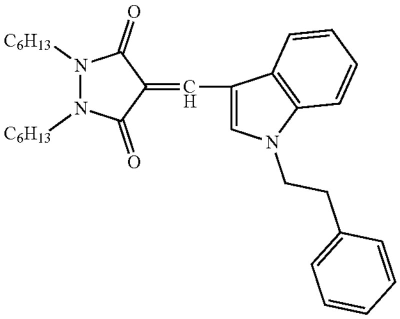
E-30
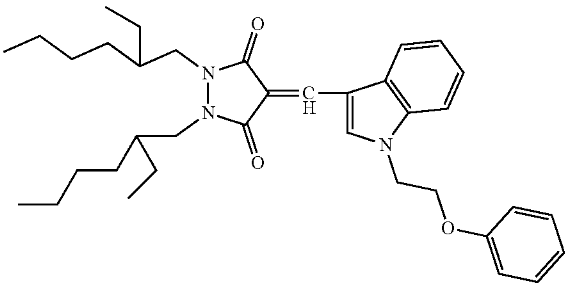

-continued
E-31
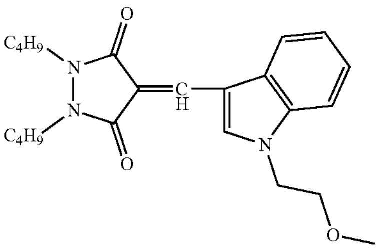
E-32
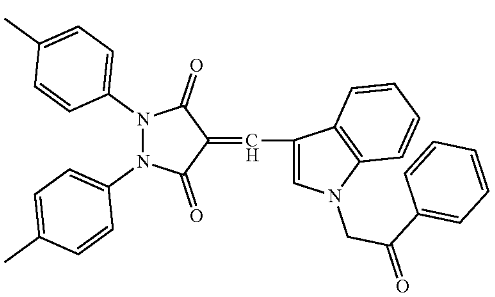
E-33
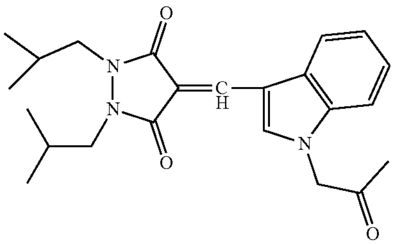
E-34
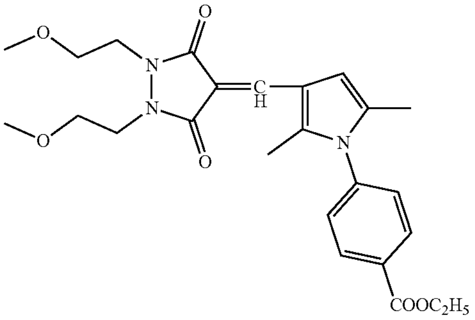
E-35
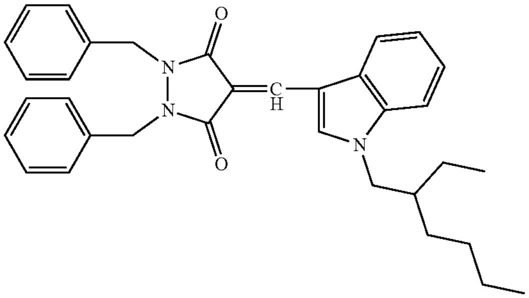
-continued
E-36
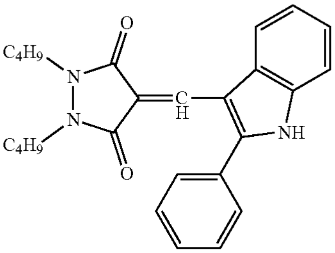
E-37
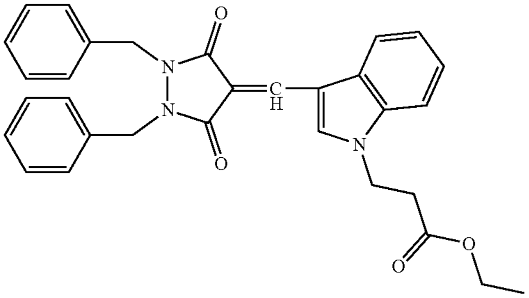
E-38
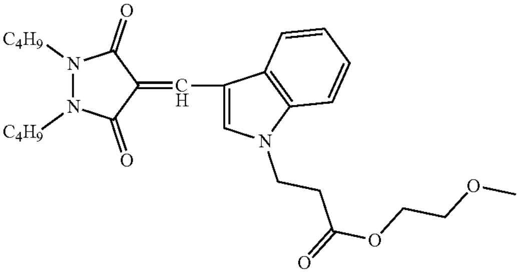
E-39
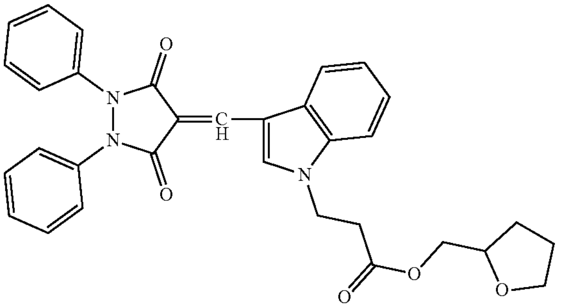
E-40
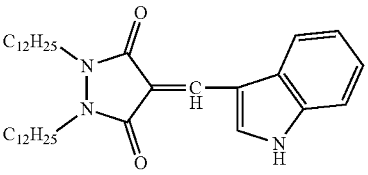
E-41
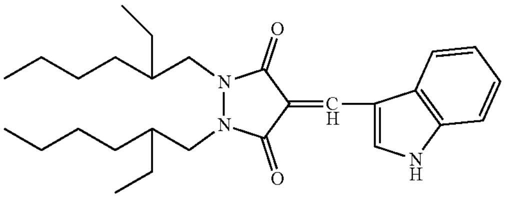

As the dye A, in addition to the coloring agent represented by General Formula (A1), the compounds described in paragraphs [0012] to [0067] of JP1993-53241A (JP-H5-53241A) and the compounds described in paragraphs [0011] to [0076] of JP2707371B can also be preferably used.

(Dye B and Dye C)

The dye B is not particularly limited as long as the dye has the main absorption wavelength range in a wavelength of 480 to 520 nm in the wavelength selective absorption filter, and various dyes can be used.

In addition, the dye C is not particularly limited as long as it has a main absorption wavelength range in a wavelength of 580 to 620 nm in the wavelength selective absorption filter, and various dyes can be used.

Specific examples of the dye B include individual coloring agents (dyes) which are based on, for example, pyrrole methine (PM), rhodamine (RH), boron dipyrromethene (BODIPY), and squaraine (SQ).

Specific examples of the dye C include individual coloring agents (dyes) which are based on, for example, tetraazaporphyrin (TAP), squaraine, and cyanine (CY).

Among these, the dye B and the dye C are preferably a squaraine-based coloring agent, and more preferably a squaraine-based coloring agent represented by General Formula (1) described in [0016] to [0070] of WO2019/189463A since the absorption waveform in the main absorption wavelength range is sharp. In a case where a coloring agent that has a sharp absorption waveform as described above is used as the dye B and the dye C, It is possible to achieve both the reflectance and the suppression of the brightness decrease.

That is, in the wavelength selective absorption filter according to the embodiment of the present invention, from the viewpoint of suppressing a change in tint, it is preferable that at least one of the dye B or the dye C is a squaraine-based coloring agent (preferably, a squaraine-based coloring agent represented by General Formula (1) described in [0016] to [0070] of WO2019/189463A), and it is more preferable that both the dye B and the dye C are a squaraine-based coloring agent (preferably, a squaraine-based coloring agent represented by General Formula (1) described in [0016] to [0070] of WO2019/189463A).

It is note that the description regarding the dye A in WO2019/189463A shall be read as a description regarding the dye B in the present invention, and the description regarding the dye B in WO2019/189463A shall be read as a description regarding the dye C in the present invention.

Specific examples of the coloring agent represented by any of General Formulae (1) to (5) described in WO2019/189463A include, in addition to those described in [0048] of WO2019/189463A, the following specific examples. However, the present invention is not limited thereto.

In the following specific examples, Me represents methyl, Et represents ethyl, Bu represents butyl, and Ph represents phenyl, respectively.

A-21

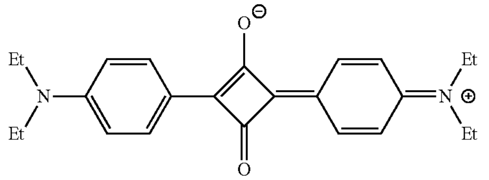

-continued

A-22

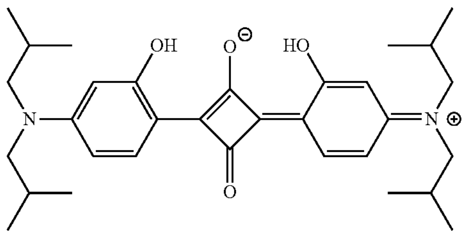

A-23

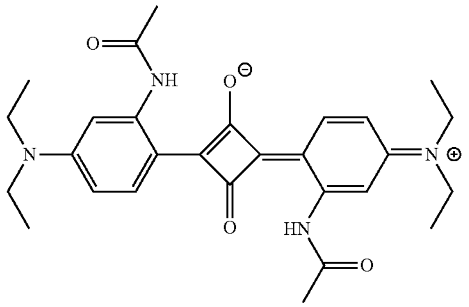

A-24

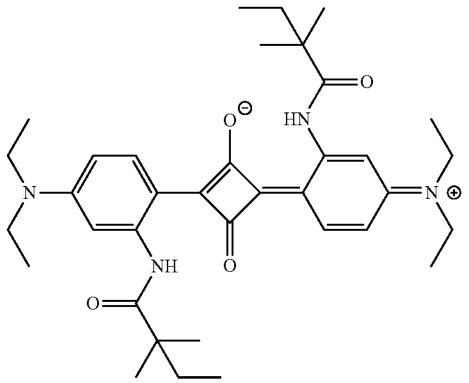

A-25

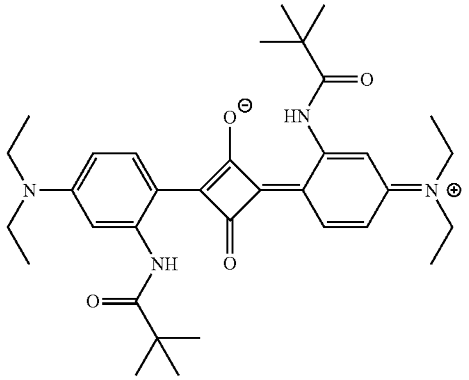

-continued
A-26
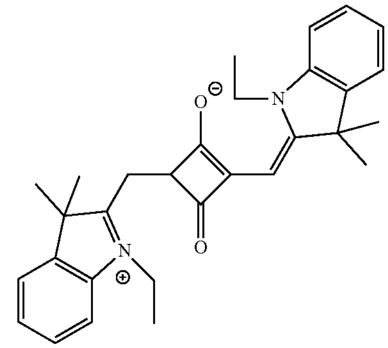
A-27
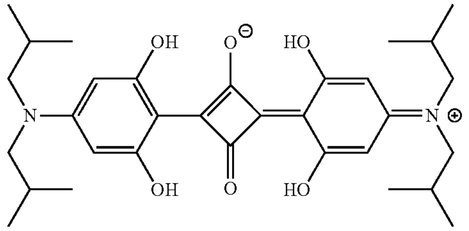
A-28
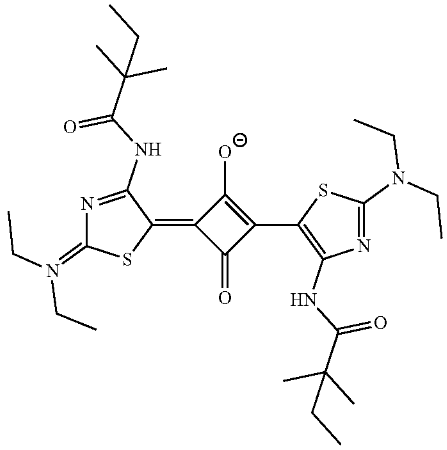
A-29
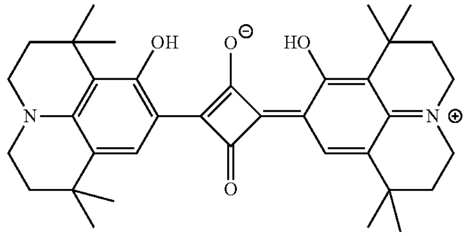
A-30
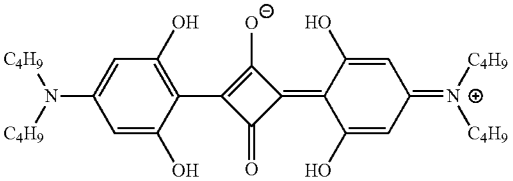
-continued
A-31
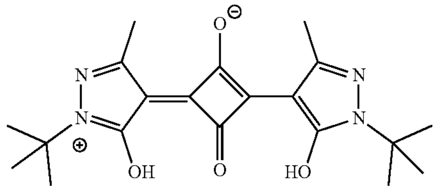
A-32
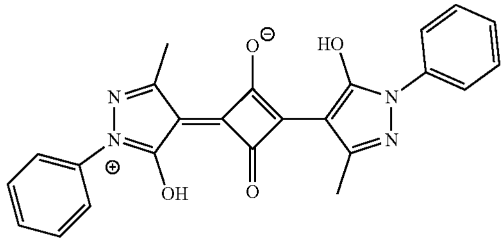
A-33
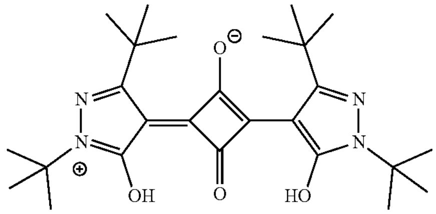
A-34
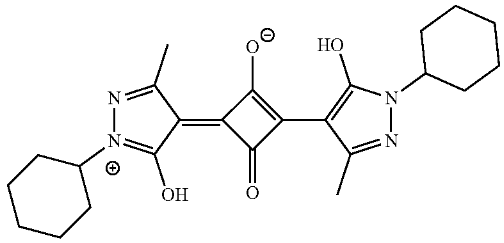
A-35
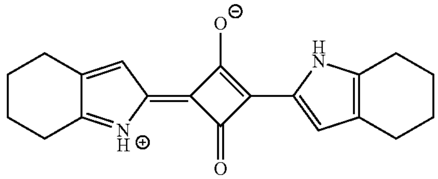
A-36
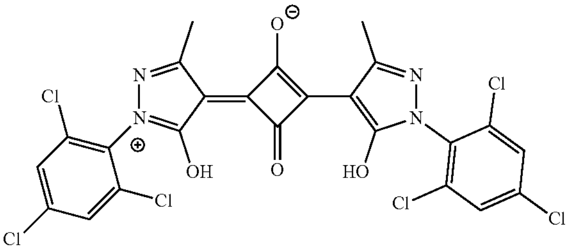

-continued
A-37
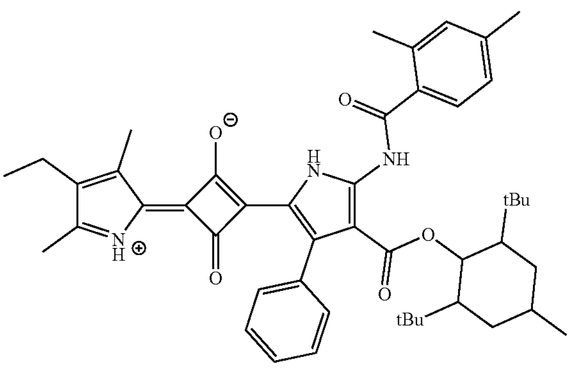
A-38
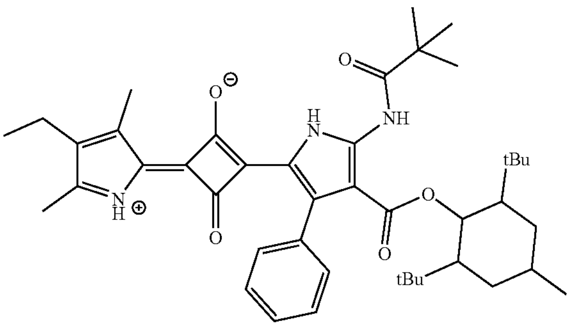
A-39
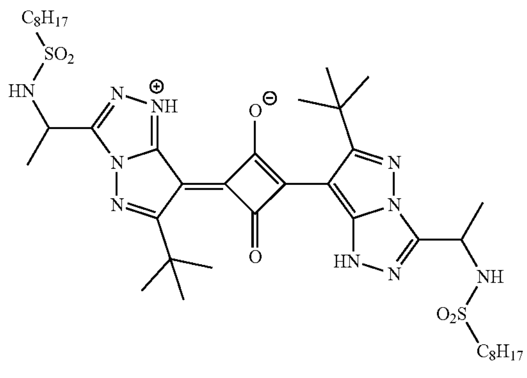
-continued
A-40
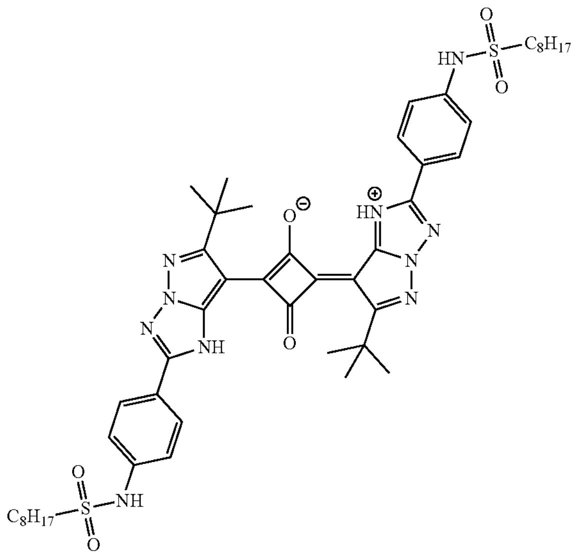
A-41
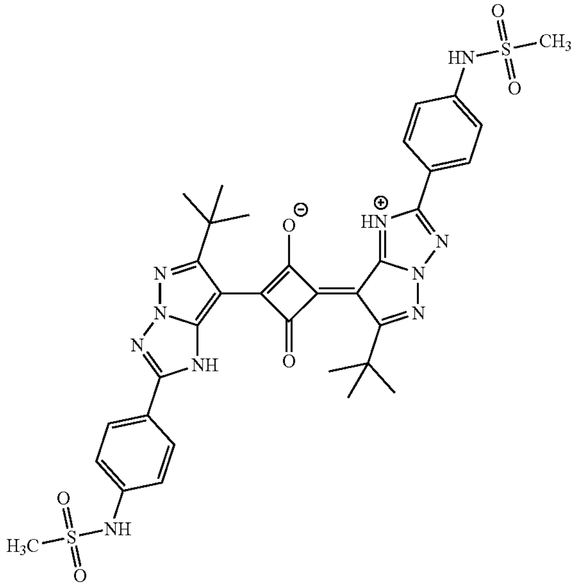
A-42
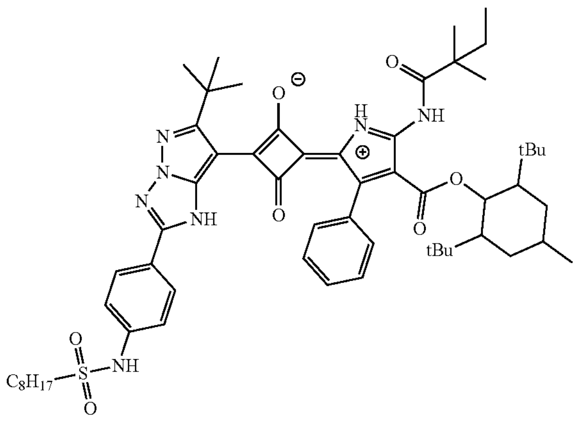

-continued

A-43

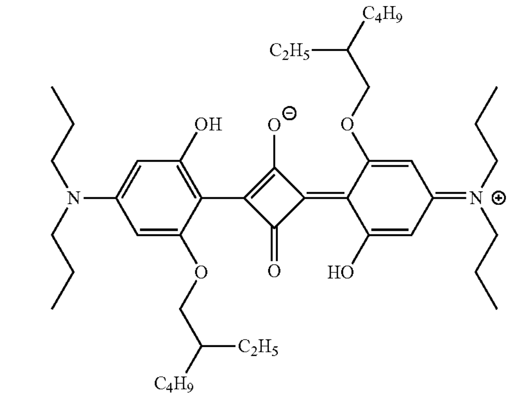

A-44

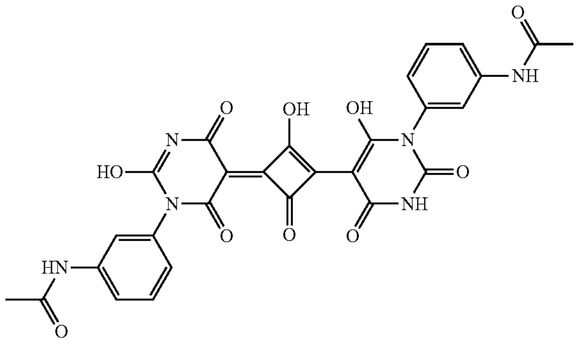

A-45

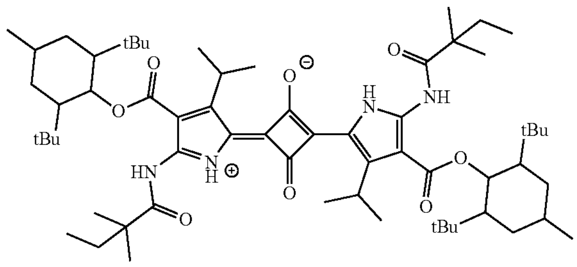

A-46

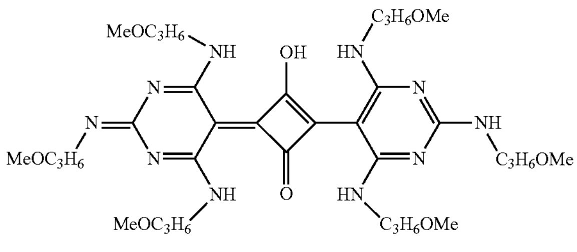

A-47

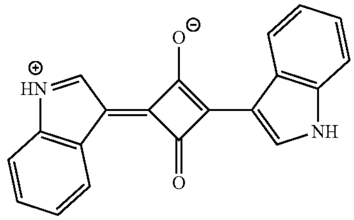

-continued

A-48

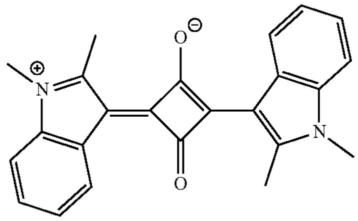

A-49

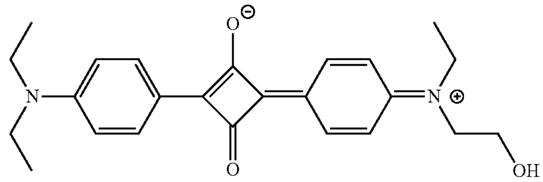

A-50

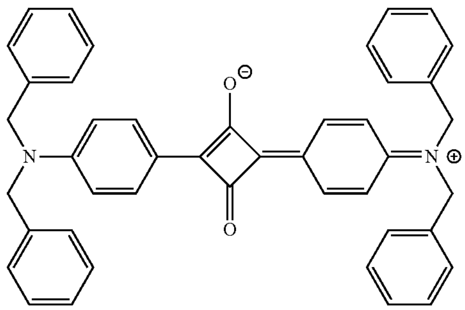

A-51

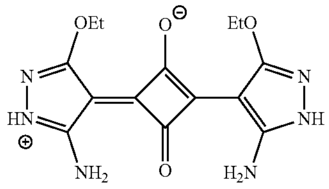

A-52

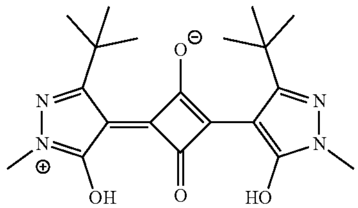

In addition to the above-described specific examples, specific examples of the coloring agent represented by any of General Formulae (3) to (5) described in WO2019/189463A include, in addition to those described in [0050] to [0055] of WO2019/189463A, the following specific examples. The substituent B in the following table indicates the following structure or the substituent B described in [0050] or [0051] of WO2019/189463A. In the following structures and the following tables, Me represents methyl, Et represents ethyl, i-Pr represents iso-propyl, Bu represents n-butyl, t-Bu represents t-butyl, and Ph represents phenyl, respectively. In the following structures, * indicates a bonding site to a 4-membered carbon ring in each General Formula.

-continued
B-52
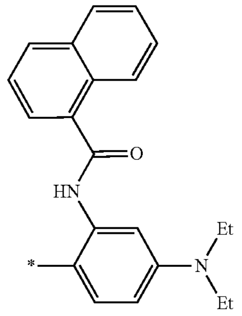
B-53
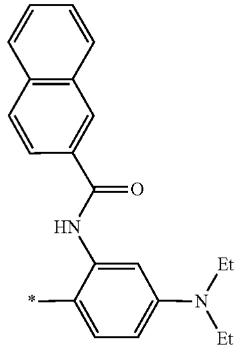
B-54
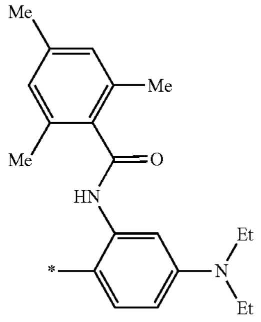
B-55
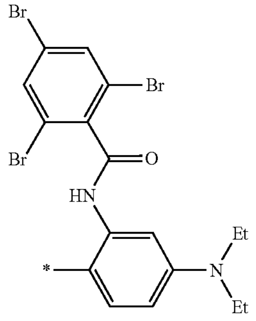
B-56
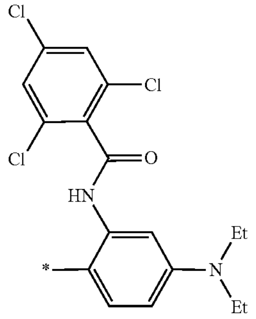
B-57
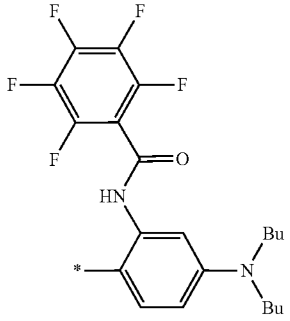
B-58
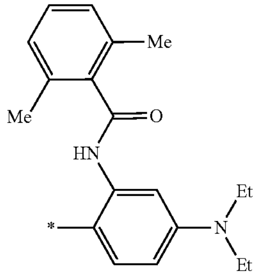
B-59
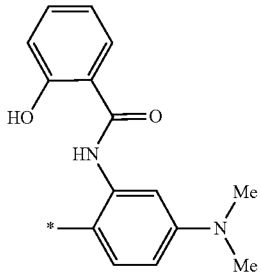
B-60
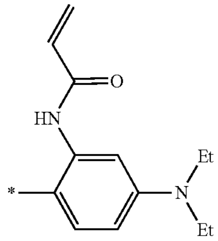
B-61
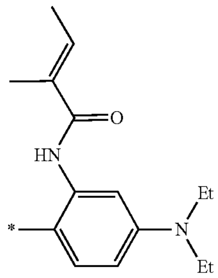

-continued
B-62
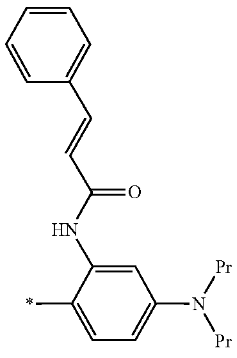
B-63
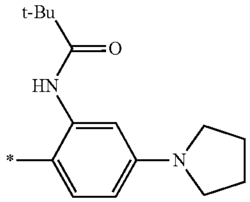
B-64
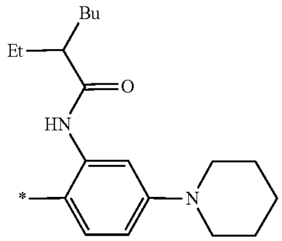
B-65
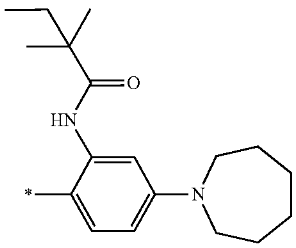
B-66
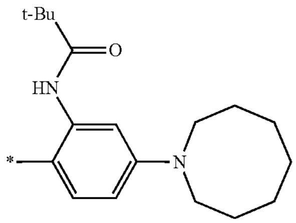
B-67
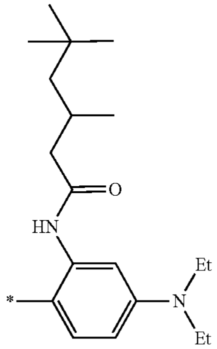
-continued
B-68
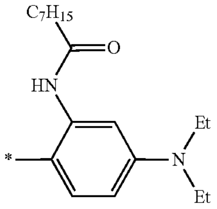
B-69
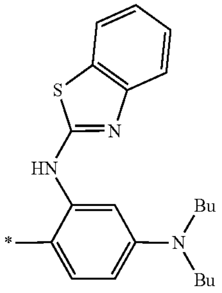
B-70
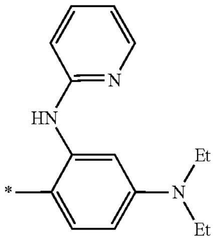
B-71
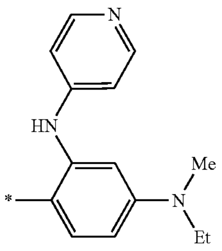
| Compound number | $R^3$ | $R^4$ | B |
|---|---|---|---|
| 3-70 | Me | t-Bu | B-52 |
| 3-71 | Me | t-Bu | B-54 |
| 3-72 | Me | t-Bu | B-55 |
| 3-73 | Me | t-Bu | B-58 |
| 3-74 | Me | t-Bu | B-60 |
| 3-75 | Me | t-Bu | B-65 |
| 3-76 | Me | t-Bu | B-67 |
| 3-77 | Me | t-Bu | B-68 |
| 3-78 | H | t-Bu | B-51 |
| 3-79 | Et | t-Bu | B-53 |
| 3-80 | Pr | 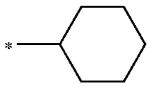 | B-64 |
| 3-81 | iPr | iPr | B-66 |

-continued
| Compound number | $R^3$ | $R^4$ | B |
|---|---|---|---|
| 3-82 | Me | 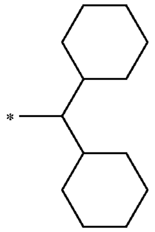 | B-51 |
| 3-83 | Et | Bu | B-56 |
| 3-84 | Me | iPr | B-66 |
| 3-85 | Me | 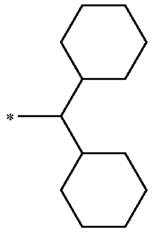 | B-54 |
| 3-86 | Me | 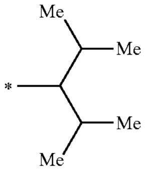 | B-57 |
| 3-87 | Et | 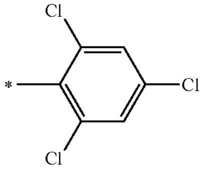 | B-60 |
| 3-88 | Me | iPr | B-65 |
| 3-89 | Me | t-Bu | B-69 |
| 3-90 | Me | 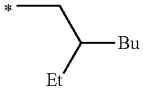 | B-50 |
| 3-91 | Me | 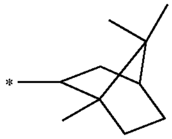 | B-61 |
| 3-92 | Me | 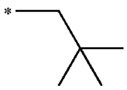 | B-51 |
| 3-93 | Me | 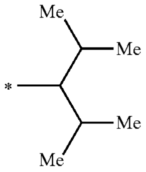 | B-51 |
-continued
| Compound number | $R^3$ | $R^4$ | B |
|---|---|---|---|
| 3-94 | Me | 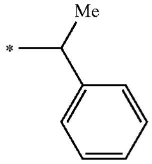 | B-67 |
| 3-95 | Me | 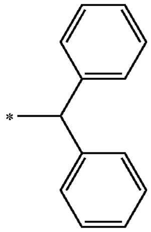 | B-51 |
| 3-96 | Me | 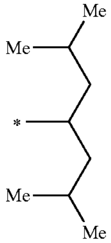 | B-51 |
| Compound number | $R^5$ | $R^6$ | B |
|---|---|---|---|
| 4-31 | t-Bu | 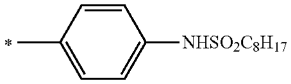 | B-51 |
| 4-32 | t-Bu | 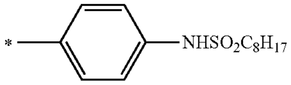 | B-52 |
| 4-33 | t-Bu | 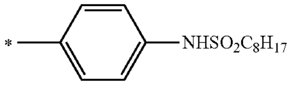 | B-54 |
| 4-34 | Me | 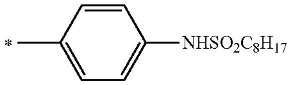 | B-55 |
| 4-35 | t-Bu | 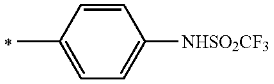 | B-60 |
| 4-36 | Me | Me | B-65 |
| 4-37 | Me | Et | B-67 |
| 4-38 | Ph | Ph | B-48 |
| 4-39 | Et | t-Bu | B-54 |
| 4-40 | Me | Me | B-51 |
| Compound number | $R^7$ | $R^8$ | B |
|---|---|---|---|
| 5-22 | Me | 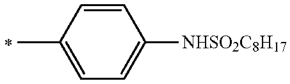 | B-51 |

-continued

| Compound number | $R^7$ | $R^8$ | B |
|---|---|---|---|
| 5-23 | t-Bu | 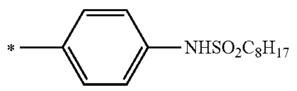 | B-52 |
| 5-24 | Me | 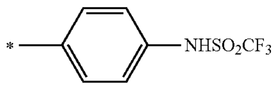 | B-55 |
| 5-25 | t-Bu | 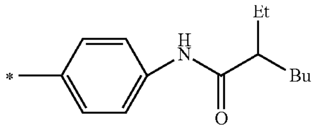 | B-60 |
| 5-26 | Me | Me | B-65 |
| 5-27 | Me | t-Bu | B-67 |
| 5-28 | Ph | Ph | B-50 |
| 5-29 | Ph | 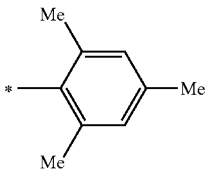 | B-23 |
| 5-30 | Et | Ph | B-59 |

Specific examples of the coloring agent represented by any of General Formulae (6) to (9) described in WO2019/189463A include, in addition to those described in [0068] to [0070] of WO2019/189463A, the following specific examples. However, the present invention is not limited thereto.

In the following specific examples, Me represents methyl, Et represents ethyl, i-Pr represents iso-propyl, t-Bu represents t-butyl, and Ph represents phenyl, respectively. In the following structures, * indicates a bonding site to a 4-membered carbon ring in each General Formula.

7-21

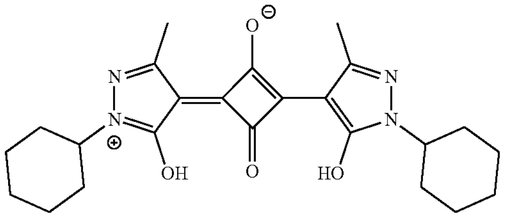

7-22

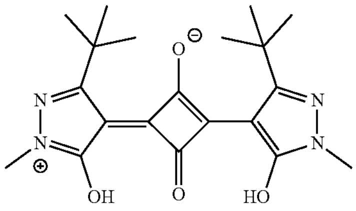

-continued 7-23

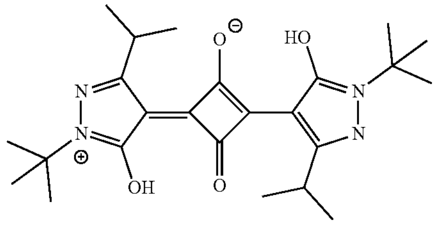

7-24

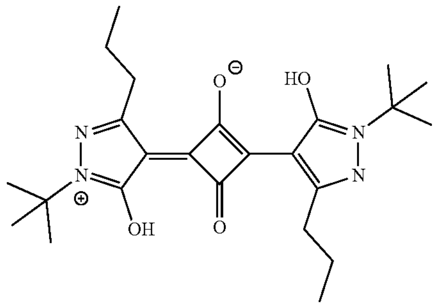

7-25

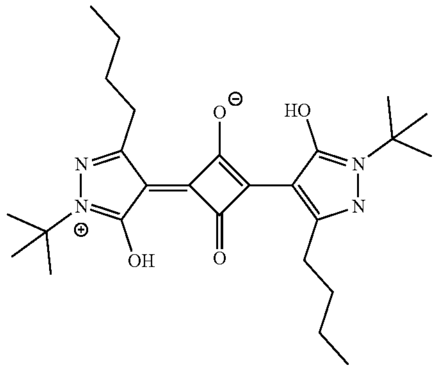

(Quencher-Embedded Coloring Agent)

The squaraine-based coloring agent represented by General Formula (1) described in WO2019/189463A include may be a quencher-embedded coloring agent in which a quencher moiety is linked to a coloring agent by a covalent bond with a linking group being interposed therebetween. The quencher-embedded coloring agent can also be preferably used as the coloring agent of at least one of the dye B or C. That is, the quencher-embedded coloring agent is counted as the dye B or dye C according to the wavelength having the main absorption wavelength range.

Examples of the quencher moiety include the metallocenyl group in the substituent X described later. It is noted that the description regarding the metallocenyl group in the substituent X described later, "General Formula (1)" shall be read as "General Formula (1) described in WO2019/189463A".

Further, examples thereof include the quencher moiety in the quencher compounds described in paragraphs [0199] to [0212] and paragraphs [0234] to [0310] of WO2019/066043A.

That is, in the squaraine-based coloring agent represented by General Formula (1) described in WO2019/189463A, a coloring agent having the quencher moiety as the substituent X is also one of the preferred forms.

Among the squaraine-based coloring agents represented by General Formula (1) described in WO2019/189463A, specific examples of the coloring agent corresponding to the quencher-embedded coloring agent include, in addition to those described in [0223] and [0234] of WO2019/189463A, the following specific examples. However, the present invention is not limited thereto.
In the following specific examples, Me represents methyl, Et represents ethyl, and Bu represents butyl, respectively.
C-73
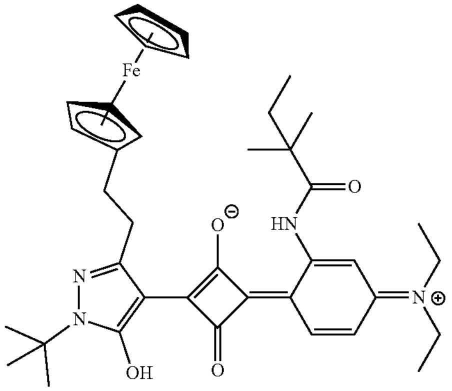
C-74
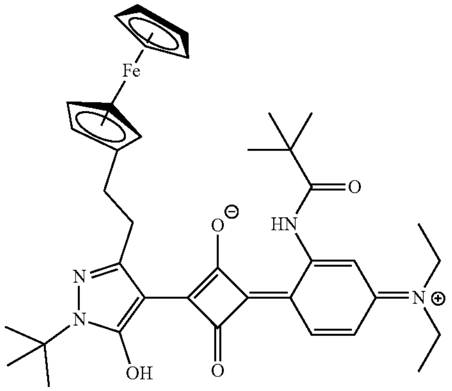
C-75
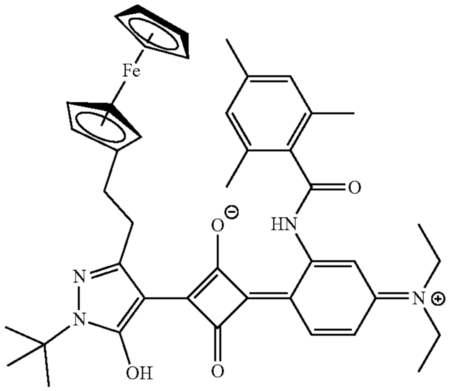
-continued
C-76
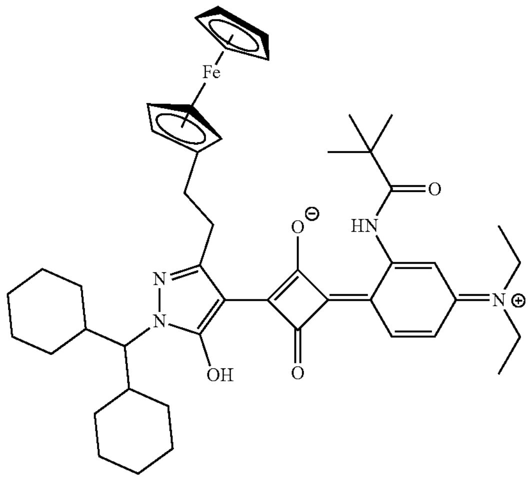
C-77
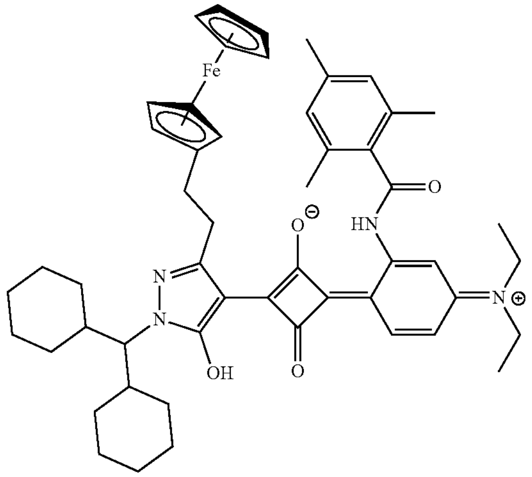
C-78
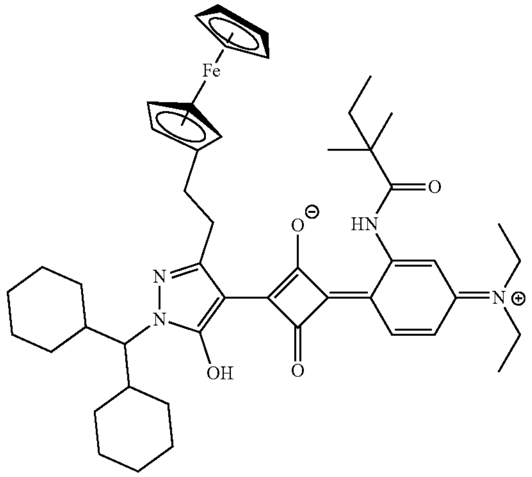

-continued
C-79
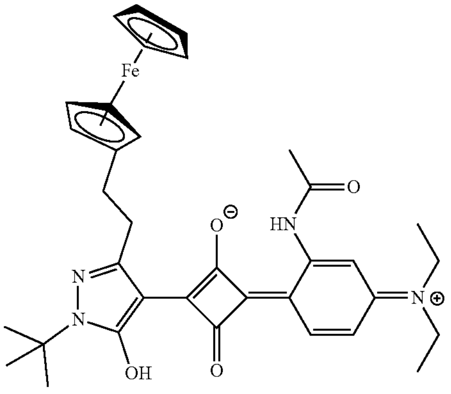
C-80
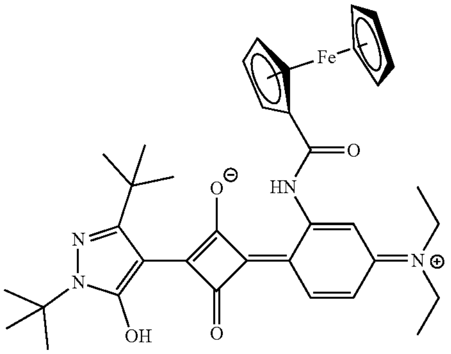
C-81
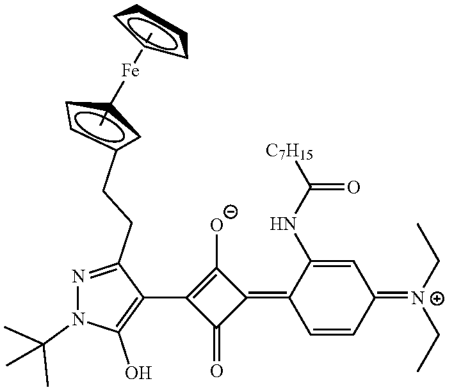
C-82
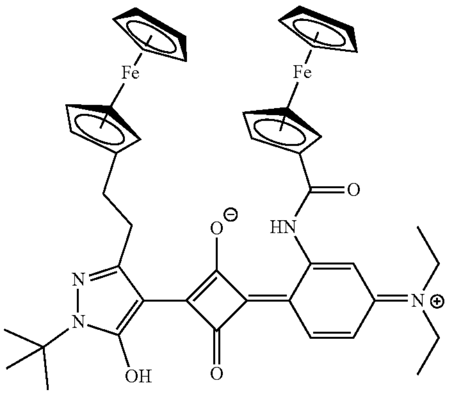
-continued
C-83
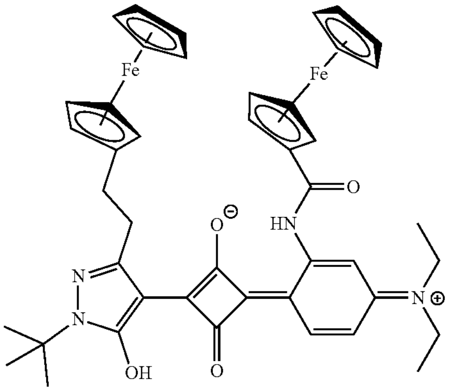
C-84
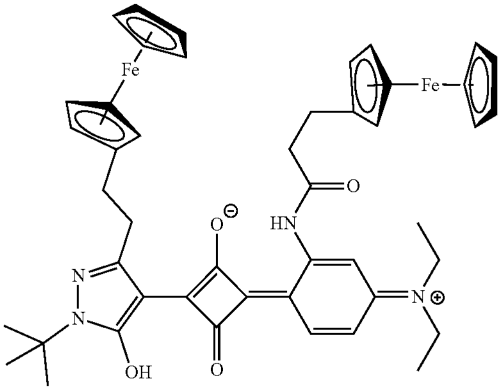
C-85
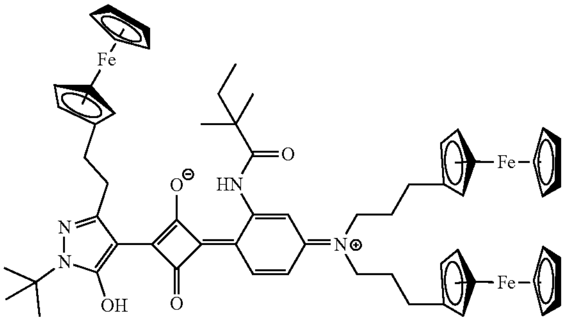
C-86
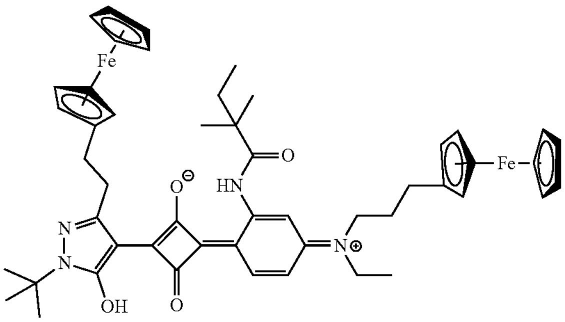

-continued
C-87
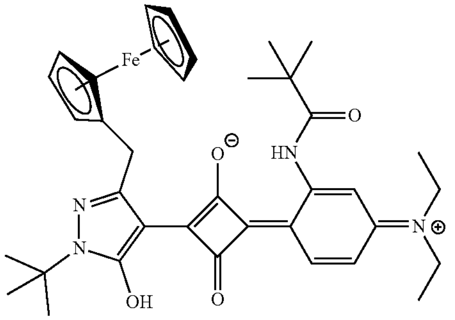
C-88
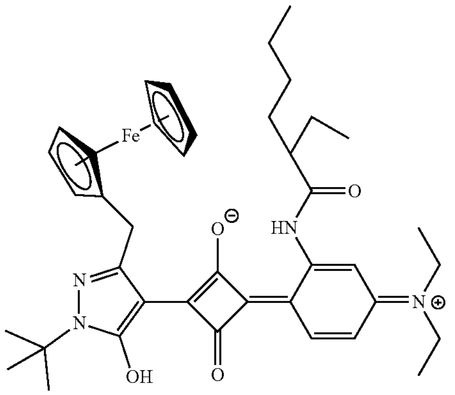
C-89
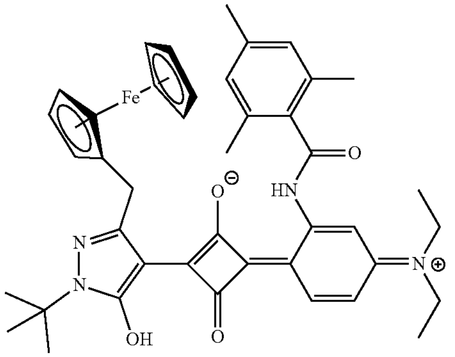
C-90
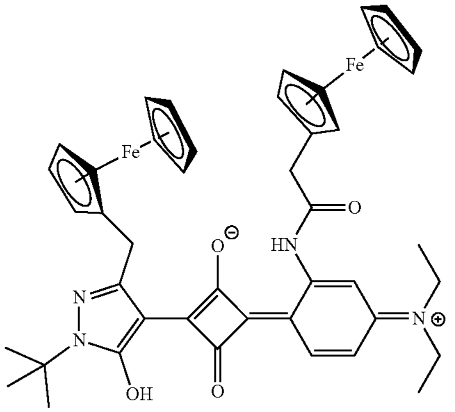
-continued
C-91
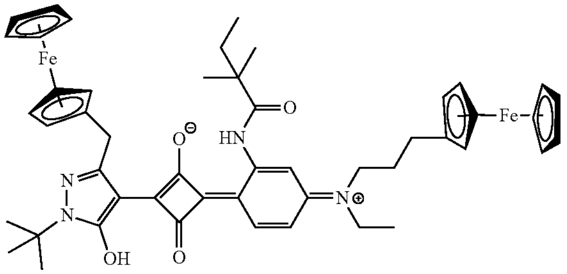
C-92
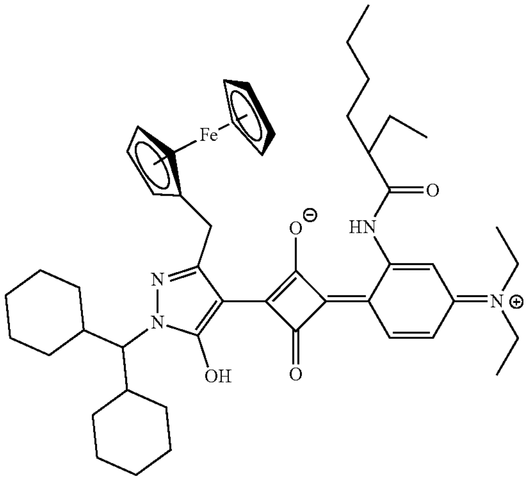
C-93
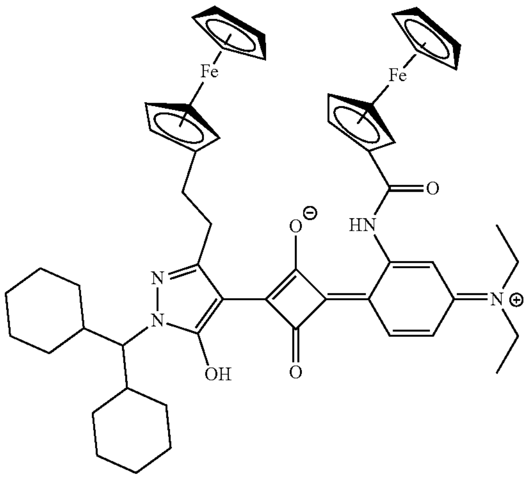

-continued
C-94
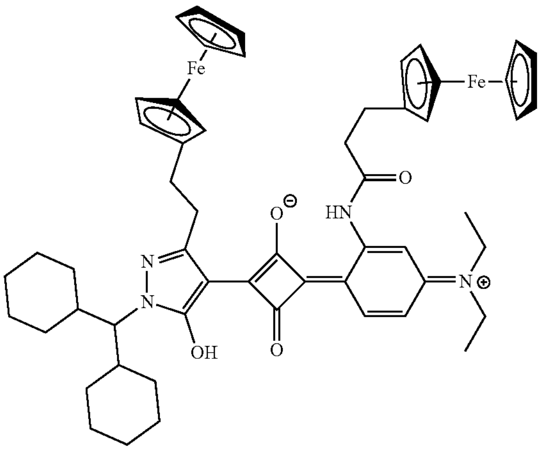
C-95
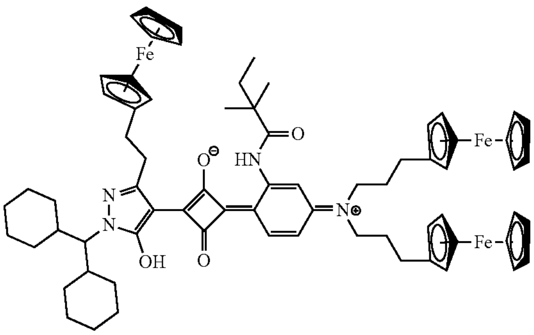
C-96
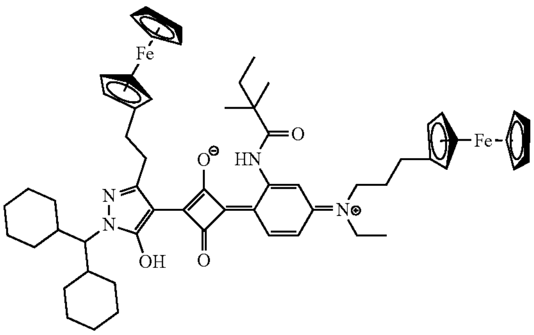
C-97
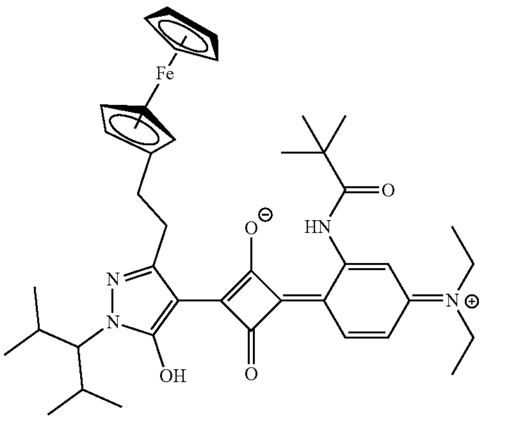
-continued
C-98
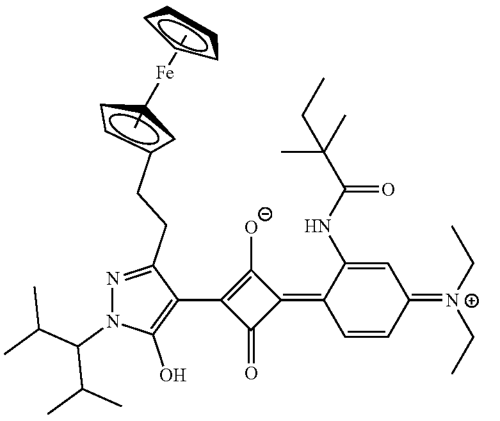
C-99
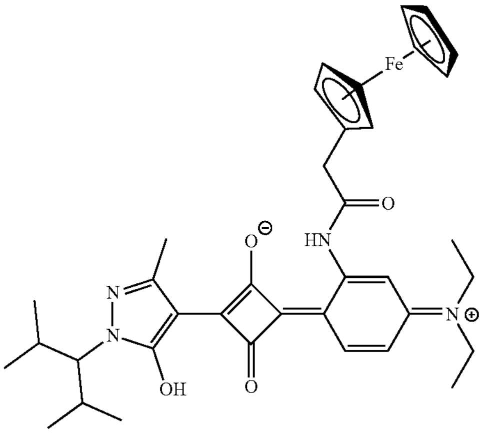
C-100
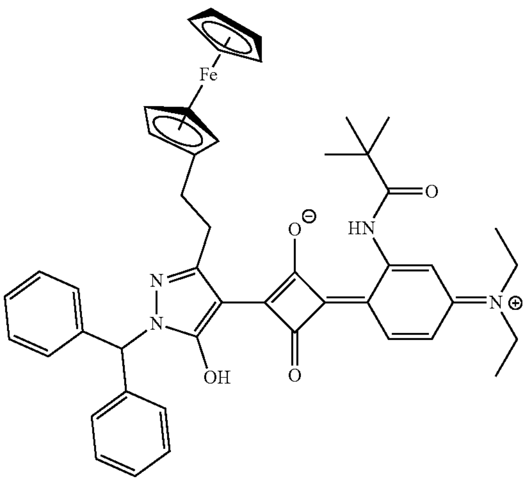

-continued
C-101
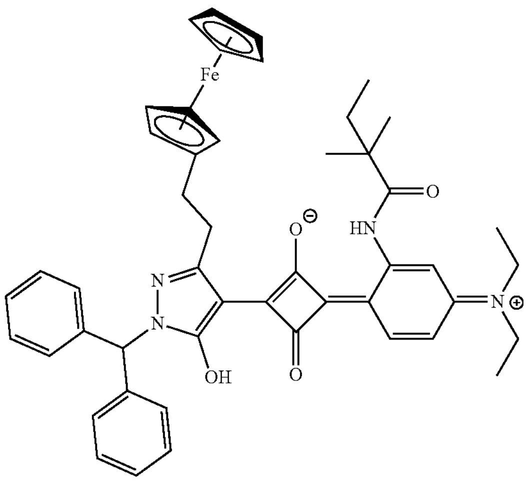
C-102
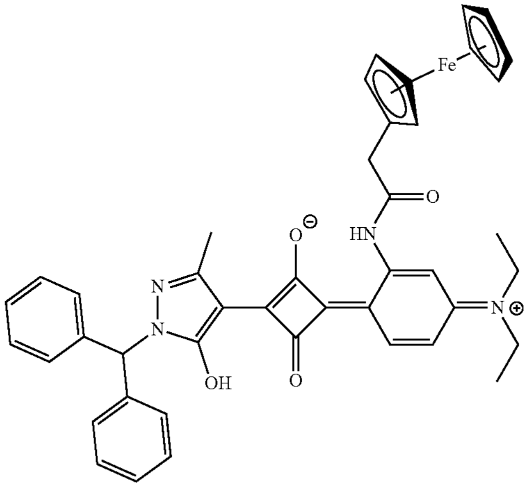
C-103
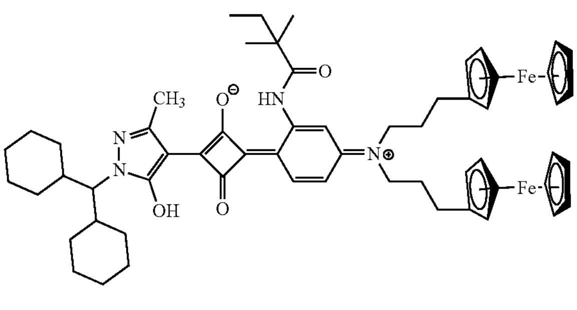
-continued
C-104
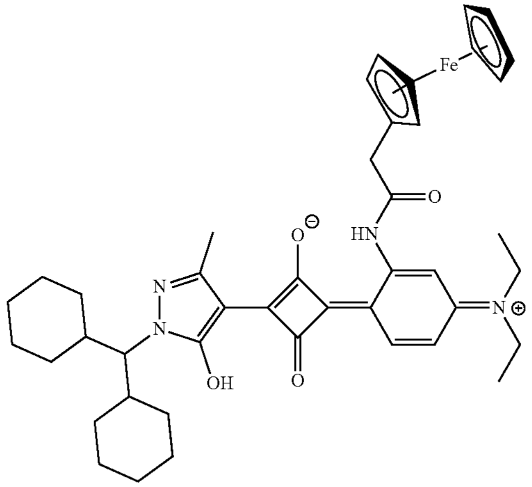
C-105
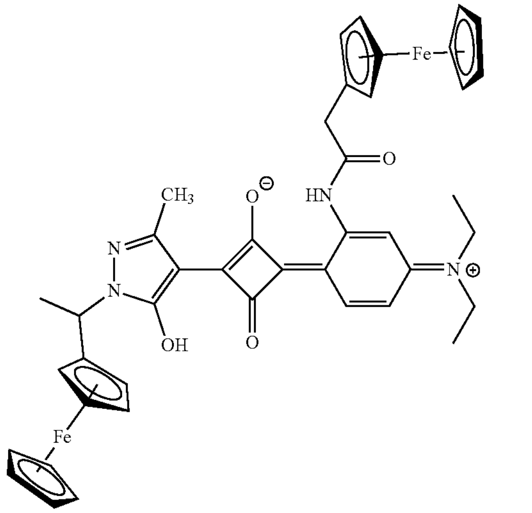
C-106
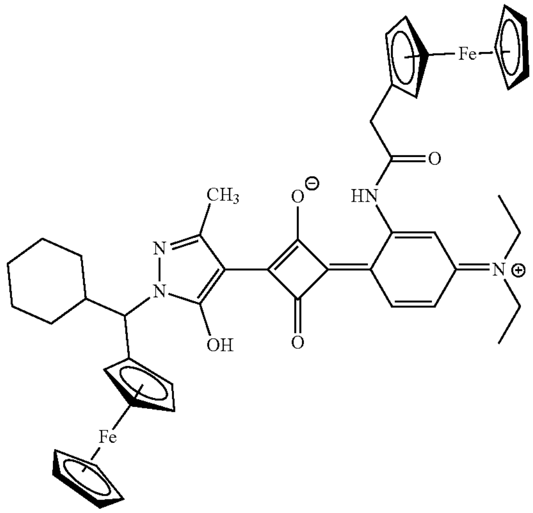

-continued
C-107
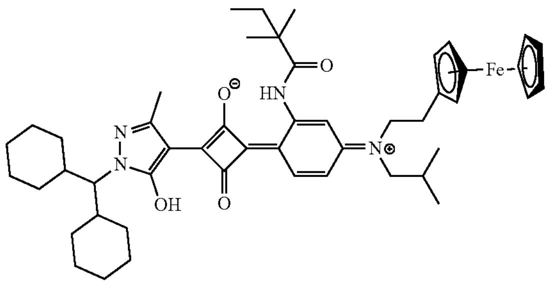
C-108
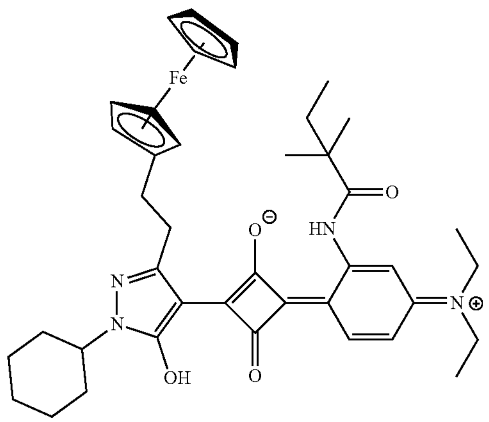
C-109
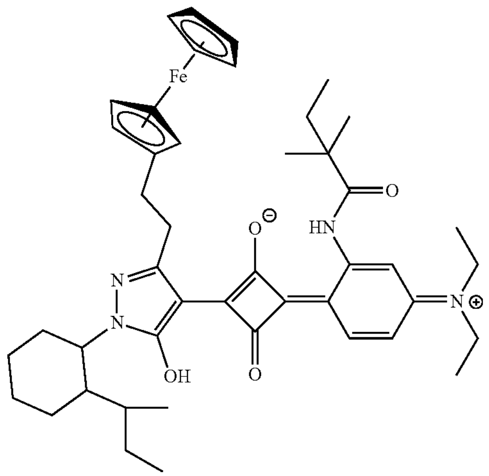
-continued
C-110
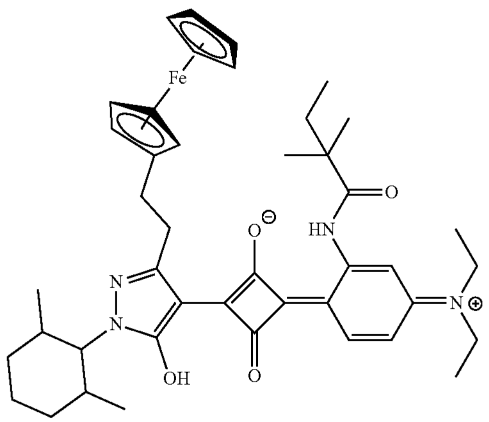
C-111
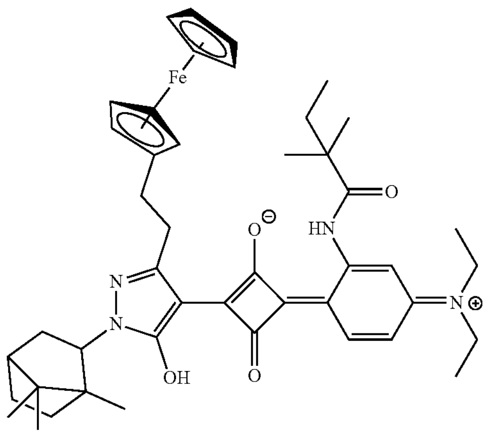
C-112
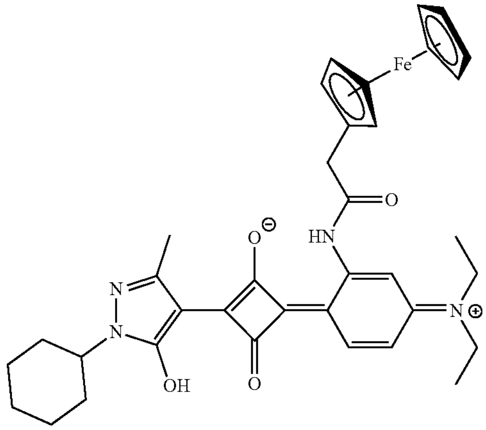

-continued
C-113
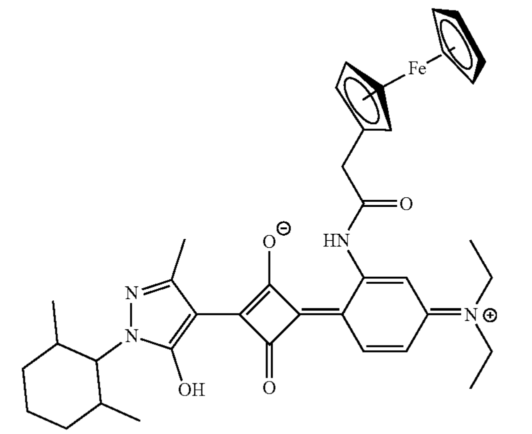
C-114
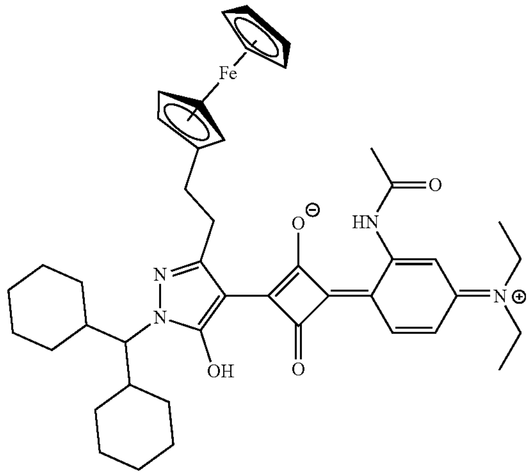
C-115
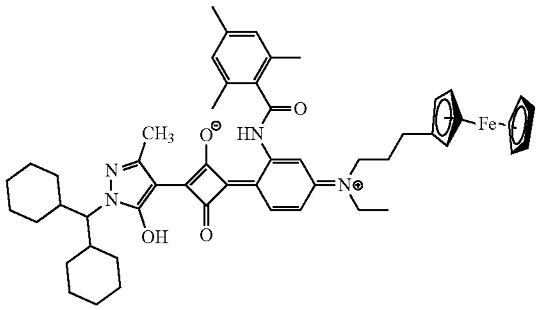
C-116
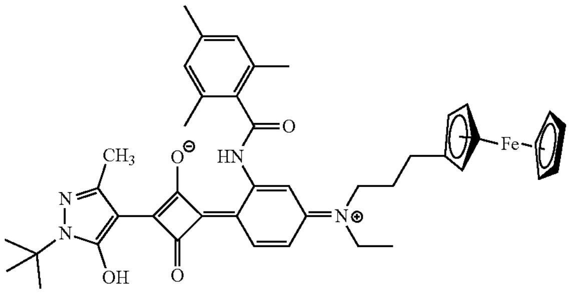
-continued
C-117
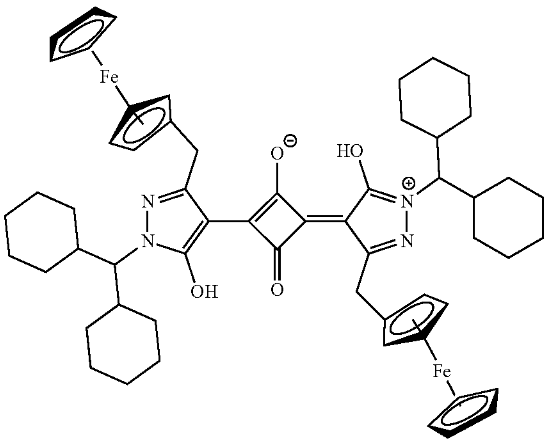
C-118
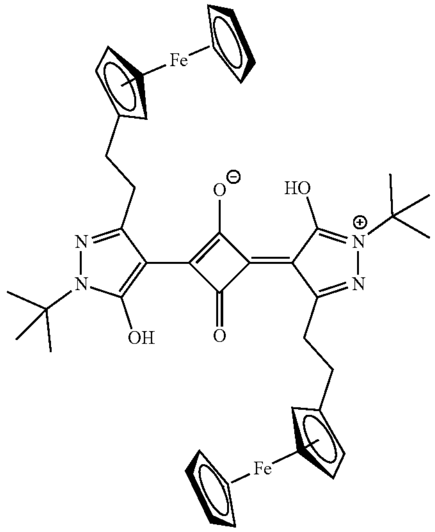
C-119
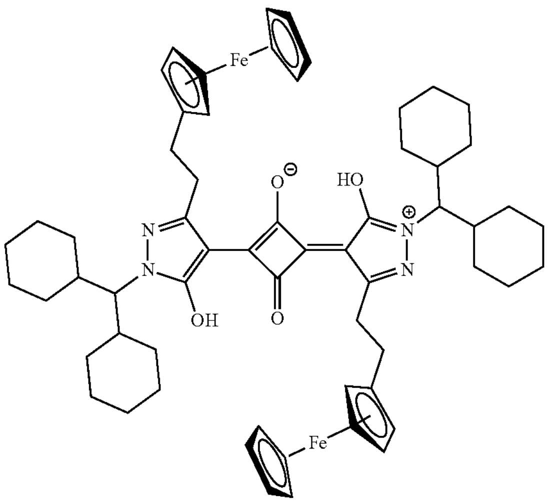

-continued

C-120

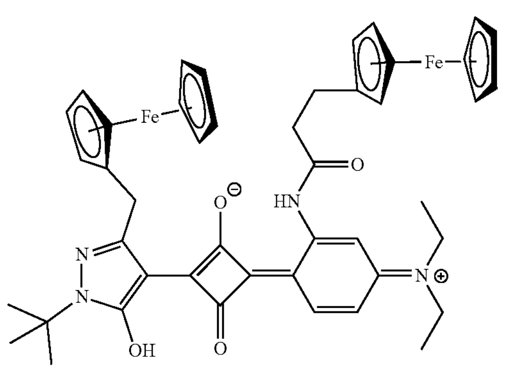

(Dye D)

The dye D is not particularly limited as long as the dye has the main absorption wavelength range in a wavelength of 680 to 780 nm in the wavelength selective absorption filter, and various dyes can be used.

Specific examples of the dye D include individual coloring agents (dyes) which are based on, for example, porphyrin, squaraine, and cyanine (CY).

Among these, the dye D is preferably a squaraine-based coloring agent, and more preferably a squaraine-based coloring agent represented by General Formula (1) since the absorption waveform in the main absorption wavelength range is sharp.

In the present invention, in the coloring agent represented by each General Formula, a cation is present in a delocalized manner, and thus a plurality of tautomer structures are present. Therefore, in the present invention, in a case where at least one tautomer structure of a certain coloring agent matches with each general formula, the certain coloring agent shall be a coloring agent represented by the general formula. Therefore, a coloring agent represented by a specific general formula can also be said to be a coloring agent having at least one tautomer structure that can be represented by the specific general formula. In the present invention, a coloring agent represented by a general formula may have any tautomer structure as long as at least one tautomer structure of the coloring agent matches with the general formula.

(Coloring Agent Represented by General Formula (1))

General Formula (1)

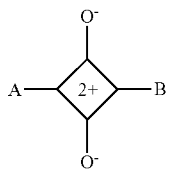

In General Formula (1), A and B each independently represent an aryl group which may have a substituent, a heterocyclic group which may have a substituent, or —CH=G. Here, G represents a heterocyclic group which may have a substituent.

The aryl group that can be employed as A or B is not particularly limited and may be a group consisting of a monocyclic ring or a group consisting of a fused ring. The aryl group preferably has 6 to 30 carbon atoms, more preferably has 6 to 20 carbon atoms, and still more preferably has 6 to 12 carbon atoms. Examples of the aryl group include groups respectively consisting of a benzene ring and a naphthalene ring, and a group consisting of a benzene ring is preferable.

The heterocyclic group that can be employed as A or B is not particularly limited, and examples thereof include a group consisting of an aliphatic heterocyclic ring or an aromatic heterocyclic ring. A group consisting of an aromatic heterocyclic ring is preferable. Examples of the heteroaryl group that is an aromatic heterocyclic group include a heteroaryl group that can be employed as a substituent X described below. The aromatic heterocyclic group that can be employed as A or B is preferably a group of a 5-membered ring or a 6-membered ring and more preferably a group of a nitrogen-containing 5-membered ring. Specific examples thereof suitably include a group consisting of any one of a pyrrole ring, a furan ring, a thiophene ring, an imidazole ring, a pyrazole ring, a thiazole ring, an oxazole ring, a triazole ring, an indole ring, an indolenine ring, an indoline ring, a pyridine ring, a pyrimidine ring, a quinoline ring, a benzothiazole ring, a benzoxazole ring, or a pyrazolotriazole ring. Among these, a group consisting of any one of a pyrrole ring, a pyrazole ring, a thiazole ring, a pyridine ring, a pyrimidine ring, or a pyrazolotriazole ring is preferable. It suffices that the pyrazolotriazole ring consists of a fused ring of a pyrazole ring and a triazole ring, at least one of each of which is fused to form a fused ring. Examples thereof include a fused ring having a form in which a pyrazole ring and a triazole ring form a fused ring in a form of sharing one nitrogen atom and one carbon atom.

A and B may be bonded to the squaric acid moiety (the 4-membered ring represented by General Formula (1)) at any portion (any ring-constituting atom) without particular limitation: however, they are preferably bonded at a carbon atom.

G in —CH=G that can be employed as A or B represents a heterocyclic group which may have a substituent, and examples thereof suitably include examples shown in the heterocyclic group that can be employed as A or B. Among these, a group consisting of any one of a benzoxazole ring, a benzothiazole ring, an indoline ring, or the like is preferable.

At least one of A or B may have a hydrogen bonding group that forms an intramolecular hydrogen bond.

Each of A, B, and G may have the substituent X, and, in a case where A, B, or G has the substituent X, adjacent substituents may be bonded to each other to further form a ring structure. In addition, a plurality of substituents X may be present. In a case where adjacent substituents X are bonded to each other to further form a ring structure, the two substituents X may form a ring by interposing a heteroatom such as a boron atom therebetween. The boron atom may be further substituted with a substituent, and examples of the substituent include substituents such as an alkyl group and an aryl group. Examples of a ring formed by bonding the following two substituents X include a ring formed by bonding two —$NR^{14}R^{15}$ and a ring formed by bonding the following to two —$NR^{14}R^{15}$'s by interposing a boron atom therebetween.

Examples of the substituent X include the following groups:

an alkyl group (it preferably has 1 to 20 carbon atoms, more preferably has 1 to 15 carbon atoms, and still more preferably has 1 to 8 carbon atoms; for example, methyl, ethyl, propyl, isopropyl, butyl, t-butyl, isobutyl, pentyl, hexyl, octyl, dodecyl, trifluoromethyl, cyclopentyl, or cyclohexyl);

an alkenyl group (it preferably has 2 to 20 carbon atoms, more preferably has 2 to 12 carbon atoms, and still more preferably has 2 to 8 carbon atoms; for example, vinyl, or allyl);

an alkynyl group (it preferably has 2 to 40 carbon atoms, more preferably has 2 to 30 carbon atoms, and particularly preferably has 2 to 25 carbon atoms; for example, ethynyl or propargyl);

an aryl group (it preferably has 6 to 30 carbon atoms, more preferably has 6 to 20 carbon atoms, and still more preferably has 6 to 12 carbon atoms; for example, phenyl or naphthyl);

a heterocyclic group (it includes an aromatic heterocyclic group and an aliphatic heterocyclic group; it includes a group consisting of a monocyclic ring or a fused ring, and it is preferably a monocyclic group or a group consisting of a fused ring having 2 to 8 rings, and more preferably a group consisting of a monocyclic ring or a fused ring having 2 to 4 rings; the number of heteroatoms constituting the ring is preferably 1 to 3, and examples of the heteroatom constituting the ring include a nitrogen atom, an oxygen atom, and a sulfur atom, where the ring is preferably a group consisting of a 5-membered ring or a 6-membered ring; the number of carbon atoms constituting the ring in the heteroaryl group is preferably 3 to 30, more preferably 3 to 18, and still more preferably 3 to 12; for example, furyl, thienyl, pyridyl, pyridazyl, pyrimidyl, pyrazil, triazil, imidazolyl, pyrazolyl, thiazolyl, benzimidazolyl, benzoxazolyl, quinazolyl, phthalazyl, pyrrolidyl, imidazolidyl, morpholyl, or oxazolidyl); an aralkyl group (an alkyl portion in the aralkyl group is the same as the alkyl group described above; an aryl portion in the aralkyl group is the same as the aryl group described above; and the aralkyl group preferably has 7 to 40 carbon atoms, more preferably has 7 to 30 carbon atoms, and still more preferably has 7 to 25 carbon atoms);

a metallocenyl group;

—$OR^{10}$ (examples thereof include a hydroxy group, an alkoxy group (methoxy, ethoxy, propyloxy, or the like), a cycloalkoxy group (cyclopentyloxy, cyclohexyloxy, or the like), an aryloxy group (phenoxy, naphthyloxy, or the like), and a heteroaryloxy group (an aromatic heterocyclic oxy group));

—$C({=}O)R^{11}$ (examples thereof include acyl groups such as acetyl, ethylcarbonyl, propylcarbonyl, cyclohexylcarbonyl, octylcarbonyl, 2-ethylhexylcarbonyl, phenylcarbonyl, naphthylcarbonyl, and pyridylcarbonyl));

—$C({=}O)OR^{II}$ (examples thereof include a carboxy group, an alkoxycarbonyl group (methyloxycarbonyl, ethyloxycarbonyl, butyloxycarbonyl, octyloxycarbonyl, or the like), and an aryloxycarbonyl group (phenyloxycarbonyl, naphthyloxycarbonyl, or the like);

—$OC({=}O)R^{13}$ (examples thereof include acyloxy groups such as acetyloxy, ethylcarbonyloxy, butylcarbonyloxy, octylcarbonyloxy, and phenylcarbonyloxy);

—$NR^{14}R^{15}$ (examples thereof include amino groups such as amino (—$NH_2$), ethylamino, dimethylamino, butylamino, dibutylamino, cyclopentylamino, 2-ethylhexylamino, dodecylamino, anilino, naphthylamino, and 2-pyridylamino);

—$NHCOR^{16}$ (examples thereof include amid groups such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, and phenylcarbonylamino, naphthylcarbonylamino);

—$CONR^{17}R^{18}$ (examples thereof include carbamoyl groups such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, and naphthylaminocarbonyl, 2-pyridylaminocarbonyl);

—$NHCONR^{19}R^{21}$ (examples thereof include ureide groups such as methylureido, ethylureido, pentylureido, cyclohexylureido, octylureido, dodecylureido, phenylureido, naphthylureido, and 2-pyridyl amino ureido);

—$NHCOOR^{21}$;

—$SR^{22}$ (examples thereof include an alkylthio group (methylthio, ethylthio, propylthio, or the like), a cycloalkylthio group (cyclopentylthio, cyclohexylthio, or the like), an arylthio group (phenylthio, naphthylthio, or the like), and a heteroarylthio group (an aromatic heterocyclic thio group));

—$SO_2R^{23}$ (examples thereof include an alkylsulfonyl group (methylsulfonyl, ethylsulfonyl, butylsulfonyl, cyclohexylsulfonyl, 2-ethylhexylsulfonyl, or the like), and arylsulfonyl (phenylsulfonyl, naphthylsulfonyl, 2-pyridylsulfonyl, or the like));

—$OSO_2R^{24}$ (examples thereof include an alkylsulfonyloxy group such as methanesulfonyloxy);

—$NHSO_2R^{25}$ (examples thereof include sulfonylamide groups such as methylsulfonylamino, octylsulfonylamino, 2-ethylhexylsulfonylamino, and trifluoromethylsulfonylamino);

—$SO_2NR^{26}R^{27}$ (examples thereof include sulfamoyl groups such as aminosulfonyl, methylaminosulfonyl, dimethylaminosulfonyl, butylaminosulfonyl, cyclohexylaminosulfonyl, octylaminosulfonyl, phenylaminosulfonyl, and 2-pyridylaminosulfonyl);

—$P({=}O)(OR^{28})_2$ (examples thereof include phosphoryl groups such as dimethoxyphosphoryl and diphenylphosphoryl);

a halogen atom (a fluorine atom, a chlorine atom, a bromine atom, or an iodine atom);

a cyano group; and a nitro group.

Further, it is also preferable that the substituent X has a quencher moiety described above, in addition to the metallocenyl group.

It is noted that $R^{10}$ to $R^{28}$ each independently represent a hydrogen atom, an aliphatic group, an aromatic group, or a heterocyclic group. The aliphatic group and the aromatic group, which can be employed as $R^{10}$ to $R^{28}$, are not particularly limited, and they can be appropriately selected from an alkyl group, an alkenyl group, and an alkynyl group, which are classified as the aliphatic group, and an aryl group which is classified as the aromatic group, in the substituent that can be employed as the substituent X. The heterocyclic group that can be employed as $R^{10}$ to $R^{28}$ may be aliphatic or aromatic, and it can be appropriately selected from, for example, the heterocyclic groups (the aromatic heterocyclic group and the aliphatic heterocyclic group) which can be employed as the substituent X.

Each of the alkyl group, the alkenyl group, and the alkynyl group, which can be employed as the substituent X, may be linear, branched, or cyclic, and it is preferably linear or branched.

It is noted that in a case where $R^{12}$ of —$COOR^{12}$ is a hydrogen atom (that is, a carboxy group), the hydrogen atom may be dissociated (that is, a carbonate group) or may be in a salt state. In addition, in a case where $R^{24}$ of —$OSO_2R^{24}$ is a hydrogen atom (that is, a sulfo group), the hydrogen atom may be dissociated (that is, a sulfonate group) or may be in a salt state.

The substituent that can be employed as the substituent X may further have a substituent. Examples of the substituent which may be further contained include the substituent X.

Further, adjacent substituents may be bonded to each other to form a ring. The ring to be formed is preferably an aliphatic heterocyclic ring or a heteroaryl ring, and it is preferably a 5-membered ring or a 6-membered ring although the size of the ring to be formed is not particularly limited. Further, the number of rings to be formed is not particularly limited, and it may be one or may be two or more.

The metallocenyl group that can be employed as the substituent X is preferably represented by General Formula (2M).

General Formula (2M)

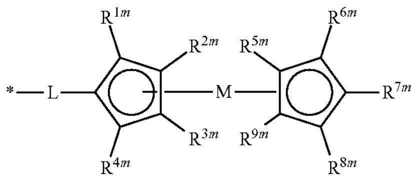

In General Formula (2M), L represents a single bond or a divalent linking group that does not conjugate with A, B, or G in General Formula (1). $R^{1m}$ to $R^{9m}$ each independently represent a hydrogen atom or a substituent. M represents an atom that can constitute a metallocene compound and represents Fe, Co, Ni, Ti, Cu, Zn, Zr, Cr, Mo, Os, Mn, Ru, Sn, Pd, Rh, V, or Pt. * represents a bonding site to A, B, or G.

In the present invention, in a case where L in General Formula (2M) is a single bond, a cyclopentadienyl ring directly bonded to A, B, or G (a ring having $R^{1m}$ in General Formula (2M)) is not included in the conjugated structure which conjugates with A, B, or G.

The divalent linking group that can be employed as L is not particularly limited as long as it is a linking group that does not conjugate with A, B, or G, and it may have a conjugated structure in the inside thereof or at a cyclopentadiene ring side end part in General Formula (2M). Examples of the divalent linking group include an alkylene group having 1 to 20 carbon atoms, an arylene group having 6 to 20 carbon atoms, a divalent heterocyclic group obtained by removing two hydrogens from the heterocyclic ring, —CH═CH—, —CO—, —CS—, —NR— (R represents a hydrogen atom or a monovalent substituent), —O—, —S—, —$SO_2$—, or —N═CH—, or a divalent linking group formed by combining a plurality (preferably, 2 to 6) of these groups. The divalent linking group is preferably a group selected from the group consisting of an alkylene group having 1 to 8 carbon atoms, an arylene group having 6 to 12 carbon atoms, —CH═CH—, —CO—, —NR— (R is as described above), —O—, —S—, —$SO_2$—, and —N═CH—, or a divalent linking group in which two or more (preferably 2 to 6) selected from the above group are combined, and it is more preferably a group selected from the group consisting of an alkylene group having 1 to 4 carbon atoms, a phenylene group, —CO—, —NH—, —O—, and —$SO_2$—, or a linking group in which two or more (preferably 2 to 6) selected from the above group are combined. The divalent linking group combined is not particularly limited, and it is preferably a group containing —CO—, —NH—, —O—, or —$SO_2$—, and examples thereof include a linking group formed by combining two or more of —CO—, —NH—, —O—, or —$SO_2$—, or a linking group formed by combining at least one of —CO—, —NH—, —O—, or —$SO_2$— and an alkylene group or an arylene group. Examples of the linking group formed by combining two or more of —CO—, —NH—, —O—, or —$SO_2$— include —COO—, —OCO—, —CONH—, —NHCOO—, —NHCONH—, and —$SO_2$NH—. Examples of the linking group formed by combining at least one of —CO—, —NH—, —O—, or —$SO_2$— and an alkylene group or an arylene group include a group in which —CO—, —COO—, or —CONH— and an alkylene group or an arylene group are combined.

The substituent that can be employed as R is not particularly limited and has the same meaning as the substituent X.

L is preferably a single bond or a group selected from the group consisting of an alkylene group having 1 to 8 carbon atoms, an arylene group having 6 to 12 carbon atoms, —CH═CH—, —CO—, —NR— (R is as described above), —O—, —S—, —$SO_2$—, and —N═CH—, or a group in which two or more selected from the above group are combined.

L may have one or a plurality of substituents. The substituent which may be contained in L is not particularly limited, and for example, it has the same meaning as the substituent X. In a case where L has a plurality of substituents, the substituents bonded to adjacent atoms may be bonded to each other to further form a ring structure.

The alkylene group that can be employed as L may be linear, branched, or cyclic as long as the group has 1 to 20 carbon atoms, and examples thereof include methylene, ethylene, propylene, methylethylene, methylmethylene, dimethylmethylene, 1,1-dimethylethylene, butylene, 1-methylpropylene, 2-methylpropylene, 1,2-dimethylpropylene, 1,3-dimethylpropylene, 1-methylbutylene, 2-methylbutylene, 3-methylbutylene, 4-methylbutylene, 2,4-dimethylbutylene, 1,3-dimethylbutylene, pentylene, hexylene, heptylene, octylene, ethane-1,1-diyl, propane-2,2-diyl, cyclopropane-1,1-diyl, cyclopropane-1,2-diyl, cyclobutane-1,1-diyl, cyclobutane-1,2-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, cyclohexane-1,4-diyl, and methylcyclohexane-1,4-diyl.

In a case where a linking group containing at least one of —CO—, —CS—, —NR— (R is as described above), —O—, —S—, —$SO_2$—, or —N═CH— in the alkylene group is employed as L, the group such as —CO— may be incorporated at any site in the alkylene group, and the number of the groups incorporated is not particularly limited.

The arylene group that can be employed as L is not particularly limited as long as the group has 6 to 20 carbon atoms, and examples thereof include a group obtained by further removing one hydrogen atom from each group exemplified as the aryl group having 6 to 20 carbon atoms that can be employed as A in General Formula (1).

The heterocyclic group that can be employed as L is not particularly limited, and examples thereof include a group obtained by further removing one hydrogen atom from each group exemplified as the heterocyclic group that can be employed as A.

In General Formula (2M), the remaining partial structure excluding the linking group L corresponds to a structure (a metallocene structure portion) in which one hydrogen atom is removed from the metallocene compound. In the present invention, for the metallocene compound serving as the metallocene structure portion, a known metallocene compound can be used without particular limitation, as long as it is a compound conforming to the partial structure defined by General Formula (2M) (a compound in which a hydrogen atom is bonded instead of L). Hereinafter, the metallocene structure portion defined by General Formula (2M) will be specifically described.

In General Formula (2M), $R^{1m}$ to $R^9$ μm each independently represent a hydrogen atom or a substituent. The substituents that can be employed as $R^{1m}$ to $R^9$ μm are not particularly limited, and they can be selected from, for example, the substituents that can be employed as the substituent X. $R^{1m}$ to $R^9$ μm each are preferably a hydrogen atom, a halogen atom, an alkyl group, an acyl group, an alkoxy group, an amino group, or an amide group, more preferably a hydrogen atom, a halogen atom, an alkyl group, an acyl group, or an alkoxy group, still more preferably a hydrogen atom, a halogen atom, an alkyl group, or an acyl group, particularly preferably a hydrogen atom, a halogen atom, or an alkyl group, and most preferably a hydrogen atom.

Among the alkyl groups that can be employed as the substituent X, the alkyl group that can be employed as $R^{1m}$ to $R^9$ μm is preferably an alkyl group having 1 to 8 carbon atoms, and examples thereof include methyl, ethyl, propyl, isopropyl, butyl, sec-butyl, tert-butyl, isobutyl, pentyl, tert-pentyl, hexyl, octyl, and 2-ethylhexyl.

This alkyl group may have a halogen atom as a substituent. Examples of the alkyl group substituted with a halogen atom include, for example, chloromethyl, dichloromethyl, trichloromethyl, bromomethyl, dibromomethyl, tribromomethyl, fluoromethyl, difluoromethyl, trifluoromethyl, 2,2,2-trifluoroethyl, perfluoroethyl, perfluoropropyl, perfluorobutyl.

In addition, in the alkyl group that can be employed as $R^{1m}$ or the like, at least one methylene group that forms a carbon chain may be substituted with —O— or —CO—. Examples of the alkyl group in which the methylene group is substituted with —O— include an alkyl group in which the end part methylene group of methoxy, ethoxy, propoxy, isopropoxy, butoxy, sec-butoxy, tert-butoxy, 2-methoxyethoxy, chloromethyloxy, dichloromethyloxy, trichloromethyloxy, bromomethyloxy, dibromomethyloxy, tribromomethyloxy, fluoromethyloxy, difluoromethyloxy, trifluoromethyloxy, 2,2,2-trifluoroethyloxy, perfluoroethyloxy, perfluoropropyloxy, or perfluorobutyloxy is substituted, as well as an alkyl group in which an internal methylene group of the carbon chain such as 2-methoxyethyl or the like is substituted. Examples of the alkyl group in which a methylene group is substituted with —CO— include acetyl, propionyl, monochloroacetyl, dichloroacetyl, trichloroacetyl, trifluoroacetyl, propane-2-one-1-yl, and butane-2-one-1-yl.

In General Formula (2M), M represents an atom that can constitute a metallocene compound, and represents Fe, Co, Ni, Ti, Cu, Zn, Zr, Cr, Mo, Os, Mn, Ru, Sn, Pd, Rh, V, or Pt. Among these, M is preferably Fe, Ti, Co, Ni, Zr, Ru, or Os, more preferably Fe, Ti, Ni, Ru, or Os, still more preferably Fe or Ti, and most preferably Fe.

The group represented by General Formula (2M) is preferably a group formed by combining preferred ones of L, $R^{1m}$ to $R^9$ μm, and M. Examples thereof include a group formed by combining, as L, a single bond, or a group selected from the group consisting of an alkylene group having 2 to 8 carbon atoms, an arylene group having 6 to 12 carbon atoms, —CH═CH—, —CO—, —NR— (R is as described above), —O—, —S—, —$SO_2$—, and —N═CH—, or a group in which two or more selected from the above group are combined; as $R^{1m}$ to $R^9$ μm, a hydrogen atom, a halogen atom, an alkyl group, an acyl group, or an alkoxy group; and as M, Fe.

The alkyl group, the alkenyl group, the alkynyl group, the aralkyl group, the aryl group, and the heteroaryl group which can be employed as the substituent X and the aliphatic group, the aromatic group, and the heterocyclic group which can be employed as $R^{10}$ to $R^{28}$ each may further have a substituent or may be unsubstituted. The substituent which may be further contained therein is not particularly limited, and it is preferably a substituent selected from an alkyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, an alkylthio group, an arylthio group, an aromatic heterocyclic thio group, a sulfonyl group, a metallocenyl group, a hydroxy group, a mercapto group, a halogen atom, a cyano group, a sulfo group, or a carboxy group, and it is more preferably a substituent selected from an alkyl group, an aryl group, an alkoxy group, an aryloxy group, an aromatic heterocyclic oxy group, an acyl group, an alkoxycarbonyl group, an aryloxycarbonyl group, an acyloxy group, an alkylthio group, an arylthio group, an aromatic heterocyclic thio group, a sulfonyl group, a metallocenyl group, a hydroxy group, a mercapto group, a halogen atom, a cyano group, a sulfo group, or a carboxy group. These groups can be appropriately selected from the substituents that can be employed as the substituent X.

In a case where the dye D is a coloring agent represented by General Formula (1), a coloring agent represented by General Formula (14) is preferable.

General Formula (14)

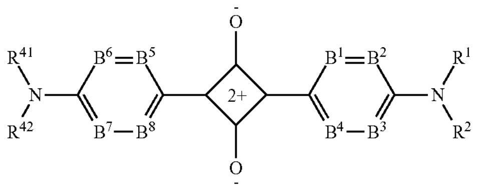

In General Formula (14), $R^1$ and $R^2$ each independently represent a hydrogen atom or a substituent. $R^1$ and $R^2$ may be the same or different from each other, and they may be bonded together to form a ring.

The substituent that can be employed as $R^1$ and $R^2$ is not particularly limited. However, examples thereof include, in the substituent X, an alkyl group (including a cycloalkyl group), an alkenyl group, an alkynyl group, an aryl group, a heterocyclic group (including an aromatic heterocyclic group and an aliphatic heterocyclic group), an alkoxy group, a cycloalkoxy group, an aryloxy group, a heteroaryloxy group, an alkylthio group, a cycloalkylthio group, an arylthio group, a heteroarylthio group, an alkoxycarbonyl group, an aryloxycarbonyl group, a phosphoryl group, a sulfamoyl group, an acyl group, an acyloxy group, an amide group, a sulfonylamide group, a carbamoyl group, a ureido group, an alkylsulfonyl group, an arylsulfonyl group, an amino group, an alkylsulfonyloxy group, a cyano group, a nitro group, a halogen atom, and a hydroxy group.

In addition, $R^{41}$ and $R^{42}$ have also the same meaning as $R^1$ and $R^2$ described above, respectively.

$R^1$, $R^2$, $R^{41}$, and $R^{42}$ may further have a substituent. Examples of the substituent which may be further contained include the substituent X.

Among the above, $R^1$, $R^2$, $R^{41}$, and $R^{42}$ are preferably an alkyl group, an alkenyl group, an aryl group, or a heteroaryl group, more preferably an alkyl group, an aryl group, or a heteroaryl group, and still more preferably an alkyl group or an aryl group is.

In General Formula (14), $B^1$, $B^2$, $B^3$, and $B^4$ each independently represent a carbon atom or a nitrogen atom. The ring including $B^1$, $B^2$, $B^3$, and $B^4$ is an aromatic ring. It is preferable that at least two or more of $B^1$ to $B^4$ are a carbon atom, and it is more preferable that all of $B^1$ to $B^4$ are a carbon atom.

The carbon atom that can be employed as $B^1$ to $B^4$ has a hydrogen atom or a substituent. Among carbon atoms that can be employed as $B^1$ to $B^4$, the number of carbon atoms having a substituent is not particularly limited; however, it is preferably zero, one, or two, and more preferably one. Particularly, it is preferable that $B^1$ and $B^4$ are a carbon atom and at least one of them has a substituent.

The substituent possessed by the carbon atom that can be employed as $B^1$ to $B^4$ is not particularly limited, and examples thereof include the above-described substituents that can be employed as $R^1$ and $R^2$. Among these, it is preferably an alkyl group, an alkoxy group, an alkoxycarbonyl group, an aryl group, an acyl group, an amide group, a sulfonylamide group, a carbamoyl group, an alkylsulfonyl group, an arylsulfonyl group, an amino group, a cyano group, a nitro group, a halogen atom, or a hydroxy group, and it is more preferably an alkyl group, an alkoxy group, an alkoxycarbonyl group, an aryl group, an acyl group, an amide group, a sulfonylamide group, a carbamoyl group, an amino group, a cyano group, a nitro group, a halogen atom, or a hydroxy group.

Further, $B^5$, $B^6$, $B^7$, and $B^8$ have the same meaning as the above $B^1$, $B^2$, $B^3$, and $B^4$, respectively.

The substituent possessed by the carbon atom that can be adopted as $B^1$ to $B^8$ may further have a substituent. Examples of the substituent which may be further contained include the substituent X.

Examples of the substituent that can be possessed by the carbon atom that can be employed as $B^1$, $B^4$, $B^5$, and $B^8$ still more preferably include an alkyl group, an alkoxy group, a hydroxy group, an amide group, a sulfonylamide group, or a carbamoyl group, and particularly preferably an alkyl group, an alkoxy group, a hydroxy group, an amide group, or a sulfonylamide group, where a hydroxy group, an amide group, or a sulfonylamide group is most preferable.

It is still more preferable that the substituent that can be possessed by the carbon atom that can be employed as $B^2$, $B^3$, $B^6$, and $B^7$ is an alkyl group, an alkoxy group, an alkoxycarbonyl group, an acyl group, an amino group, a cyano group, a nitro group, or a halogen atom, and it is particularly preferable that the substituent of any one of them is an electron withdrawing group (for example, an alkoxycarbonyl group, an acyl group, a cyano group, a nitro group, or a halogen atom).

In General Formula (14), $R^1$ and $R^2$ may be bonded to each other to form a ring, and $R^1$ or $R^2$ and the substituent contained in $B^2$ or $B^3$ may be bonded to each other to form a ring. In addition, $R^{41}$ and $R^{42}$ may be bonded to each other to form a ring, and $R^{41}$ or $R^{42}$ and the substituent contained in $B^6$ or $B^7$ may be bonded to each other to form a ring.

In the above description, the ring to be formed is preferably a heterocyclic ring or a heteroaryl ring, and it is preferably a 5-membered ring or a 6-membered ring although the size of the ring to be formed is not particularly limited. Further, the number of rings to be formed is not particularly limited, and it may be one or may be two or more. Examples of the form in which two or more rings are formed include a form in which the substituents of $R^1$ and $B^2$ and the substituents of $R^2$ and $B^3$ are respectively bonded to each other to form two rings.

Specific examples of the dye D are shown below. The following compounds F-1 to F-33 are coloring agents represented by General Formula (1).

F-1

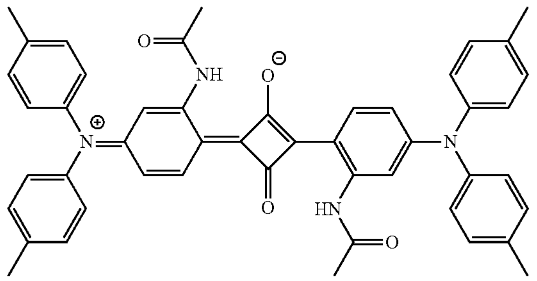

F-2

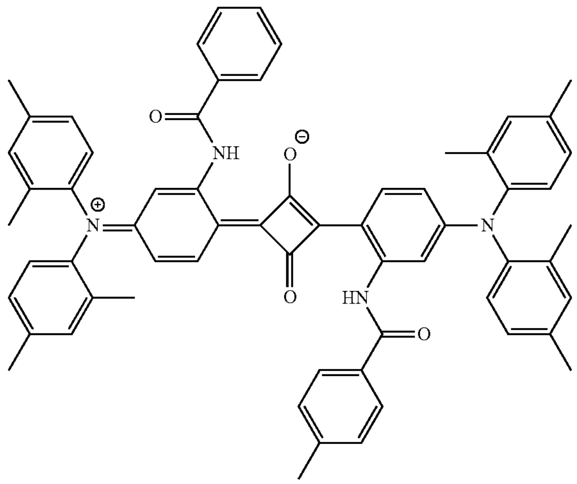

-continued
F-3
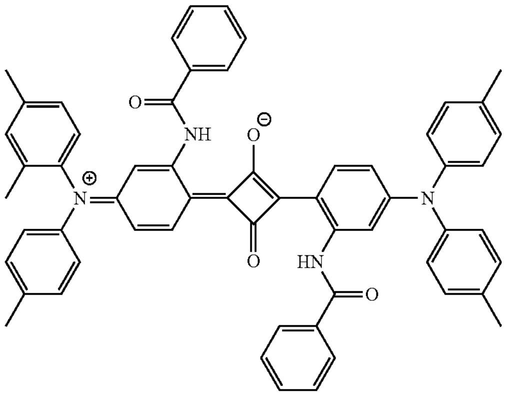
F-4
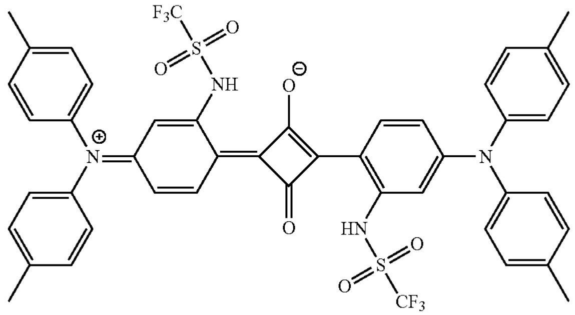
F-5
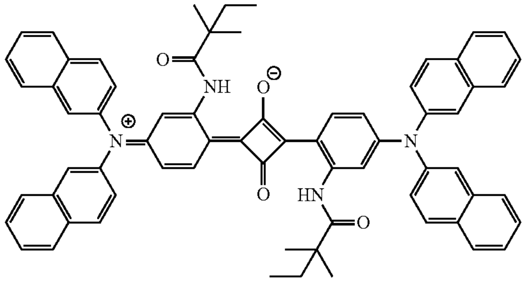
F-6
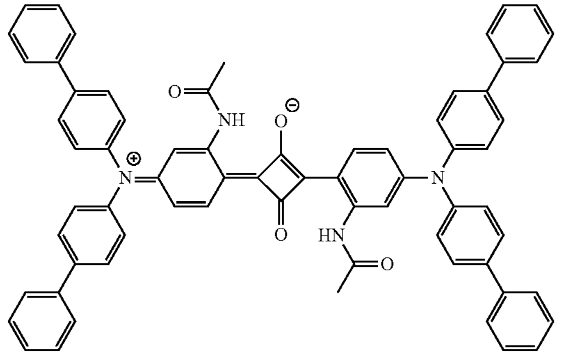
F-7
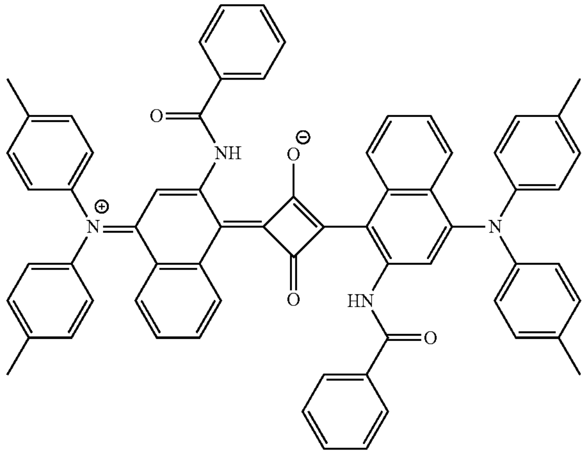
F-8
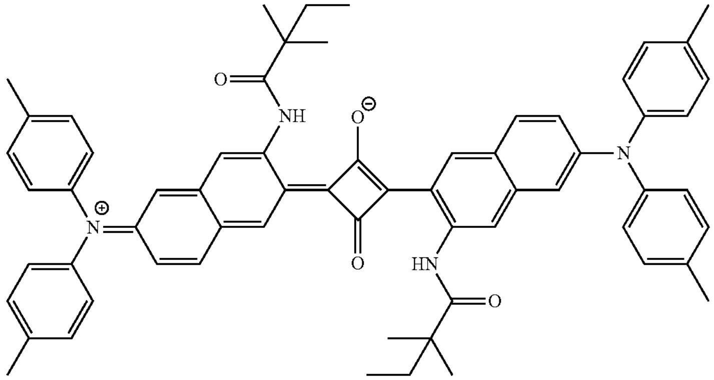

-continued
F-9
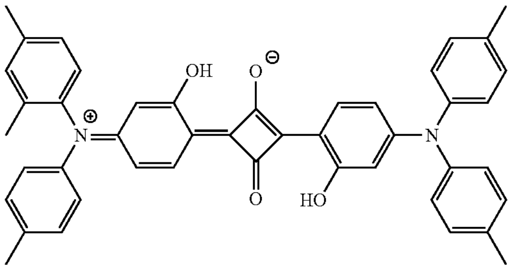
F-10
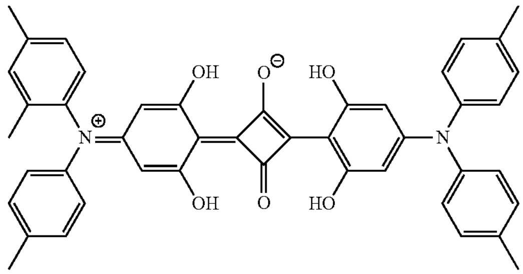
F-11
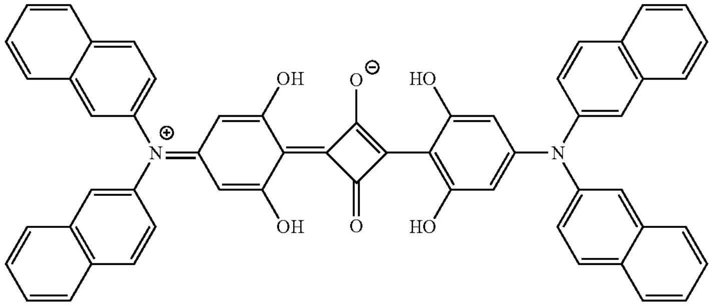
F-12
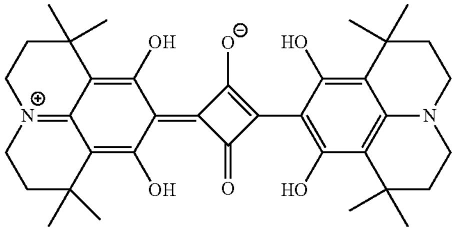
F-13
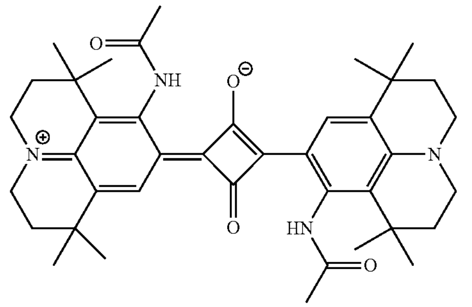
F-14
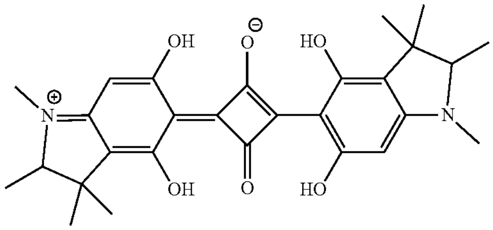
F-15
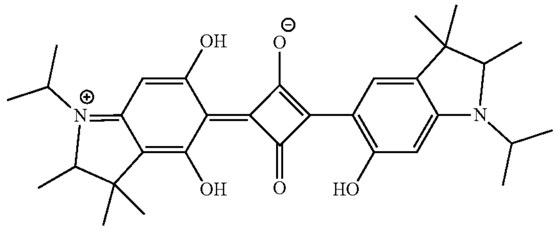
F-16
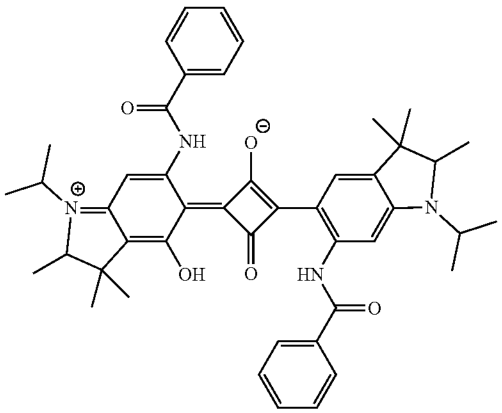
F-17
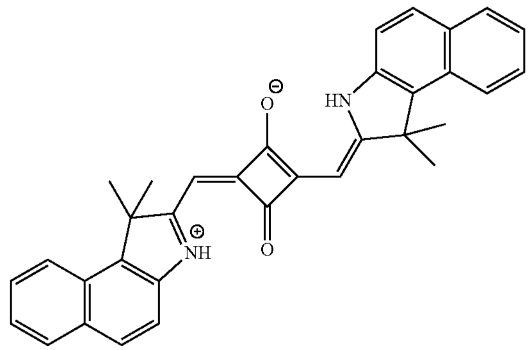

-continued
F-18
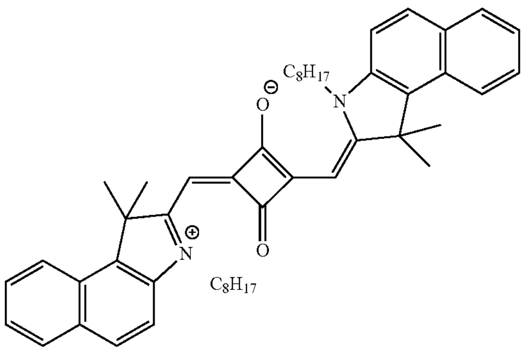
F-19
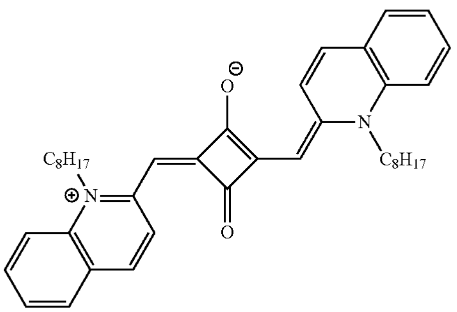
F-20
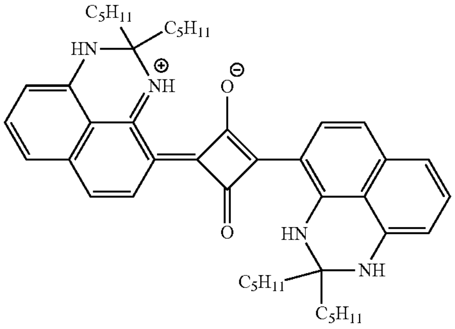
F-21
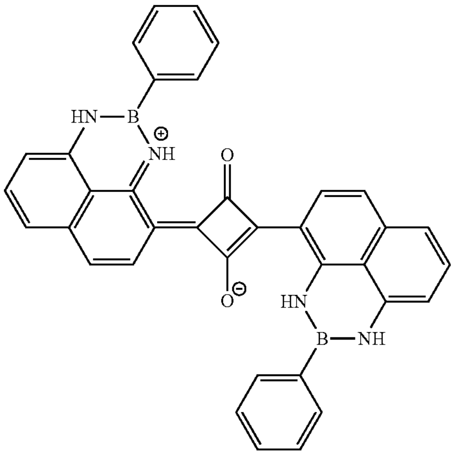
F-22
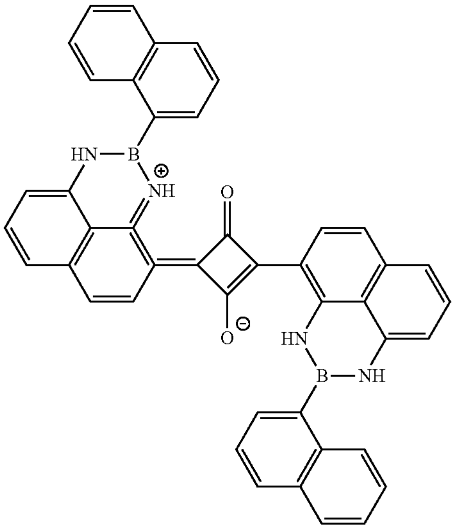
F-23
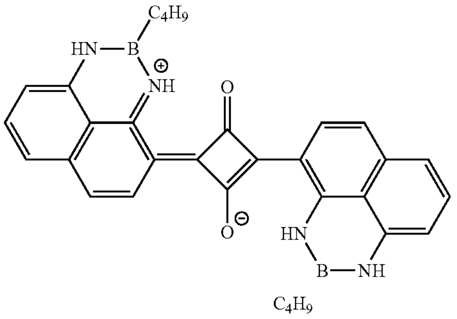

-continued
F-24
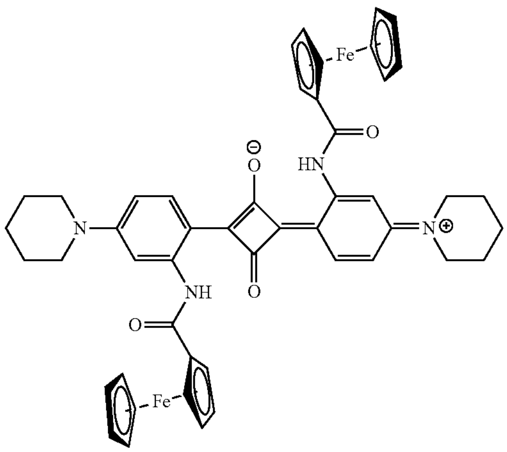
F-25
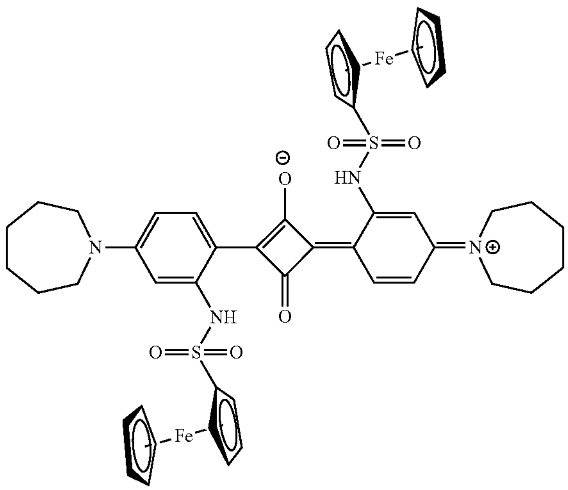
F-26
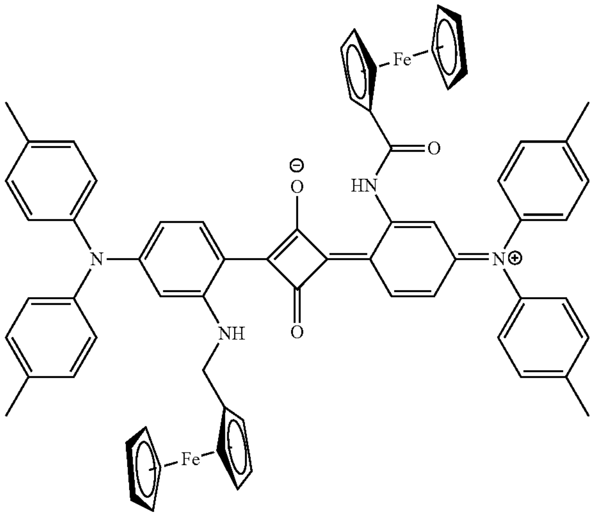
F-27
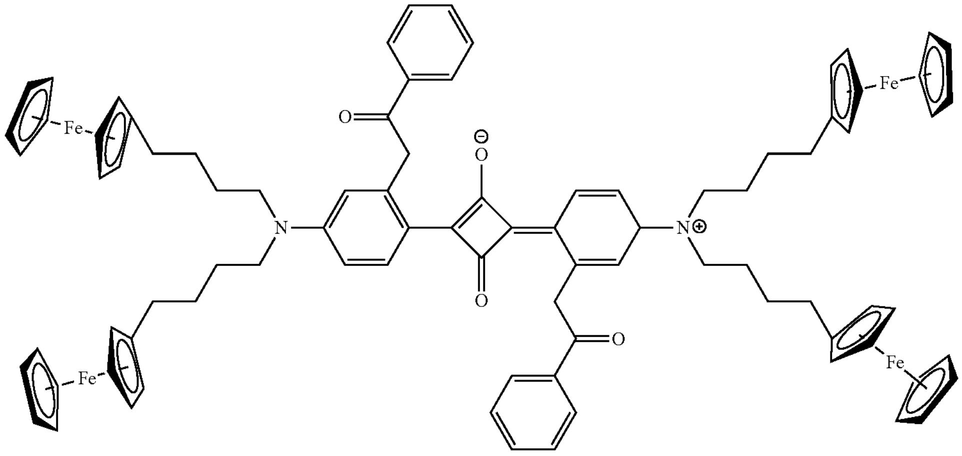

-continued
F-28
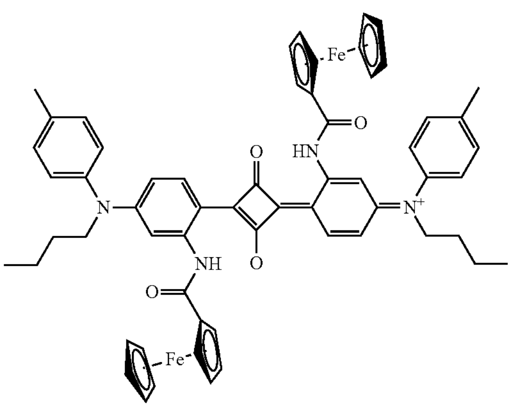
F-29
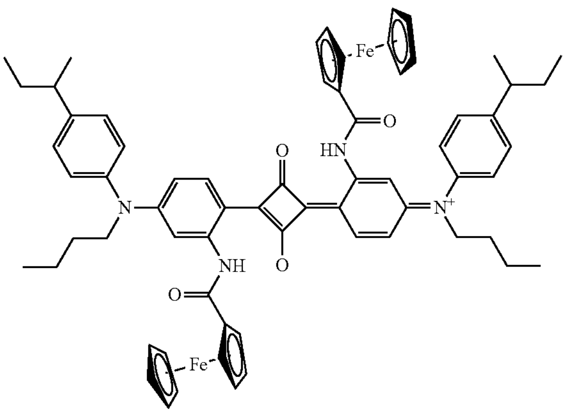
F-30
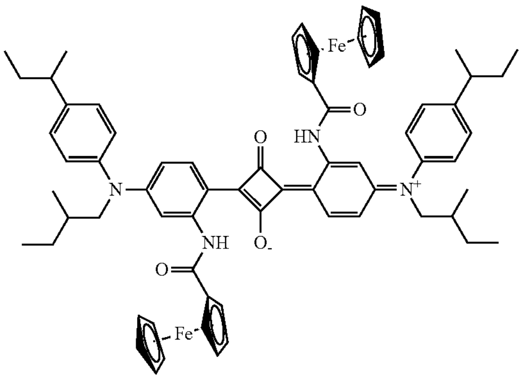
F-31
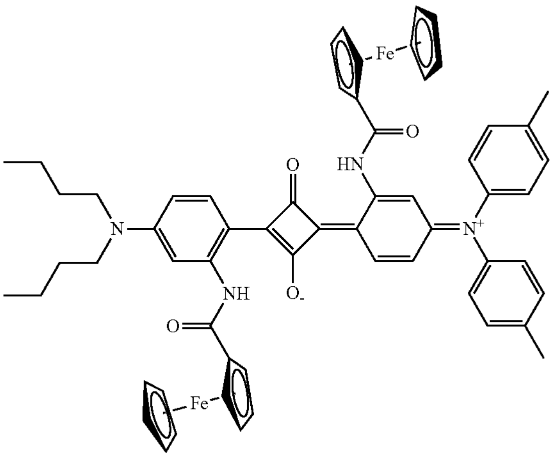
F-32
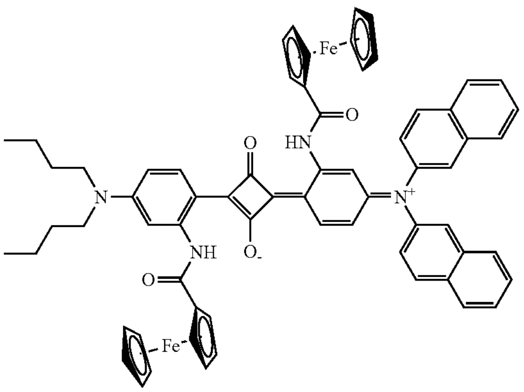
F-33
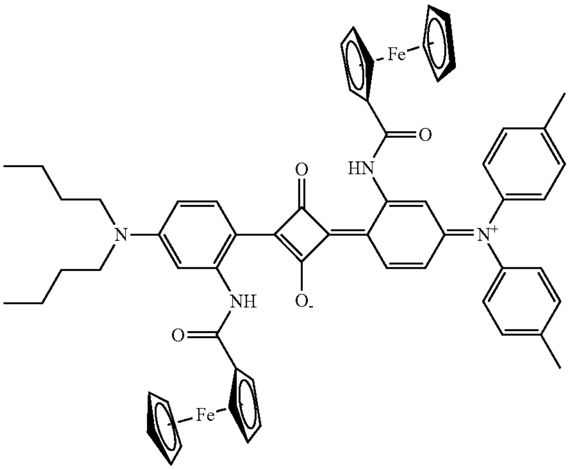

-continued

F-34

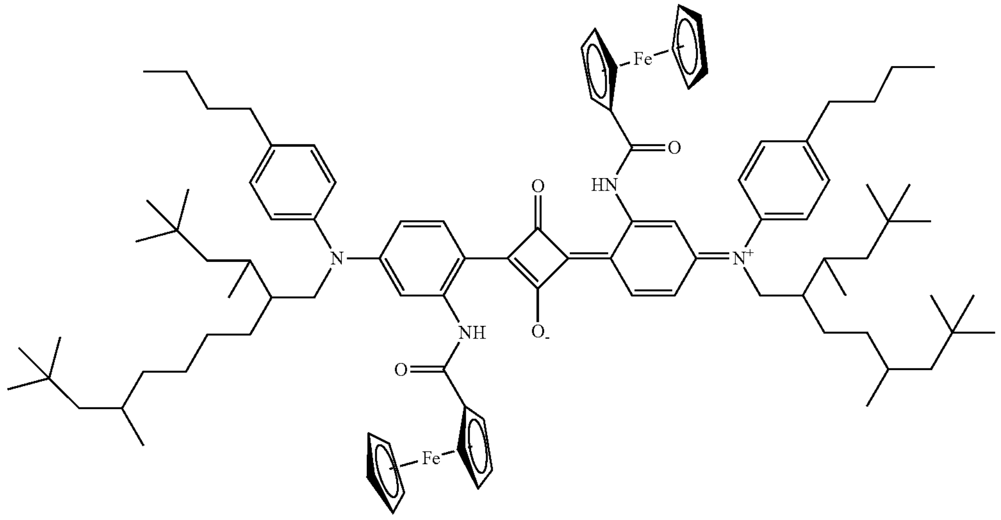

F-35

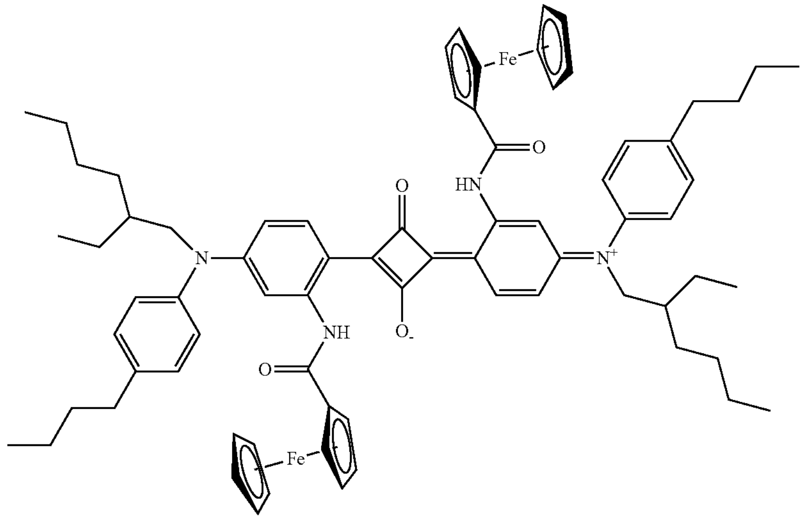

The total content of the dyes A to D in the wavelength selective absorption filter according to the embodiment of the present invention is not particularly limited as long as the effect of the present invention is exhibited, and it is preferably 0.01% by mass or more, more preferably 0.05% by mass or more, still more preferably 0.10% by mass or more, particularly preferably 0.15% by mass or more, and especially preferably 0.20% by mass or more. In a case where the total content of the dyes A to D in the wavelength selective absorption filter is equal to or larger than the above-described preferred lower limit value, a good antireflection effect can be obtained.

In addition, the total content of the dyes A to D in the wavelength selective absorption filter according to the embodiment of the present invention is generally 70% by mass or less, preferably 50% by mass or less, and more preferably 40% by mass or less.

The content of each of the dyes A to D that can be contained in the wavelength selective absorption filter according to the embodiment of the present invention is preferably as follows. The content of the dye A in the wavelength selective absorption filter according to the embodiment of the present invention is preferably 0.01% to 45% by mass and more preferably 0.1% to 30% by mass.

The content of the dye B in the wavelength selective absorption filter according to the embodiment of the present invention is preferably 0.01% to 45% by mass and more preferably 0.1% to 30% by mass.

The content of the dye C in the wavelength selective absorption filter according to the embodiment of the present invention is preferably 0.01% to 30% by mass and more preferably 0.1% to 25% by mass.

The content of the dye D in the wavelength selective absorption filter according to the embodiment of the present invention is preferably 0.01% to 45% by mass and more preferably 0.1% to 30% by mass.

It is noted that in a case where at least one of the dye B, C, or D is a quencher-embedded coloring agent, the content of the quencher-embedded coloring agent in the wavelength selective absorption filter according to the embodiment of the present invention is preferably 0.1% by mass or more from the viewpoint of the antireflection effect. The upper limit value thereof is preferably 45% by mass or less.

<Resin>

The resin contained in the wavelength selective absorption filter (hereinafter, also referred to as a “matrix resin”) according to the embodiment of the present invention is not particularly limited as long as the resin can disperse (preferably dissolve) the dye and an association inhibitor to be described later, and can suppress the association of the dye by the association inhibitor and suppress the decrease in light resistance. It is preferable to be capable of satisfying the suppression of external light reflection and the suppression of brightness decrease, and moreover, to be capable of maintaining the original tint of an image of the display device (preferably, a self-luminous display device) at an excellent level.

In a case where a squaraine-based coloring agent represented by General Formula (1) is contained as the dye D, the matrix resin is preferably a low-polarity matrix resin in which the squaraine-based coloring agent can exhibit sharper absorption. This also applies in a case where a squaraine-based coloring agent represented by General Formula (1) described in WO2019/189463A is contained as at least one of the dye B or C. Since the squaraine-based coloring agent exhibits sharper absorption, both antireflection and suppression of brightness decrease can be achieved at an excellent level. Here, the low polarity means that an fd value defined by Relational Expression α is preferably 0.50 or more.

$$fd=\delta d/(\delta d+\delta p+\delta h) \qquad \text{Relational Expression } \alpha$$

In Relational Expression α, δd, δp, and δh respectively indicate a term corresponding to a London dispersion force, a term corresponding to a dipole-dipole force, and a term corresponding to a hydrogen bonding force with respect to a solubility parameter St calculated according to the Hoy method. A specific calculation method of fd will be described later. That is, fd indicates a ratio of δd to the sum of δd, δp, and δh.

In a case where the fd value is set to 0.50 or more, a sharper absorption waveform can be easily obtained.

Further, in a case where the wavelength selective absorption filter contains two or more matrix resins, the fd value is calculated as follows.

$$fd=\Sigma(w_i \cdot fd_i)$$

Here, $w_i$ represents the mass fraction of the i-th matrix resin, and $fd_i$ represents the fd value of the i-th matrix resin.

—Term δd Corresponding to London Dispersion Force—

The term δd corresponding to the London dispersion force refers to δd obtained for the Amorphous Polymers described in the column "2) Method of Hoy (1985, 1989)" on pages 214 to 220 of the document "Properties of Polymers 3rd, ELSEVIER, (1990)", and is calculated according to the description in the column of the document.

—Term δp Corresponding to Dipole-Dipole Force—

The term δp corresponding to the dipole-dipole force refers to δp obtained for Amorphous Polymers described in the column "2) Method of Hoy (1985, 1989)" on pages 214 to 220 of the document "Properties of Polymers 3rd, ELSEVIER, (1990)", and is calculated according to the description in the column of the document.

—Term δh Corresponding to Hydrogen Bonding Force—

The term δh corresponding to the hydrogen bonding force refers to δh obtained for the Amorphous Polymers described in the column "2) Method of Hoy (1985, 1989)" on pages 214 to 220 of the document "Properties of Polymers 3rd, ELSEVIER, (1990)", and is calculated according to the description in the column of the document.

In addition, in a case where the matrix resin is a resin exhibiting a certain hydrophobicity, the moisture content of the wavelength selective absorption filter according to the embodiment of the present invention can be set to a low moisture content, for example, 0.5% or lower, and the light resistance of the wavelength selective absorption filter according to the embodiment of the present invention is improved, which is preferable.

The resin may contain any conventional component in addition to a polymer. However, the fd of the matrix resin is a calculated value for the polymer constituting the matrix resin.

From the viewpoint that the association inhibitor functions more effectively, preferred examples of the matrix resin include a polystyrene resin and a cyclic polyolefin resin, where a polystyrene resin is more preferable. In general, the fd value of the polystyrene resin is 0.45 to 0.60, and the fd value of the cyclic polyolefin resin is 0.45 to 0.70. As described above, it is preferable to use the resin having an fd value of 0.50 or more.

Further, for example, in addition to these preferable resins, it is also preferable to use a resin component, that imparts functionality to the wavelength selective absorption filter, such as an extensible resin component and a peelability control resin component, which will be described later. That is, in the present invention, the matrix resin is used in the meaning of including the extensible resin component and the peelability control resin component in addition to the above-described resins.

It is preferable that the matrix resin includes a polystyrene resin terms of sharpening the absorption waveform of the coloring agent.

(Polystyrene Resin)

The polystyrene contained in the polystyrene resin means a polymer containing a styrene component. The polystyrene preferably contains 50% by mass or more of the styrene component. The wavelength selective absorption filter according to the embodiment of the present invention may contain one kind of polystyrene or two or more kinds thereof. Here, the styrene component is a structural unit derived from a monomer having a styrene skeleton in the structure thereof.

The polystyrene more preferably contains 70% by mass or more of the styrene component, and still more preferably 85% by mass or more of the styrene component, in terms of controlling the photo-elastic coefficient and the hygroscopicity to values in ranges preferable for the wavelength selective absorption filter. It is also preferable that the polystyrene is composed of only a styrene component.

Among polystyrenes, examples of the polystyrene composed of only the styrene component include a homopolymer of a styrene compound and a copolymer of two or more kinds of styrene compounds. Here, the styrene compound is a compound having a styrene skeleton in the structure thereof and is meant to include, in addition to styrene, a compound in which a substituent is introduced within a range where an ethylenically unsaturated bond of styrene can act as a reactive (polymerizable) group.

Specific examples of the styrene compound include the following styrenes: alkylstyrene such as α-methylstyrene, o-methylstyrene, m-methylstyrene, p-methylstyrene, 3,5-dimethylstyrene, 2,4-dimethylstyrene, o-ethylstyrene, p-ethylstyrene, and tert-butyl styrene; and substituted styrene having a hydroxyl group, an alkoxy group, a carboxy group, or a halogen atom introduced into the benzene nucleus of styrene, such as hydroxystyrene, tert-butoxy styrene, vinyl benzoic acid, o-chlorostyrene, and p-chlorostyrene. Among these, the polystyrene is preferably a homopolymer of styrene (that is, polystyrene) from the viewpoints of availability and material cost.

The constitutional component other than the styrene component that may be contained in the polystyrene is not particularly limited. That is, the polystyrene may be a styrene-diene copolymer, a styrene-polymerizable unsaturated carboxylic acid ester copolymer, or the like. In addition, it is also possible to use a mixture of polystyrene and synthetic rubber (for example, polybutadiene and polyisoprene). Further, high impact polystyrene (HIPS) obtained by subjecting styrene to graft polymerization with synthetic rubber is also preferable. Further, a polystyrene obtained by dispersing a rubber-like elastic body in a continuous phase of a polymer including a styrene component (for example, a copolymer of a styrene component and a (meth)acrylate ester component), and subjecting the copolymer to graft polymerization with a rubber-like elastic body (referred to as graft type high impact polystyrene "graft HIPS") is also preferable. Furthermore, a so-called styrene-based elastomer can also be suitably used.

In addition, the polystyrene may be hydrogenated (may be a hydrogenated polystyrene). The hydrogenated polystyrene is not particularly limited, and it is preferably a hydrogenated styrene-diene-based copolymer such as a hydrogenated styrene-butadiene-styrene block copolymer (SEBS) obtained by hydrogenating a styrene-butadiene-styrene block copolymer (SBS) or hydrogenated styrene-isoprene-styrene block copolymer (SEPS) obtained by hydrogenating a styrene-isoprene-styrene block copolymer (SIS). Only one of these hydrogenated polystyrenes may be used, or two or more thereof may be used.

In addition, the polystyrene may be modified polystyrene. The modified polystyrene is not particularly limited, and examples thereof include polystyrene having a reactive group such as a polar group introduced therein. Specific examples thereof preferably include acid-modified polystyrene such as maleic acid-modified and epoxy-modified polystyrene.

As the polystyrene, a plurality of kinds of polystyrene having different compositions, molecular weights, and the like may be used in combination.

The polystyrene-based resin can be obtained using a conventional method such as anion, bulk, suspension, emulsification, or a solution polymerization method. In addition, in the polystyrene, at least a part of the unsaturated double bond of the benzene ring of the conjugated diene and the styrene monomer may be hydrogenated. The hydrogenation rate can be measured by a nuclear magnetic resonance apparatus (NMR).

As the polystyrene resin, a commercially available product may be used, and examples thereof include "CLEAREN 530L" and "CLEAREN 730L" manufactured by Denki Kagaku Kogyo Kabushiki Kaisha, "TUFPRENE 126S" and "ASAPRENE T411" manufactured by Asahi Kasei Corporation, "KRATON D1102A", "KRATON D1116A" manufactured by Kraton Polymers Japan Ltd., "STYROLUX S" and "STYROLUX T" manufactured by Styrolution Group, "ASAFLEX 840" and "ASAFLEX 860" manufactured by Asahi Kasei Chemicals Corporation (all are SBS), "679", "HF77", and "SGP-10" manufactured by PS Japan Corporation, "DIC STYRENE XC-515" and "DIC STYRENE XC-535" manufactured by DIC Corporation (all are GPPS), "475D", "H0103", and "HT478" manufactured by PS Japan Corporation, and "DIC STYRENE GH-8300-5" manufactured by DIC Corporation (all are HIPS). Examples of the hydrogenated polystyrene-based resin include "TUFTEC H series" manufactured by Asahi Kasei Chemicals Corporation, "KRATON G series" manufactured by Shell Japan Ltd. (all are SEBS), "DYNARON" manufactured by JSR Corporation (hydrogenated styrene-butadiene random copolymer), and "SEPTON" manufactured by Kuraray Co., Ltd. (SEPS). Examples of the modified polystyrene-based resin include "TUFTEC M series" manufactured by Asahi Kasei Chemicals Corporation, "EPOFRIEND" manufactured by Daicel Corporation, "Polar Group Modified DYNARON" manufactured by JSR Corporation, and "RESEDA" manufactured by ToaGosei Co., Ltd.

The wavelength selective absorption filter according to the embodiment of the present invention preferably contains a polyphenylene ether resin in addition to the polystyrene resin. By containing the polystyrene resin and the polyphenylene ether resin together, the toughness of the wavelength selective absorption filter can be improved, and the occurrence of defects such as cracks can be suppressed even in a harsh environment such as high temperature and high humidity.

As the polyphenylene ether resin, ZYLON S201A, ZYLON S202A, ZYLON S203A (all of which are product names), and the like, manufactured by Asahi Kasei Corporation, can be preferably used. In addition, a resin which the polystyrene resin and the polyphenylene ether resin are mixed in advance may also be used. As the mixed resin of the polystyrene resin and the polyphenylene ether resin, for example, ZYLON 1002H, ZYLON 1000H, ZYLON 600H, ZYLON 500H, ZYLON 400H, ZYLON 300H, ZYLON 200H (all of which are product names), and the like manufactured by Asahi Kasei Corporation can be preferably used.

In a case where the polystyrene resin and the polyphenylene ether resin are used in combination in the wavelength selective absorption filter according to the embodiment of the present invention, the mass ratio of both resins is preferably 99/1 to 50/50, more preferably 98/2 to 60/40, and still more preferably 95/5 to 70/30, in terms of the polystyrene resin/polyphenylene ether resin. In a case where the formulation ratio of the polyphenylene ether resin is set within the above-described preferred range, the wavelength selective absorption filter can have sufficient toughness, and a solvent can be properly volatilized in a case where a film formation is carried out with a solution.

(Cyclic Polyolefin Resin)

The cyclic olefin compound that forms the cyclic polyolefin contained in the cyclic polyolefin resin is not particularly limited as long as the compound has a ring structure including a carbon-carbon double bond, and examples thereof include a norbornene compound and a monocyclic olefin compound, a cyclic conjugated diene compound, and a vinyl alicyclic hydrocarbon compound, which are not the norbornene compound.

Examples of the cyclic polyolefin include (1) polymers including a structural unit derived from a norbornene compound; (2) polymers including a structural unit derived from a monocyclic olefin compound other than the norbornene compound; (3) polymers including a structural unit derived from a cyclic conjugated diene compound; (4) polymers including a structural unit derived from a vinyl alicyclic hydrocarbon compound; and hydrides of polymers including a structural unit derived from each of the compounds (1) to (4).

In the present invention, ring-opening polymers of the respective compounds are included in the polymers including a structural unit derived from a norbornene compound and the polymers including a structural unit derived from a monocyclic olefin compound.

The cyclic polyolefin is not particularly limited; however, it is preferably a polymer having a structural unit derived from a norbornene compound, which is represented by General Formula (A-II) or (A-III). The polymer having the structural unit represented by General Formula (A-II) is an addition polymer of a norbornene compound, and the polymer having the structural unit represented by General Formula (A-III) is a ring-opening polymer of a norbornene compound.

General Formula (A-II)

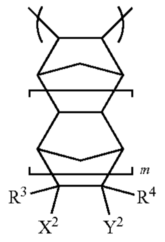

General Formula (A-III)

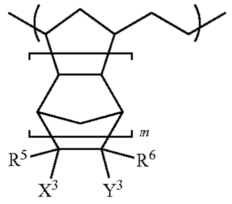

In General Formulae (A-II) and (A-III), m is an integer of 0 to 4 and preferably 0 or 1.

In General Formulae (A-II) and (A-III), $R^3$ to $R^6$ each independently represent a hydrogen atom or a hydrocarbon group having 1 to 10 carbon atoms.

The hydrocarbon group in General Formulae (A-I) to (A-III) is not particularly limited as long as the hydrocarbon group is a group consisting of a carbon atom and a hydrogen atom, and examples thereof include an alkyl group, an alkenyl group, an alkynyl group, and an aryl group (an aromatic hydrocarbon group). Among these, an alkyl group or an aryl group is preferable.

In General Formula (A-II) or (A-III), $X^2$ and $X^3$, and $Y^2$ and $Y^3$ each independently represent a hydrogen atom, a hydrocarbon group having 1 to 10 carbon atoms, a halogen atom, a hydrocarbon group having 1 to 10 carbon atoms, which is substituted with a halogen atom, $-(CH_2)_nCOOR^{11}$, $-(CH_2)_nOCOR^{12}$, $-(CH_2)_nNCO$, $-(CH_2)_nNO_2$, $-(CH_2)_nCN$, $-(CH_2)_nCONR^{13}R^{14}$, $-(CH_2)_nNR^{13}R^{14}$, $-(CH_2)_nOZ$ or $-(CH_2)_nW$, or $(-CO)_2O$ or $(-CO)_2NR^{15}$ which is formed by $X^2$ and $Y^2$ or $X^3$ and $Y^3$ being bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{16})_pD_{(3-p)}$ ($R^{16}$ represents a hydrocarbon group having 1 to 10 carbon atoms, D represents a halogen atom, $-OCOR^{17}$, or $-OR^{17}$ ($R^{17}$ represents a hydrocarbon group having 1 to 10 carbon atoms), and p is an integer of 0 to 3). n is an integer of 0 to 10, preferably 0 to 8, and more preferably 0 to 6.

In General Formulae (A-II) and (A-III), $R^3$ to $R^6$ are each preferably a hydrogen atom or $-CH_3$, and, in terms of moisture permeability, more preferably a hydrogen atom.

$X^2$ and $X^3$ are each preferably a hydrogen atom, $-CH_3$, or $-C_2H_5$ and more preferably a hydrogen atom in terms of moisture permeability.

$Y^2$ and $Y^3$ are each preferably a hydrogen atom, a halogen atom (particularly a chlorine atom), or $-(CH_2)_nCOOR^{11}$ (particularly $-COOCH_3$) and more preferably a hydrogen atom in terms of moisture permeability.

Other groups are appropriately selected.

The polymer having the structural unit represented by General Formula (A-II) or (A-III) may further include at least one or more structural units represented by General Formula (A-I).

General Formula (A-I)

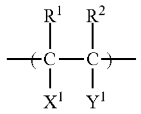

In General Formula (A-I), $R^1$ and $R^2$ each independently represent a hydrogen atom or a hydrocarbon group having 1 to 10 carbon atoms, and $X^1$ and $Y^1$ each independently represent a hydrogen atom, a hydrocarbon group having 1 to 10 carbon atoms, a halogen atom, a hydrocarbon group having 1 to 10 carbon atoms, which is substituted with a halogen atom, $-(CH_2)_nCOOR^{11}$, $-(CH_2)_nOCOR^{12}$, $-(CH_2)_nNCO$, $-(CH_2)_nNO_2$, $-(CH_2)_nCN$, $-(CH_2)_nCONR^{13}R^{14}$, $-(CH_2)_nNR^{13}R^{14}$, $-(CH_2)_nOZ$, $-(CH_2)_nW$, or $(-CO)_2O$ or $(-CO)_2NR^{15}$ which is formed by $X^1$ and $Y^1$ being bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{16})_pD_{(3-p)}$ ($R^{16}$ represents a hydrocarbon group having 1 to 10 carbon atoms, D represents a halogen atom, $-OCOR^{17}$, or $-OR^{17}$ ($R^{17}$ represents a hydrocarbon group having 1 to 10 carbon atoms), and p is an integer of 0 to 3). n is an integer of 0 to 10.

From the viewpoint of adhesiveness, the content of the structural unit derived from a norbornene compound in the cyclic polyolefin having the structural unit represented by General Formula (A-II) or (A-III) is preferably 90% by mass or less, more preferably 30% to 85% by mass, still more preferably 50% to 79% by mass, and most preferably 60% to 75% by mass with respect to the total mass of the cyclic polyolefin. Here, the proportion of the structural unit derived from a norbornene compound represents the average value in the cyclic polyolefin.

The addition (co)polymer of a norbornene compound is described in JP1998-7732A (JP-H10-7732A), JP2002-504184A, US2004/229157A1, and WO2004/070463A.

The polymer of a norbornene compound is obtained by the addition polymerization of norbornene compounds (for example, polycyclic unsaturated compounds of norbornene).

In addition, as the polymer of a norbornene compound, copolymers obtained by the addition copolymerization of, as necessary, a norbornene compound, olefin such as ethylene, propylene, and butene, conjugated diene such as butadiene and isoprene, unconjugated diene such as ethylidene norbornene, and an ethylenically unsaturated compound such as acrylonitrile, acrylic acid, methacrylic acid, maleic acid anhydride, acrylic acid ester, methacrylic acid ester, maleimide, vinyl acetate, and vinyl chloride are exemplified. Among these, a copolymer of a norbornene compound and ethylene is preferable.

Examples of the addition (co)polymers of a norbornene compound include APL8008T (Tg: 70° C.), APL6011T (Tg: 105° C.), APL6013T (Tg: 125° C.), and APL6015T (Tg: 145° C.), which are available from Mitsui Chemicals, Inc.

under a product name of APEL and have glass transition temperatures (Tg) different from each other. In addition, pellets such as TOPAS 8007, TOPAS 6013, and TOPAS 6015 are commercially available from Polyplastics Co., Ltd. Further, Appear 3000 is commercially available from Film Ferrania S. R. L.

As the polymer of a norbornene compound, a commercially available product can be used. For example, it is commercially available from JSR Corporation under a product name of Arton G or Arton F, and it is also commercially available from Zeon Corporation under a product name of Zeonor ZF14, ZF16, Zeonex 250, or Zeonex 280.

The hydride of a polymer of a norbornene compound can be synthesized by the addition polymerization or the metathesis ring-opening polymerization of a norbornene compound or the like and then the addition of hydrogen. The synthesis method is described in, for example, JP1989-240517A (JP-H1-240517A), JP1995-196736A (JP-H7-196736A), JP1985-26024A (JP-S60-26024A), JP1987-19801A (JP-S62-19801A), JP2003-159767A, and JP2004-309979A.

The molecular weight of the cyclic polyolefin is appropriately selected depending on the intended use, and it is a mass average molecular weight measured in terms of polyisoprene or polystyrene by the gel permeation chromatography of a cyclohexane solution (a toluene solution in a case where the polymer is not dissolved). In general, it is 5,000 to 500,000, preferably 8,000 to 200,000, and more preferably 10,000 to 100,000. A polymer having a molecular weight in the above-described range is capable of satisfying both the mechanical strength of a molded body and the molding workability of compacts at a high level in a well-balanced manner.

In the wavelength selective absorption filter according to the embodiment of the present invention, the content of the matrix resin is preferably 5% by mass or more, more preferably 20% by mass or more, still more preferably 50% by mass or more, and particularly preferably 60% by mass or more.

The content of the matrix resin in the wavelength selective absorption filter according to the embodiment of the present invention is generally 99.90% by mass or less, and preferably 99.85% by mass or less.

The cyclic polyolefin contained in the wavelength selective absorption filter according to the embodiment of the present invention may be two or more kinds, and polymers having different at least one of a compositional ratio or a molecular weight may be used in combination. In this case, the total content of the respective polymers is in the above range.

(Extensible Resin Component)

The wavelength selective absorption filter according to the embodiment of the present invention can appropriately select and contain a component exhibiting extensibility (also referred to as an extensible resin component) as a resin component. Specific examples thereof include an acrylonitrile-butadiene-styrene resin (an ABS resin), a styrene-butadiene resin (an SB resin), an isoprene resin, a butadiene resin, a polyether-urethane resin, and a silicone resin. Further, these resins may be further hydrogenated as appropriate.

As the extensible resin component, it is preferable to use an ABS resin or an SB resin, and it is more preferable to use an SB resin.

As the SB resin, for example, a commercially available one can be used. Examples of such commercially available products include TR2000, TR2003, and TR2250 (all, product name, manufactured by JSR Corporation); CLEAREN 210M, 220M, and 730V (all, product name, manufactured by Denka Corporation); ASAFLEX 800S, 805, 810, 825, 830, and 840 (all, product name, manufactured by Asahi Kasei Corporation); and EPOREX SB2400, SB2610, and SB2710 (all, product name, Sumitomo Chemical Co., Ltd.).

The extensible resin component is preferably an extensible resin component having a breaking elongation of 10% or more and more preferably an extensible resin component having a breaking elongation of 20% or more, in a case where a sample having a form with a thickness of 30 μm and a width of 10 mm is produced by using the extensible resin component alone and the breaking elongation at 25° C. is measured in accordance with JIS 7127.

(Peelability Control Resin Component)

The wavelength selective absorption filter according to the embodiment of the present invention can contain, as a resin component, a component that controls the peelability (a peelability control resin component) in a case of being produced according to a method including a step of peeling a wavelength selective absorption filter from a release film, among the manufacturing methods for the wavelength selective absorption filter according to the embodiment of the present invention described later, which is preferable. In a case of controlling the peelability of the wavelength selective absorption filter from the release film, it is possible to prevent a peeling mark from being left on the wavelength selective absorption filter after peeling, and it is possible to cope with various processing speeds in the peeling step. As a result, a preferred effect can be obtained for improving the quality and productivity of the wavelength selective absorption filter.

The peelability control resin component is not particularly limited and can be appropriately selected depending on the kind of the release film. As will be described later, in a case where a polyester-based polymer film is used as the release film, the peelability control resin component is suitably, for example, a polyester resin (also referred to as a polyester-based additive), and in a case where a cellulose-based polymer film is used as the release film, the peelability control resin component is suitably, for example, a polystyrene-based elastomer.

In addition, in a case where a polyester-based polymer film is used as the release film, for example, a styrene-based elastomer is also suitably used as the peelability control resin component.

The polyester-based additive can be obtained by a conventional method such as a dehydration condensation reaction of a polyhydric basic acid and a polyhydric alcohol and an addition of a dibasic anhydride to a polyhydric alcohol and a dehydration condensation reaction, and a polycondensation ester formed from a dibasic acid and a diol is preferable.

The mass average molecular weight (Mw) of the polyester-based additive is preferably 500 to 50,000, more preferably 750 to 40,000, and still more preferably 2,000 to 30,000.

In a case where the mass average molecular weight of the polyester-based additive is equal to or larger than the above-described preferred lower limit value, it is preferable from the viewpoint of brittleness and moisture-heat resistance, and in a case where the mass average molecular weight thereof is equal to or smaller than the above-described preferred upper limit value, it is preferable from the viewpoint of compatibility with the resin.

The mass average molecular weight of the polyester-based additive is a value of the mass average molecular weight (Mw) in terms of standard polystyrene measured under the following conditions. The molecular weight distribution (Mw/Mn) can also be measured under the same conditions. Mn is a number average molecular weight in terms of standard polystyrene.

GPC: Gel permeation chromatograph device (HLC-8220GPC manufactured by Tosoh Corporation,
column: Guard column HXL-H manufactured by Tosoh Corporation, where TSK gel G7000HXL, TSK gel GMHXL 2 pieces, and TSK gel G2000HXL are connected in sequence,
eluant: tetrahydrofuran,
flow velocity: 1 mL/min,
sample concentration: 0.7% to 0.8% by mass,
sample injection volume: 70 μL,
measurement temperature: 40° C.,
detector: differential refractometer (RI) meter (40° C.), and
standard substance: TSK standard polystyrene manufactured by Tosoh Corporation)

Preferred examples of the dibasic acid component constituting the polyester-based additive include dicarboxylic acid.

Examples of the dicarboxylic acid include an aliphatic dicarboxylic acid and an aromatic dicarboxylic acid. An aromatic dicarboxylic acid or a mixture of an aromatic dicarboxylic acid and an aliphatic dicarboxylic acid can be preferably used.

Among the aromatic dicarboxylic acids, an aromatic dicarboxylic acid having 8 to 20 carbon atoms is preferable, and an aromatic dicarboxylic acid having 8 to 14 carbon atoms is more preferable. Specifically, preferred examples thereof include at least one of phthalic acid, isophthalic acid, or terephthalic acid.

Among the aliphatic dicarboxylic acids, an aliphatic dicarboxylic acid having 3 to 8 carbon atoms is preferable, and an aliphatic dicarboxylic acid having 4 to 6 carbon atoms is more preferable. Specifically, preferred examples thereof include at least one of succinic acid, maleic acid, adipic acid, or glutaric acid, and at least one of succinic acid or adipic acid is more preferable.

Examples of the diol component constituting the polyester-based additive include an aliphatic diol and an aromatic diol, and aliphatic diol is preferable.

Among the aliphatic diols, an aliphatic diol having 2 to 4 carbon atoms is preferable, and an aliphatic diol having 2 to 3 carbon atoms is more preferable.

Examples of the aliphatic diol include ethylene glycol, diethylene glycol, 1,2-propylene glycol, 1,3-propylene glycol, 1,3-butylene glycol, and 1,4-butylene glycol. These aliphatic diols can be used alone, or two or more kinds thereof can be used in combination.

The polyester-based additive is particularly preferably a compound obtained by fusing at least one of phthalic acid, isophthalic acid, or terephthalic acid with an aliphatic diol.

The terminal of the polyester-based additive may be sealed by reacting with a monocarboxylic acid. The monocarboxylic acid that is used for sealing is preferably an aliphatic monocarboxylic acid. Preferred examples thereof include acetic acid, propionic acid, butanoic acid, benzoic acid, and a derivative thereof, where acetic acid or propionic acid is more preferable and acetic acid is still more preferable.

Examples of the commercially available polyester-based additive include ester-based resin polyesters manufactured by Nippon Synthetic Chemical Industry Co., Ltd. (for example, LP050, TP290, LP035, LP033, TP217, and TP220) and ester-based resins Byron manufactured by Toyobo Co., Ltd. (for example, Byron 245, Byron GK890, Byron 103, Byron 200, and Byron 550. GK880).

The polystyrene-based elastomer is not particularly limited and can be appropriately selected depending on the intended purpose. Examples thereof include a styrene-butadiene-styrene block copolymer (SBS), a styrene-isoprene-styrene block copolymer (SIS), a polystyrene-poly(ethylene-propylene) diblock copolymer (SEP), a polystyrene-poly(ethylene)-propylene)-polystyrene triblock copolymer (SEPS) (a hydrogenated type of SIS), a polystyrene-poly(ethylene-butylene)-polystyrene triblock copolymer (SEBS) (a hydrogenated type of SBS), and a polystyrene-poly(ethylene-ethylene-propylene)-polystyrene triblock copolymer (SEEPS), where a polystyrene-poly(ethylene-propylene) diblock copolymer, a polystyrene-poly(ethylene-propylene)-polystyrene triblock copolymer, a polystyrene-poly(ethylene-butylene)-polystyrene triblock copolymer, or a polystyrene-poly(ethylene-ethylene-propylene)-polystyrene triblock copolymer is preferable.

The content of the repeating unit derived from styrene, in the polystyrene-based elastomer, is preferably 90% by mass or less, more preferably 55% by mass or less, still more preferably 48% by mass or less, even still more preferably 35% by mass or less, and even further still more preferably 33% by mass or less. It suffices that the lower limit value of the proportion of the repeating unit derived from styrene is more than 0% by mass, and it can be also set to 10% by mass or more.

The polystyrene-based elastomer is preferably a block copolymer of styrene and another monomer, more preferably a block copolymer in which one end or both ends are styrene blocks, and still more preferably a block copolymer in which both ends are styrene blocks. In a case where both ends of the polystyrene-based elastomer are styrene blocks (repeating units derived from styrene), the heat resistance tends to be further improved. This is due to the presence of a repeating unit derived from styrene having high heat resistance at the terminal. In particular, in a case where the block portion of the repeating unit derived from styrene is a reactive polystyrene-based hard block, the heat resistance tends to be more excellent, which is more preferable from the viewpoint of solubility in a solvent.

In addition, in a case where the polystyrene-based elastomer is a hydrogenated additive, the stability with respect to heat is improved, and a change in quality such as decomposition or polymerization is difficult to occur. Furthermore, it is more preferable from the viewpoint of solubility in a solvent.

From the viewpoint of peelability, the amount of unsaturated double bonds of the polystyrene-based elastomer is preferably less than 15 mmol, more preferably less than 5 mmol, and still more preferably less than 0.5 mmol per 1 g of the polystyrene-based elastomer. It is noted that the amount of unsaturated double bonds, referred to here, does not include the amount of unsaturated double bonds in the benzene ring derived from styrene. The amount of unsaturated double bonds can be calculated by a nuclear magnetic resonance (NMR) measurement.

It is noted that in the present invention, the "repeating unit derived from styrene" is a structural unit derived from styrene, which is contained in a polymer in a case of polymerizing styrene or a styrene derivative, and it may have a substituent. Examples of the styrene derivative include α-methylstyrene, 3-methylstyrene, 4-propylstyrene, and 4-cyclohexylstyrene. Examples of the substituent include an alkyl group having 1 to 5 carbon atoms, an alkoxy group having 1 to 5 carbon atoms, an alkoxyalkyl group having 2 to 5 carbon atoms, an acetoxy group, and a carboxy group.

As a commercially available product of the polystyrene-based elastomer, it is possible to use, for example, the polystyrene-based elastomer described in paragraph [0027] of JP2018-35279A.

The content of the peelability control resin component in the wavelength selective absorption filter according to the embodiment of the present invention is preferably 0.05% by mass or more, and more preferably 0.1% by mass or more in the matrix resin. In addition, the upper limit value thereof is preferably 25% by mass or less, more preferably 20% by mass or less, and still more preferably 15% by mass or less. From the viewpoint of obtaining proper adhesiveness, the above-described preferred range is preferable.

<Association Inhibitor>

The wavelength selective absorption filter according to the embodiment of the present invention contains a compound (also referred to as an association inhibitor in the present invention) having a polar group.

In the present invention, the association inhibitor has at least one polar group of a carboxylic acid ester bond, a carboxylic acid amide bond, a sulfonic acid amide bond, a urethane bond, or a sulfonyl bond ($>S(=O)_2$). Each of these polar groups is contained in a compound as a divalent substituent (a bond).

The association inhibitor is a compound that has a function of interacting with the above-described dye, thereby suppressing or preventing the association of dye molecules with each other in the wavelength selective absorption filter according to the embodiment of the present invention, sharpening an absorption waveform of the dye A or D contained in the wavelength selective absorption filter, and improving light resistance.

Unlike the dye described above, the association inhibitor is a compound that does not substantially exhibit a color in a state of being contained in the wavelength selective absorption filter according to the embodiment of the present invention.

In addition, in the resin in the wavelength selective absorption filter according to the embodiment of the present invention, the association inhibitor is a compound that exhibits a function of suppressing the association of dye molecules with each other regarding the dye A or D dispersed or dissolved, and it is different from the above-described resin. That is, the molecular weight of the association inhibitor is 1,000 or less, and it is preferably 100 to 1000, more preferably 200 to 1,000, and still more preferably 200 to 900.

In addition, the association inhibitor is not a compound that exhibits a function as an antifading agent, which will be described later.

In addition, the association inhibitor preferably does not have an alkyl fluorinated group from the viewpoint of uniform dispersion in the filter.

It suffices that the association inhibitor has at least any one among a carboxylic acid ester bond, a carboxylic acid amide bond, a sulfonic acid amide bond, a urethane bond, or a sulfonyl bond, and the association inhibitor may have two or more among them. The upper limit value of the total number of polar groups is not particularly limited; however, it is preferably, for example, 10 or less and more preferably 6 or less.

The kind of the polar group contained in the association inhibitor is not particularly limited, and it may be one kind or may be two or more kinds; however, it is preferably one kind or two kinds, where one kind is more preferable. It is noted that The kinds of polar groups are each counted by regarding a polar group classified into a carboxylic acid ester bond as one kind, regarding a polar group classified into a carboxylic acid amide bond as one kind, regarding a polar group classified into a sulfonic acid amide bond as one kind, regarding a polar group classified into a urethane bond as one kind, and regarding a polar group classified into a sulfonyl bond as one kind.

The association inhibitor preferably has a carboxylic acid ester bond or a carboxylic acid amide bond.

The association inhibitor is preferably a compound represented by any of General Formulae (2) to (14) and (18). It is noted that in a case where a compound has two or more polar groups among a carboxylic acid ester bond, a carboxylic acid amide bond, a sulfonic acid amide bond, a urethane bond, and a sulfonyl bond, the two or more polar groups shall be classified into each formula based on the polar group having the highest priority ranking, which is contained in the compound. Here, the priority ranking of the polar groups is as follows: in order from the highest priority ranking, a carboxylic acid amide bond>a carboxylic acid ester bond>a sulfonic acid amide bond>a sulfonyl bond>a urethane bond. For example, in a case of containing a carboxylic acid amide bond and a sulfonic acid amide bond, the classification is carried out based on the carboxylic acid amide bond which is a polar group having the highest priority ranking.

The compound represented by General Formula (2) or (3) is a compound having a structure in which at least one of a carboxylic acid ester bond or a carboxylic acid amide bond is directly bonded to a ring structure. However, in a case where the compound also corresponds to a compound represented by General Formula (18), it is classified into a compound represented by General Formula (18).

The compound represented by any of General Formulae (4) to (12) described below is a compound having at least one of a carboxylic acid ester bond, a carboxylic acid amide bond, or a urethane bond. However, in a case where the compound also corresponds to a compound represented by General Formula (2) or (3), it is classified into a compound represented by General Formula (2) or (3).

The compound represented by General Formula (13) described later is a compound having a sulfonic acid amide bond.

The compound represented by General Formula (14) described later is a compound having a sulfonyl bond.

The compound represented by General Formula (18) described later is a compound having a carboxylic acid amide bond.

Hereinafter, each of the general formulae will be described in order.

(Compound Represented by General Formula (2) or (3) and Compound Represented by any One of General Formulae (4) to (12))

General Formula (2)

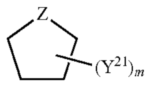

General Formula (3)

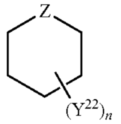

In General Formulae (2) and (3), Z represents a carbon atom, an oxygen atom, a sulfur atom, or >$NR^{25}$, where $R^{25}$ represents a hydrogen atom or an alkyl group. $Y^{21}$ and $Y^{22}$ represent an acyloxy group, an alkoxycarbonyl group, an amide group, or a carbamoyl group. m is an integer of 1 to 5, and n is an integer of 1 to 6.

Z represents a carbon atom, an oxygen atom, a sulfur atom, or >$NR^{25}$.

The 5- or 6-membered ring having Z as a ring-constituting atom may have a substituent. The substituent which may be contained in the 5- or 6-membered ring having Z as a ring-constituting atom is not particularly limited, and examples thereof include an oxo group (═O) and a thioxo group (═S).

In a case where the 5- or 6-membered ring having Z as a ring-constituting atom has a plurality of substituents, adjacent substituents may be bonded to each other to form a ring. The ring that is formed by bonding adjacent substituents to each other may be an aromatic ring or a non-aromatic ring.

Examples of the 5- or 6-membered ring having Z as a ring-constituting atom include tetrahydrofuran, tetrahydropyrane, tetrahydrothiophene, thiane, pyrrolidine, and piperidine. In addition, in a case where the 5- or 6-membered ring having Z as a ring-constituting atom is fused, examples of this fused ring structure include indoline, isoindoline, chroman, and isochroman.

In addition, the 5- or 6-membered ring having Z as a ring-constituting atom may be a lactone structure or a lactam structure, that is, a cyclic ester or cyclic amide structure in which a ring-constituting carbon atom bonded to Z is substituted with an oxo group (═O). Examples of such a cyclic ester or cyclic amide structure include lactones such as tetrahydro-2-furanone (also referred to as 5-pentanolide) and tetrahydro-2-pyrone (also referred to as 6-hexanolide) and lactams such as 4-butane lactam (also referred to as 2-pyrrolidone) and 5-pentane lactam (also referred to as 2-piperidone).

$R^{25}$ represents a hydrogen atom or an alkyl group.

The alkyl group that can be adopted as $R^{25}$ may be either chain-like, branched, or cyclic, and it preferably has 1 to 20 carbon atoms, more preferably has 1 to 16 carbon atoms, and still more preferably has 1 to 12 carbon atoms.

Examples of the alkyl group that can be adopted as $R^{25}$ include methyl, ethyl, n-propyl, isopropyl, n-butyl, isobutyl, sec-butyl, t-butyl, n-pentyl, t-amyl, n-hexyl, n-octyl, decyl, dodecyl, eicosyl, 2-ethylhexyl, cyclopentyl, cyclohexyl, cycloheptyl, 2,6-dimethylcyclohexyl, 4-t-butylcyclohexyl, cyclopentyl, 1-adamantyl, 2-adamantyl, and bicyclo[2.2.2]octane-3-yl.

$Y^{21}$ and $Y^{22}$ represent an acyloxy group, an alkoxycarbonyl group, an amide group, or a carbamoyl group.

The acyloxy group that can be adopted as $Y^{21}$ or $Y^{22}$ preferably has 1 to 20 carbon atoms, more preferably has 1 to 16 carbon atoms, and still more preferably has 1 to 12 carbon atoms. Examples thereof include acetoxy, ethylcarbonyloxy, propylcarbonyloxy, n-butylcarbonyloxy, iso-butylcarbonyloxy, t-butylcarbonyloxy, sec-butylcarbonyloxy, n-pentylcarbonyloxy, t-amylcarbonyloxy, n-hexylcarbonyloxy, cyclohexylcarbonyloxy, 1-ethylpentylcarbonyloxy, n-heptylcarbonyloxy, n-nonylcarbonyloxy, n-undecylcarbonyloxy, benzylcarbonyloxy, 1-naphthalenecarbonyloxy, 2-naphthalenecarbonyloxy, and 1-adamantanecarbonyloxy.

The alkoxycarbonyl group that can be adopted as $Y^{21}$ or $Y^{22}$ preferably has 1 to 20 carbon atoms, more preferably has 1 to 16 carbon atoms, and still more preferably has 1 to 12 carbon atoms. Examples thereof include methoxycarbonyl, ethoxycarbonyl, n-propyloxycarbonyl, isopropyloxycarbonyl, n-butoxycarbonyl, t-butoxycarbonyl, iso-butyloxycarbonyl, sec-butyloxycarbonyl, n-pentyloxycarbonyl, t-amyloxycarbonyl, n-hexyloxycarbonyl, cyclohexyloxycarbonyl, 2-ethylhexyloxycarbonyl, 1-ethylpropyloxycarbonyl, n-octyloxycarbonyl, 3,7-dimethyl-3-octyloxycarbonyl, 3,5,5-trimethylhexyloxycarbonyl, 4-t-butylcyclohexyloxycarbonyl, 2,4-dimethylpentyl-3-oxycarbonyl, 1-adamantaneoxycarbonyl, 2-adamantaneoxycarbonyl, dicyclopentadienyloxycarbonyl, n-decyloxycarbonyl, n-dodecyloxycarbonyl, n-tetradecyloxycarbonyl, and n-hexadecyloxycarbonyl.

The amide group (acylamino group) that can be adopted as $Y^{21}$ or $Y^{22}$ preferably has 1 to 20 carbon atoms, more preferably has 1 to 16 carbon atoms, and still more preferably has 1 to 12 carbon atoms. Examples thereof include acetamide, ethylcarboxamide, n-propylcarboxamide, isopropylcarboxamide, n-butylcarboxamide, t-butylcarboxamide, iso-butylcarboxamide, sec-butylcarboxamide, n-pentylcarboxamide, t-amylcarboxamide, n-hexylcarboxamide, cyclohexylcarboxamide, 1-ethylpentylcarboxamide, 1-ethylpropylcarboxamide, n-heptylcarboxamide, n-octylcarboxamide, 1-adamantanecarboxamide, 2-adamantanecarboxamide, n-nonylcarboxamide, n-dodecylcarboxamide, n-pentacarboxamide, and n-hexadecylcarboxamide.

The carbamoyl group that can be adopted as $Y^{21}$ or $Y^{22}$ preferably has 1 to 20 carbon atoms, more preferably has 1 to 16 carbon atoms, and still more preferably has 1 to 12 carbon atoms. Examples thereof include methylcarbamoyl, dimethylcarbamoyl, ethylcarbamoyl, diethylcarbamoyl, n-propylcarbamoyl, isopropylcarbamoyl, n-butylcarbamoyl, t-butylcarbamoyl, iso-butylcarbamoyl, sec-butylcarbamoyl, n-pentylcarbamoyl, t-amylcarbamoyl, n-hexylcarbamoyl, cyclohexylcarbamoyl, 2-ethylhexylcarbamoyl, 2-ethylbutylcarbamoyl, t-octylcarbamoyl, n-heptylcarbamoyl, n-octylcarbamoyl, 1-adamantanecarbamoyl, 2-adamantanecarbamoyl, n-decylcarbamoyl, n-dodecylcarbamoyl, n-tetradecylcarbamoyl, and n-hexadecylcarbamoyl.

In a case where two or more $Y^{21}$'s or two or more $Y^{22}$'s are contained, adjacent $Y^{21}$'s may be linked to each other to form a ring, or adjacent $Y^{22}$'s may be linked to each other to form a ring.

General Formula (4)

$Y^{31}—L^{31}—Y^{32}$

General Formula (5)

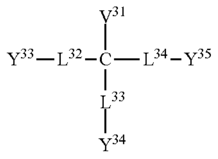

General Formula (6)

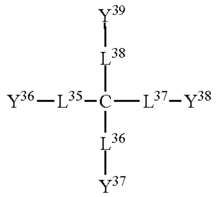

General Formula (7)

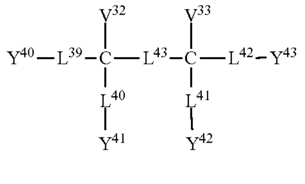

-continued

General Formula (8)

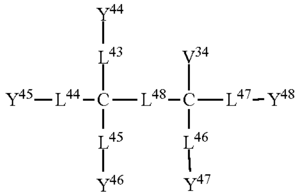

General Formula (9)

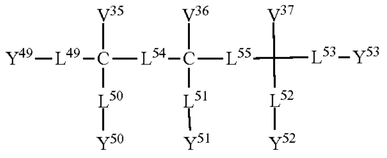

General Formula (10)

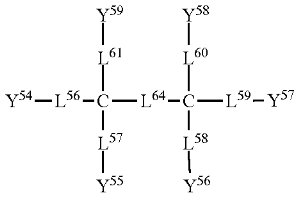

General Formula (11)

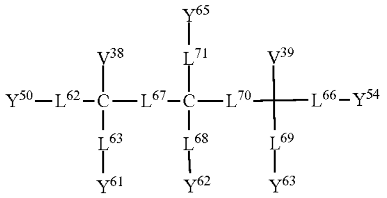

General Formula (12)

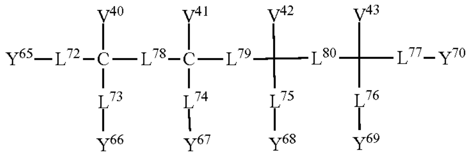

In General Formulae (4) to (12), $Y^{31}$ to $Y^{70}$ represent an acyloxy group, an alkoxycarbonyl group, an amide group, a carbamoyl group, or a carbamoyloxy group, and $V^{31}$ to $V^{43}$ represent a hydrogen atom or an aliphatic group. $L^{31}$ to $L^{64}$ and $L^{66}$ to $L^{80}$ represent a divalent saturated linking group having 0 to 40 atoms and 0 to 20 carbon atoms. Here, the fact that $L^{31}$ to $L^{64}$ and $L^{66}$ to $L^{80}$ have zero carbon atoms means that the groups located at both ends of each of the linking groups represented by $L^{31}$ to $L^{64}$ and $L^{66}$ to $L^{80}$ are directly bonded by a single bond.

$Y^{31}$ to $Y^{70}$ represent an acyloxy group, an alkoxycarbonyl group, an amide group, a carbamoyl group, or a carbamoyloxy group.

As the acyloxy group, the alkoxycarbonyl group, the amide group, and the carbamoyl group, which can be adopted as $Y^{31}$ to $Y^{70}$, the descriptions regarding the acyloxy group, the alkoxycarbonyl group, the amide group, and the carbamoyl group, which can be adopted as $Y^{21}$ or $Y^{22}$ in General Formula (2) or (3), can be applied respectively.

As the carbamoyl group moiety in the carbamoyloxy group that can be adopted as $Y^{31}$ to $Y^{70}$, the description regarding the carbamoyl group that can be adopted as $Y^{21}$ or $Y^{22}$ in General Formula (2) or (3) can be applied.

$V^{31}$ to $V^{43}$ represent a hydrogen atom or an aliphatic group.

The aliphatic group that can be adopted as $V^{31}$ to $V^{43}$ preferably has 1 to 20 carbon atoms, more preferably has 1 to 16 carbon atoms, and still more preferably has 1 to 12 carbon atoms.

Here, the aliphatic group is preferably an aliphatic hydrocarbon group, and it may be either chain-like, branched, or cyclic. More preferably, it is an alkyl group, an alkenyl group, or an alkynyl group.

Examples of the alkyl group include methyl, ethyl, n-propyl, isopropyl, n-butyl, isobutyl, sec-butyl, t-butyl, n-pentyl, t-amyl, n-hexyl, n-octyl, decyl, dodecyl, eicosyl, 2-ethylhexyl, cyclopentyl, cyclohexyl, cycloheptyl, 2,6-dimethylcyclohexyl, 4-t-butylcyclohexyl, cyclopentyl, 1-adamantyl, 2-adamantyl, and bicyclo[2.2.2]octane-3-yl, examples of the alkenyl group include vinyl, allyl, prenyl, geranyl, oleyl, 2-cyclopentene-1-yl, and 2-cyclohexene-1-yl, and examples of the alkynyl group include ethynyl and propargyl.

$L^{31}$ to $L^{64}$ and $L^{66}$ to $L^{80}$ represent a divalent saturated linking group having 0 to 40 atoms and 0 to 20 carbon atoms. Here, the fact that $L^{31}$ to $L^{64}$ and $L^{66}$ to $L^{80}$ have zero carbon atoms means that the groups located at both ends of each of the linking groups represented by $L^{31}$ to $L^{80}$ are directly bonded by a single bond.

Preferred examples of the divalent saturated linking group that can be adopted as $L^{31}$ to $L^{64}$ and $L^{66}$ to $L^{80}$ include an alkylene group (for example, methylene, ethylene, propylene, trimethylene, tetramethylene, pentamethylene, hexamethylene, methyl ethylene, or ethyl ethylene, provided that a cycloalkylene group is excluded), a cyclic divalent group (for example, cis-1,4-cyclohexylene, trans-1,4-cyclohexylene, 1,3-cyclopentylidene), an ether bond (—O—), a thioether bond (—S—), an ester bond (—C(=O)O— or —CO(=O)—), an amide bond (—C(=O)NH— or —NHC(=O)—), a sulfinyl bond (—S(=O)—), a sulfonyl bond ($—S(=O)_2—$), a sulfonamide bond ($—NHS(=O)_2—$ or $—S(=O)_2NH—$), a ureylene bond (—NHC(=O)NH—), and a thioureylene bond (—NHS(=O)NH—). Two or more of these divalent groups may be bonded to each other to form a divalent composite group, and Examples of the composite substituent include-$(CH_2)_2O(CH_2)_2$—, —$(CH_2)_2O(CH_2)_2O(CH_2)$—, —$(CH_2)_2S(CH_2)_2$—, and —$(CH_2)_2O_2C(CH_2)_2$—.

Preferred examples of the compound represented by any of General Formulae (4) to (12) include citric acid esters (for example, triethyl O-acetylcitrate, tributyl O-acetylcitrate, acetyltriethyl citrate, acetyltributyl citrate, and O-acetylcitric acid tri(ethyloxycarbonylmethylene) ester), oleic acid esters (for example, ethyl oleate, butyl oleate, 2-ethylhexyl oleate, phenyl oleate, cyclohexyl oleate, and octyl oleate), ricinoleic acid ester (for example, methyl acetyl ricinolate, etc.), sebacic acid esters (for example, dibutyl sebacate), carboxylic acid esters of glycerin (for example, triacetin, and tributyrin), glycolic acid esters (for example, butyl phthalyl butyl glycolate, ethyl phthalyl ethyl glycolate, methyl phthalyl ethyl glycolate, butyl phthalyl butyl glycolate, methyl phthalyl methyl glycolate, propyl phthalyl propyl glycolate, butyl phthalyl butyl glycolate, and octyl phthalyl octyl glycolate), carboxylic acid esters of pentaerythritol (for example, pentaerythritol tetraacetate and pentaerythritol tetrabutyrate), carboxylic acid esters of dipentaerythritol (for example, dipentaerythritol hexaacetate, dipentaerythritol hexabutyrate, and dipentaerythritol tetraacetate), carboxylic acid esters of trimethylolpropane (trimethylolpropane triacetate, trimethylolpropane diacetate monopropionate, trimethylolpropane tripropionate, trimethylolpropane tributyrate, trimethylolpropane tripivalate, trimethylolpropane tri (t-butylacetate), trimethylolpropane di(2-ethylhexanate), trimethylolpropane tetra(2-ethylhexanate), trimethylolpropane diacetate monooctanate, trimethylolpropane trioctanate, and trimethylolpropane tri(cyclohexanecarboxylate), glycerol esters described in JP1999-246704A (JP-H11-246704A), diglycerol esters described in JP2000-63560A, citric acid esters described in JP1999-92574A (JP-H11-92574A), pyrrolidone carboxylic acid esters (methyl 2-pyrrolidone-5-carboxylate, ethyl 2-pyrrolidone-5-carboxylate, butyl 2-pyrrolidone-5-carboxylate, 2-ethylhexyl 2-pyrrolidone-5-carboxylate), cyclohexane dicarboxylic acid esters (butyl cis-1,2-cyclohexanedicarboxylate, dibutyl trans-1,2-cyclohexanedicarboxylate, dibutyl cis-1,4-cyclohexanedicarboxylate, and dibutyl trans-1,4-cyclohexanedicarboxylate), and xylitol carboxylic acid esters (xylitol pentaacetate, xylitol tetraacetate, and xylitol pentapropionate).

Preferred examples of the compound represented by any one of General Formulae (2) to (14) are shown below: however, the present invention is not limited to these specific examples.

It is noted that in the present invention, in a chemical structure described as a specific example, Me represents a methyl group, t-Bu represents a tert-butyl group, $Pr^i$ represents an isopropyl group, and n—represents normal.

C-201

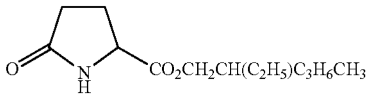

(2.00)

C-202

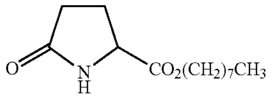

(2.02)

C-203

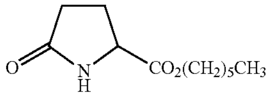

(3.69)

C-204

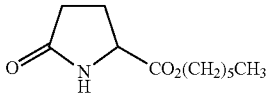

(1.18)

C-205

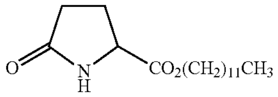

(5.36)

C-206

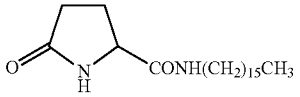

(4.68)

C-207

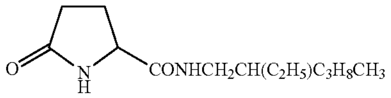

(1.32)

-continued

C-208

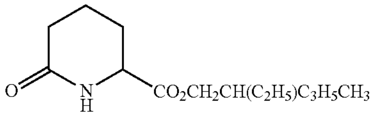

(2.42)

C-209

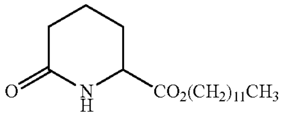

(4.10)

C-210

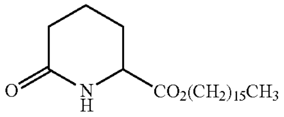

(5.77)

C-211

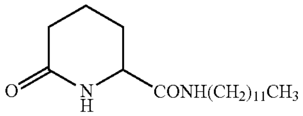

(3.43)

C-212

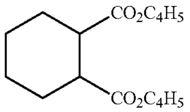

(3.84)

C-213

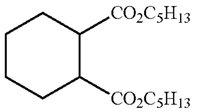

(5.51)

C-214

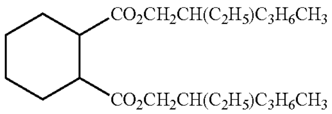

(7.14)

C-215

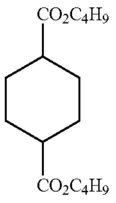

(3.84)

C-216

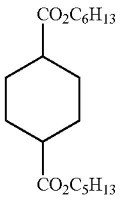

(5.51)

-continued
C-217
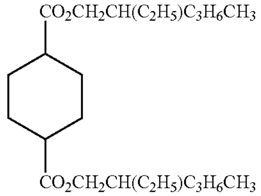
(7.14)
C-218
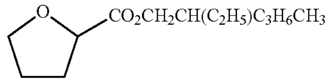
(2.98)
C-219
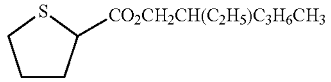
(3.70)
C-220
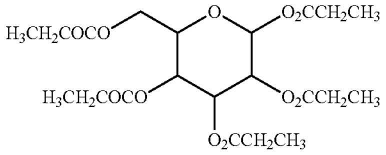
(2.15)
C-221
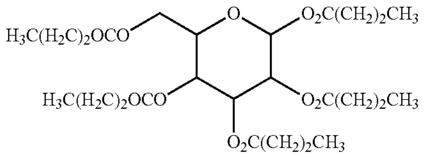
(4.45)
C-222
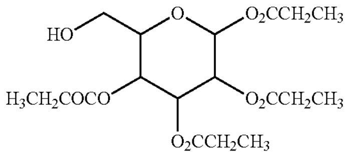
(1.27)
C-223
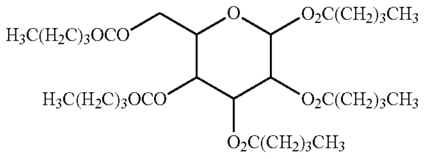
(6.53)
C-224
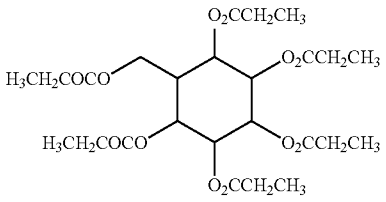
(2.23)
-continued
C-225
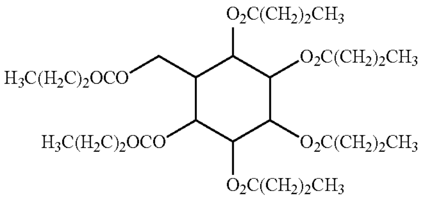
(5.01)
C-226
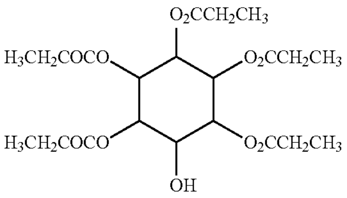
(1.31)
C-227
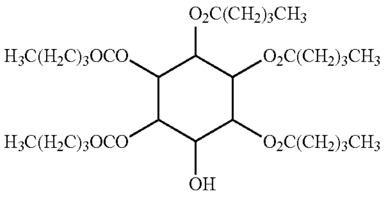
(5.69)
C-228
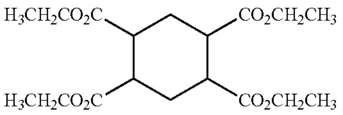
(1.56)
C-229
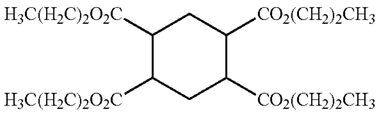
(3.51)
C-230
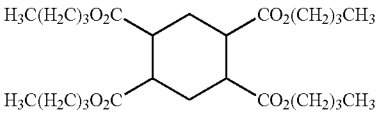
(5.18)
C-231
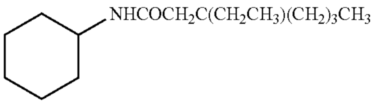
(3.90)
C-401
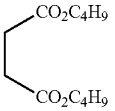
(2.37)
C-402
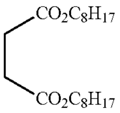
(5.71)

-continued
C-403
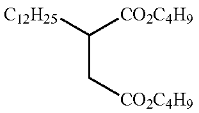
(7.53)
C-404
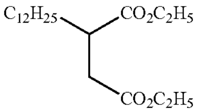
(5.72)
C-405
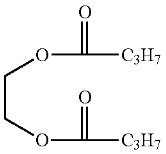
(1.81)
C-406
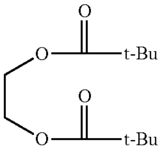
(3.52)
C-407
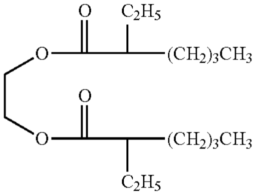
(5.45)
C-408
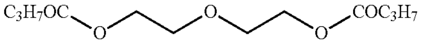
(1.66)
C-409
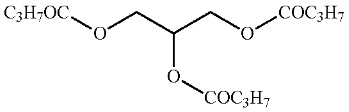
(2.58)
C-410
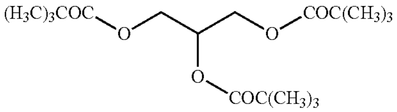
(5.14)
C-411
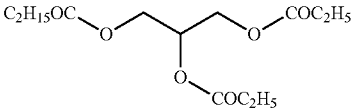
(1.32)
-continued
C-412
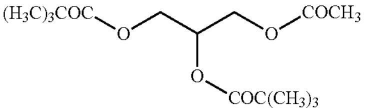
(3.22)
C-413
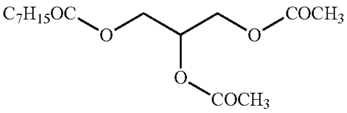
(2.10)
C-414
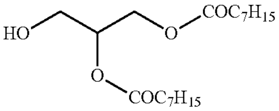
(4.61)
C-415
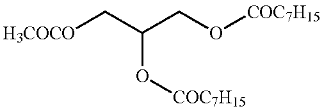
(4.84)
C-416
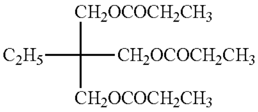
(2.43)
C-417
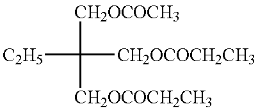
(1.78)
C-418
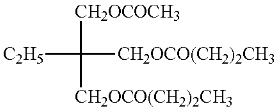
(2.61)
C-419
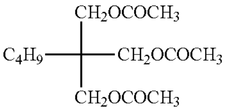
(1.31)
C-420
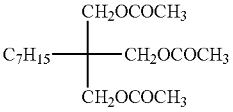
(2.56)
C-421
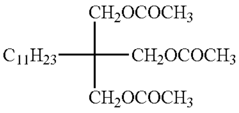
(4.23)

-continued
C-422
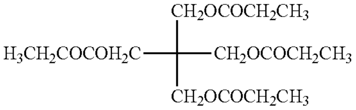
(1.84)
C-423
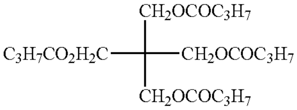
(3.51)
C-424
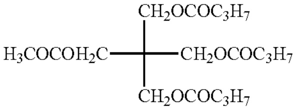
(2.44)
C-425
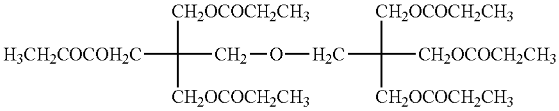
(2.54)
C-426
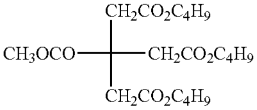
(3.01)
C-427
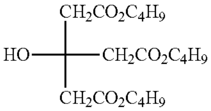
(2.78)
C-428
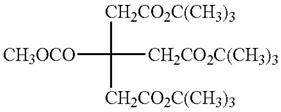
(1-91)
C-429
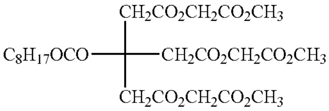
(1.03)
C-430
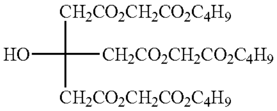
(1.36)
C-431
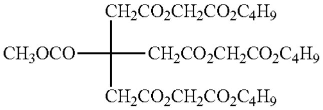
(1.59)
-continued
C-432
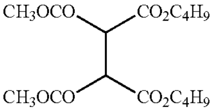
(1.52)
C-433
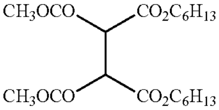
(3.19)
C-434
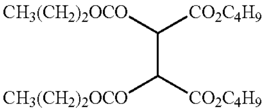
(3.66)
C-435
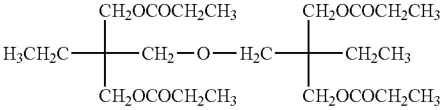
(3.73)
C-436
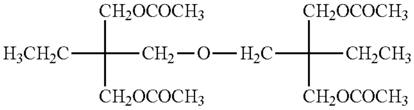
(1.12)
C-437
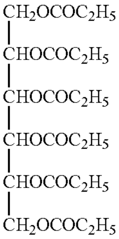
(2.36)
C-438
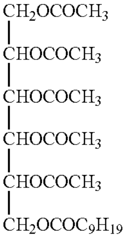
(2.02)
C-439
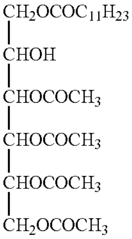
(2.62)

-continued

C-440

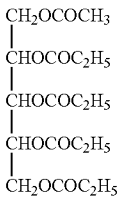

(1.36)

C-441

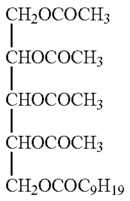

(2.32)

C-442

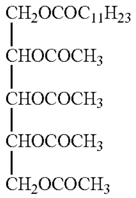

(3.16)

C-443

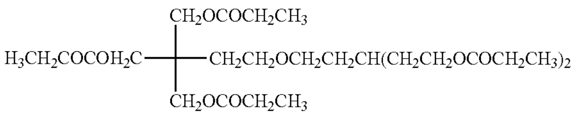

(3.37)

C-444

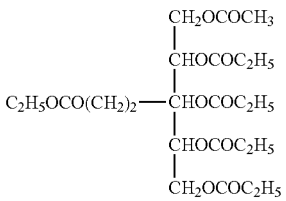

(1.63)

C-445

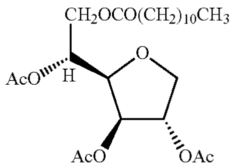

(3.03)

C-446

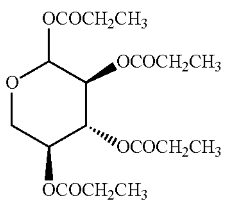

(1.69)

-continued

C-447

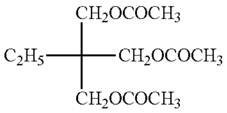

(0.47)

C-448

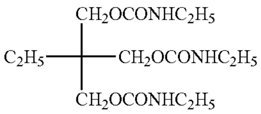

(3.60)

(Compound Represented by General Formula (13) or (14))

General Formula (13)

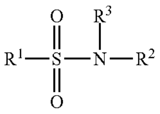

In the formula, $R^1$ represents an alkyl group or an aryl group, and $R^2$ and $R^3$ represent a hydrogen atom, an alkyl group, or an aryl group. The total number of carbon atoms of $R^1$, $R^2$, and $R^3$ is 10 or more.

General Formula (14)

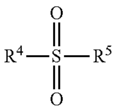

In the formula, $R^4$ and $R^5$ represent an alkyl group or an aryl group. The total number of carbon atoms of $R^4$ and $R^5$ is 10 or more.

The alkyl group that can be adopted as $R^1$ to $R^5$ may be linear, branched, or cyclic, and it preferably has 1 to 25 carbon atoms, more preferably has 6 to 25 carbon atoms, and still more preferably has 6 to 20 carbon atoms. Examples thereof include methyl, ethyl, propyl, isopropyl, butyl, isobutyl, t-butyl, amyl, isoamyl, t-amyl, hexyl, cyclohexyl, heptyl, octyl, bicyclooctyl, nonyl, adamantyl, decyl, t-octyl, undecyl, dodecyl, dodecyl, tridecyl, tetradecyl, pentadecyl, hexadecyl, heptadecyl, octadecyl, nonadecyl, and didecyl.

The aryl group that can be adopted as $R^1$ to $R^5$ preferably has 6 to 30 carbon atoms and more preferably has 6 to 24 carbon atoms. Examples thereof include phenyl, biphenyl, terphenyl, naphthyl, binaphthyl and triphenyl.

The alkyl group and the aryl group, which can be adopted as $R^1$ to $R^5$, may have a substituent. Preferred examples of the substituent which may be contained include a halogen atom (a fluorine atom, a chlorine atom, or the like), an alkyl group, an aryl group, an alkoxy group, an aryloxy group, an acyl group, an arylcarbonyl group, an alkoxycarbonyl group, a sulfonyl group, a sulfonamide group, an amino group, a hydroxy group, and a cyano group. In addition, preferred examples thereof also include a substituent obtained by combining two or more of these substituents.

The substituent which may be contained in the alkyl group and the aryl group, which can be adopted as $R^1$ to $R^5$, is preferably an alkyl group, an aryl group, an alkoxy group, a sulfone group, or a sulfonamide group.

The total number of carbon atoms of $R^1$ to $R^3$ is 10 or more, and it is preferably 10 to 40 and more preferably 12 to 30.

The total number of carbon atoms of $R^4$ and $R^5$ is 10 or more, and it is preferably 10 to 40 and more preferably 12 to 30.

Preferred examples of the compound represented by General Formula (13) or (14) are shown below; however, the present invention is not limited to these specific examples. However, the compound A-49 and the compound B-25 are preferred examples of the compound having an alkoxycarbonyl group on the benzene ring, which will be described later.

A-1

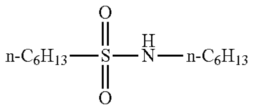

A-2

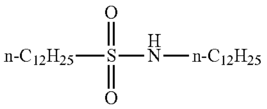

A-3

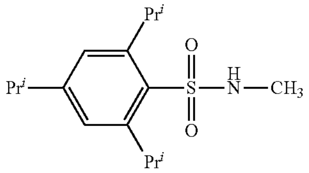

A-4

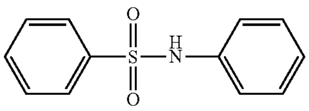

A-5

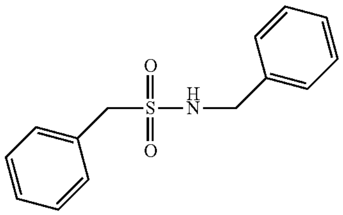

A-6

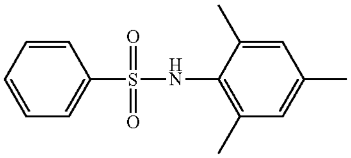

A-7

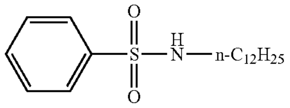

A-8

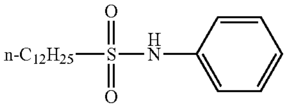

A-9

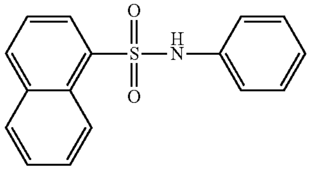

A-10

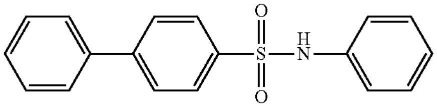

A-11

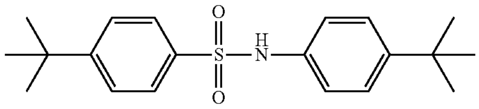

A-12

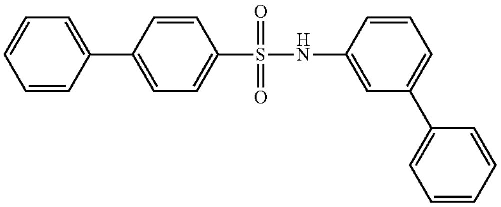

A-13

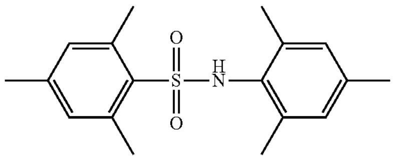

A-14

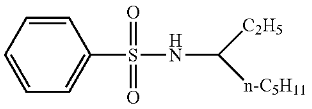

A-15

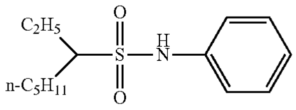

A-16

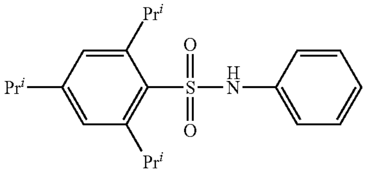

-continued
A-17
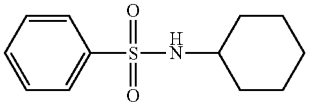
A-18
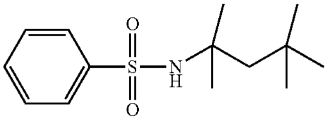
A-19
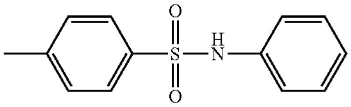
A-20
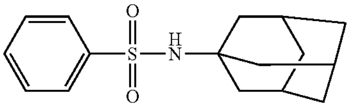
A-21
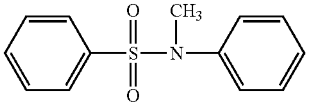
A-22
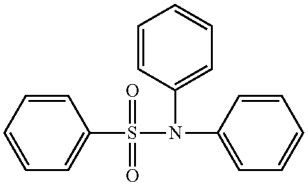
A-23
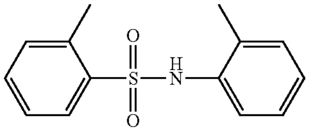
A-24
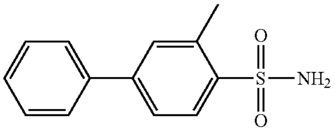
A-25
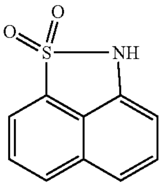
A-26
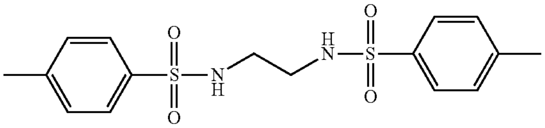
A-27
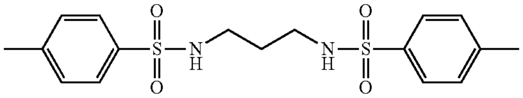
A-28
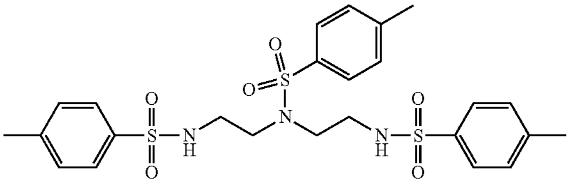
A-29
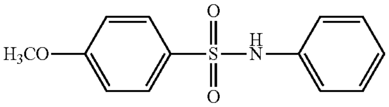
A-30
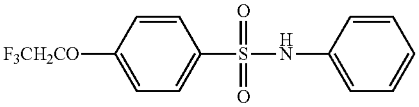
A-31
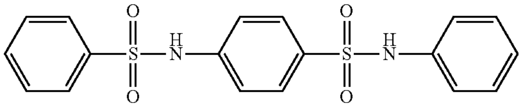
A-32
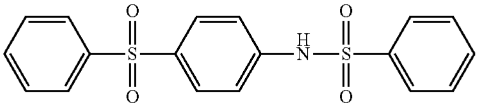
A-33
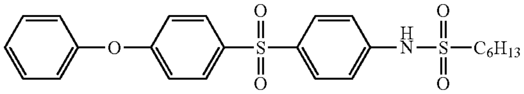
A-34
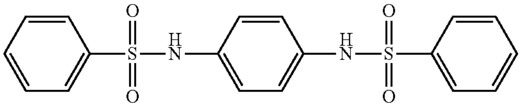
A-35
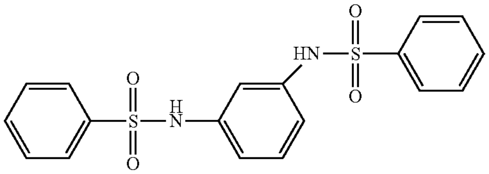
A-36
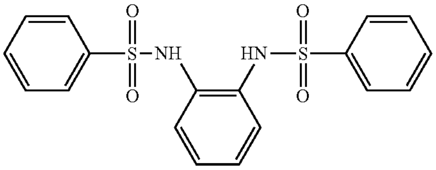

-continued
A-37
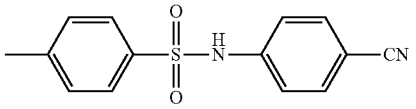
A-38
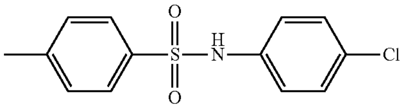
A-39
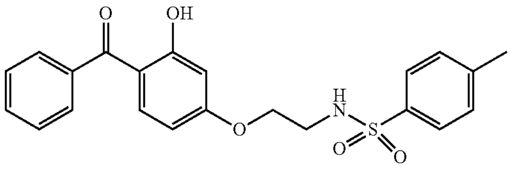
A-40
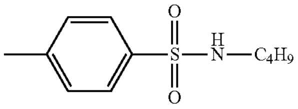
A-41
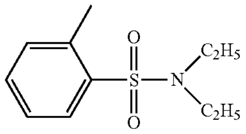
A-42
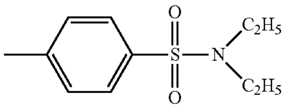
A-43
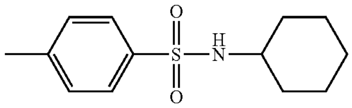
A-44
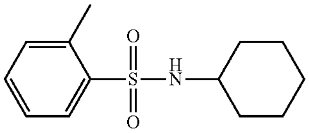
A-45
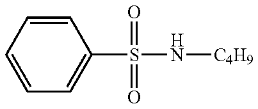
A-46
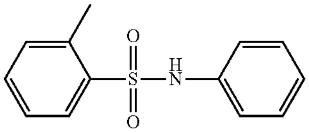
A-47
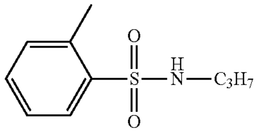
A-48
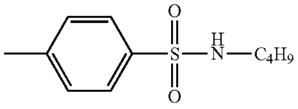
A-49
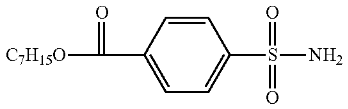
A-50
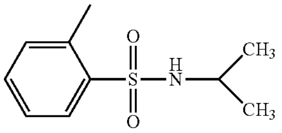
A-51
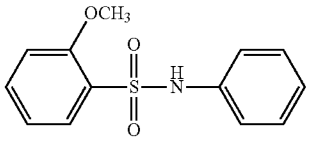
B-1
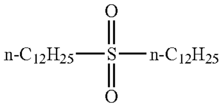
B-2
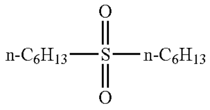
B-3
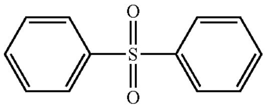
B-4
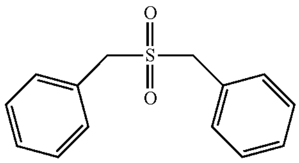
B-5
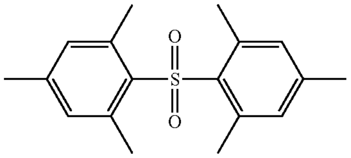
B-6
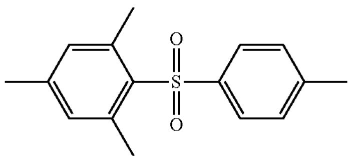
B-7
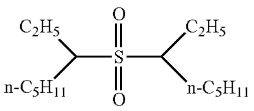

-continued
B-8
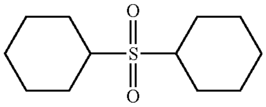
B-9
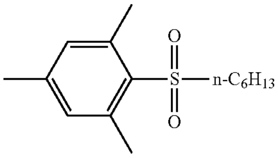
B-10
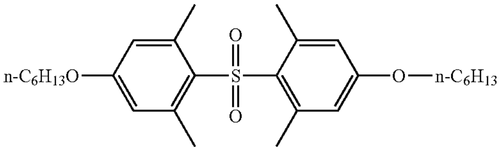
B-11
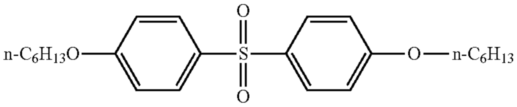
B-12
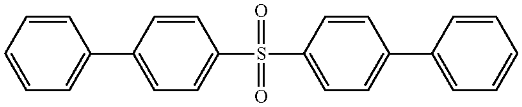
B-13
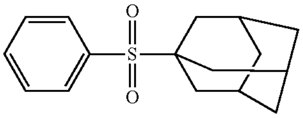
B-14
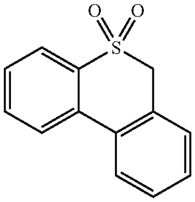
B-15
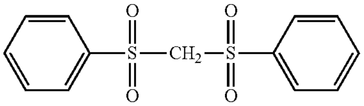
B-16
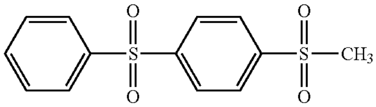
B-17
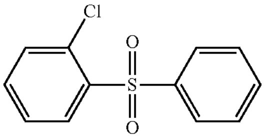
B-18
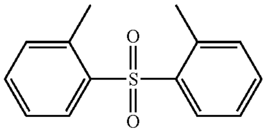
B-19
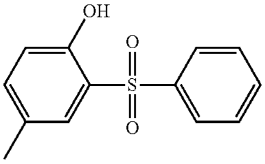
B-20
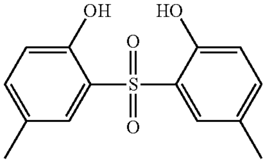
B-21
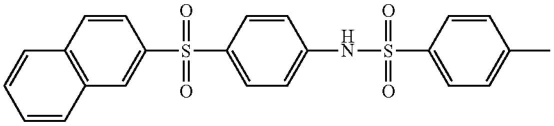
B-22
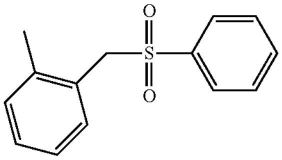
B-23
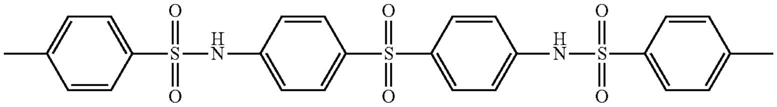

-continued

B-24

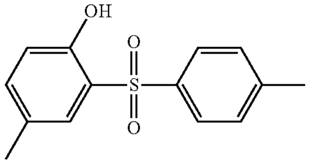

B-25

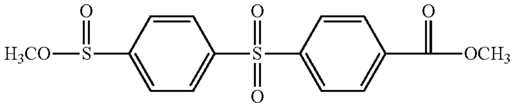

B-26

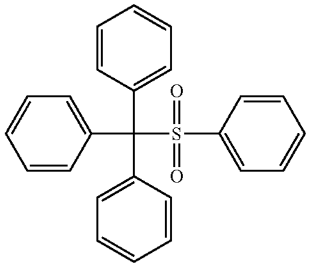

B-27

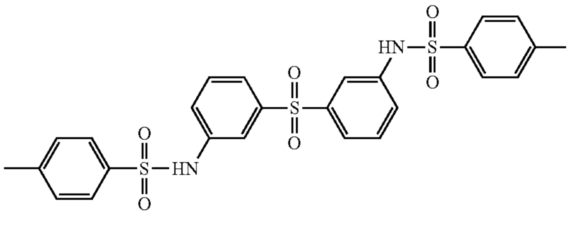

B-28

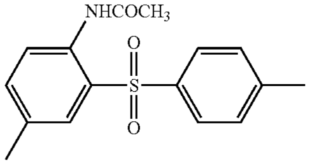

B-29

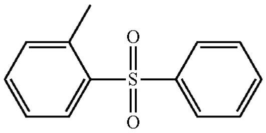

B-30

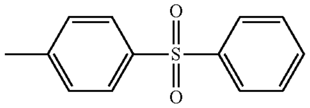

B-31

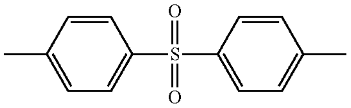

B-32

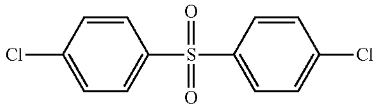

B-33

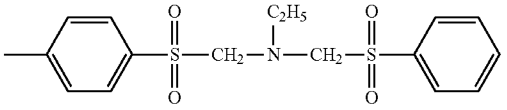

B-34

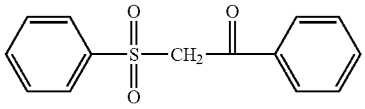

B-35

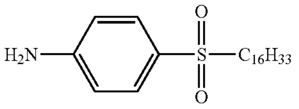

(Compound Represented by General Formula (18))

General Formula (18)

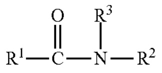

In the formula, $R^1$ represents an alkyl group or an aryl group. $R^2$ and $R^3$ represent a hydrogen atom, an alkyl group, or an aryl group, where an alkyl group or an aryl group is preferable.

The alkyl group that can be adopted as $R^1$ to $R^3$ may be linear, branched, or cyclic, and it preferably has 1 to 20 carbon atoms, more preferably has 1 to 15 carbon atoms, and still more preferably has 1 to 12 carbon atoms. Examples of the cyclic alkyl group include a cyclopentyl group, a cyclohexyl group, and an adamantyl group, and a cyclohexyl group is particularly preferable.

The aryl group that can be adopted as $R^1$ and $R^3$ preferably has 6 to 36 carbon atoms and more preferably has 6 to 24 carbon atoms. Among the above, a phenyl group or a naphthyl group is preferable, and a phenyl group is more preferable.

The alkyl group and the aryl group, which can be adopted as $R^1$ to $R^3$, may have a substituent, where the substituent is preferably a halogen atom (for example, a chlorine atom, a bromine atom, a fluorine atom, or an iodine atom), an alkyl group, an aryl group, an alkoxy group, an aryloxy group, an acyl group, an alkoxycarbonyl group, an aryloxycarbonyl group, an acyloxy group, a sulfonylamino group, a hydroxy group, a cyano group, an amino group, a carbamoyl group, or an acylamino group, more preferably a halogen atom, an alkyl group, an aryl group, an alkoxy group, an aryloxy group, a sulfonylamino group, a carbamoyl group, or an acylamino group, and still more preferably an alkyl group, an aryl group, a sulfonylamino group, or an acylamino group.

It is noted that the substituent which may be contained in the alkyl group and the aryl group, which can be adopted as $R^1$ to $R^3$, may be further substituted with a substituent. As the substituent which may be further contained, the descriptions regarding the above-described alkyl group which can be adopted as $R^1$ to $R^3$ and the substituent which may be contained in the aryl group can be preferably applied, and, for example, an alkyl group may be mentioned.

The compound represented by General Formula (18) preferably has a cyclic structure from the viewpoint of further improving light resistance.

The cyclic structure may be any one a saturated or unsaturated aliphatic hydrocarbon ring or an aromatic hydrocarbon ring, and it is preferably an aromatic hydrocarbon ring.

The number of cyclic structures in the compound is not particularly limited, and it is, for example, preferably 1 to 7, more preferably 1 to 5, and still more preferably 2 or 3.

In addition, the compound represented by General Formula (18) preferably does not have a long-chain alkyl group from the viewpoint of further improving light resistance. Here, the long-chain alkyl group means a group in which the number of carbon atoms that form the longest bond among the carbon-carbon bonds constituting the alkyl group is 7 or more.

Hereinafter, preferred examples of the compound represented by General Formula (18) are shown below; however, the present invention is not limited to these specific examples.

FA-1

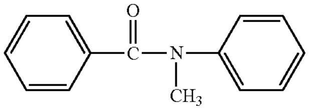

FA-2

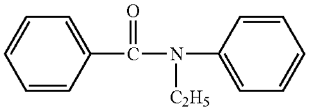

FA-3

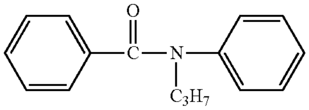

FA-4

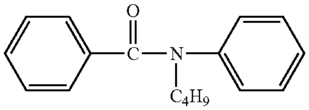

FA-5

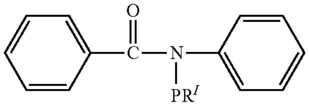

FA-6

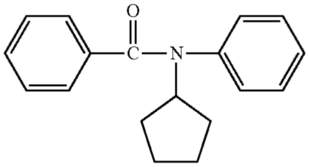

FA-7

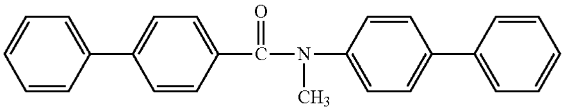

FA-8

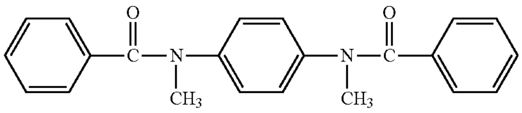

-continued

FA-9

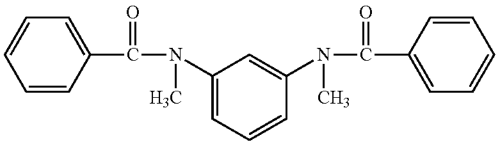

FA-10

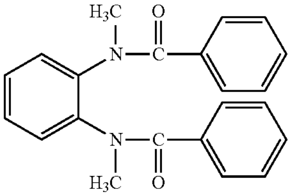

FA-11

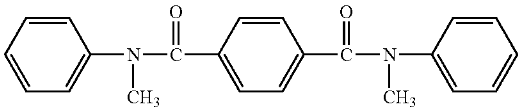

FA-12

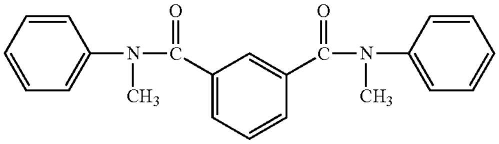

FA-13

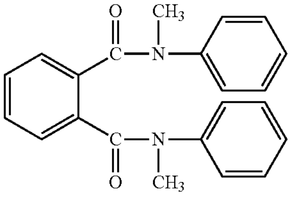

FA-14

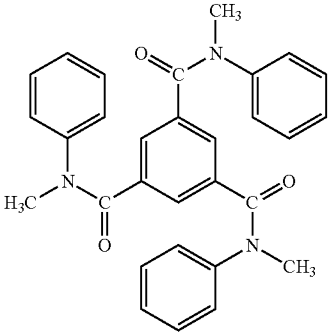

FA-15

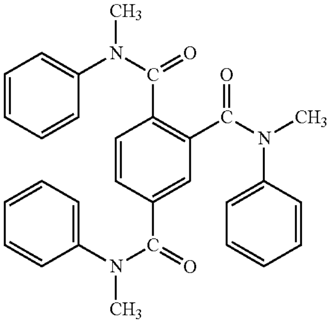

-continued
FA-16
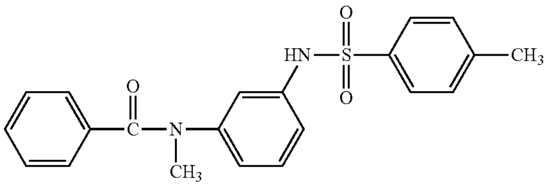
FA-17
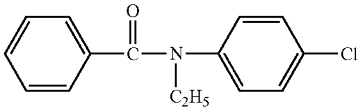
FA-18
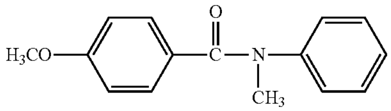
FA-19
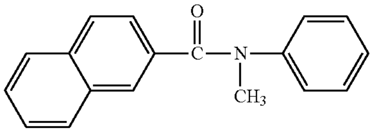
FA-20
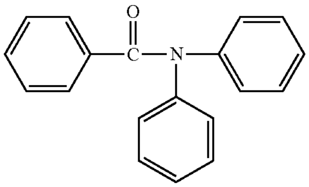
FA-21
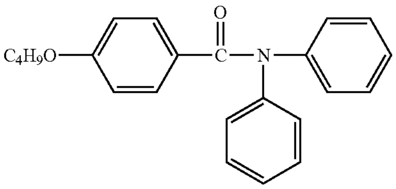
FA-22
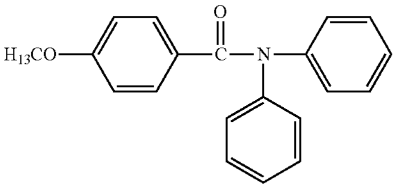
FA-23
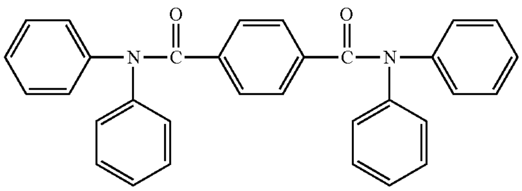
FA-24
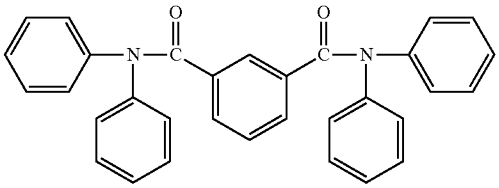
-continued
FA-25
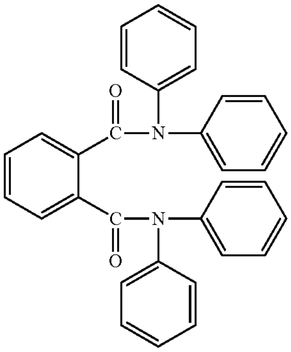
FA-26
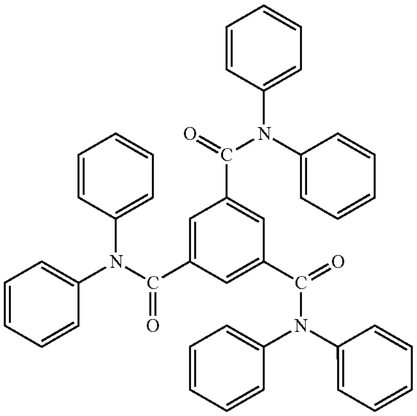
FA-27
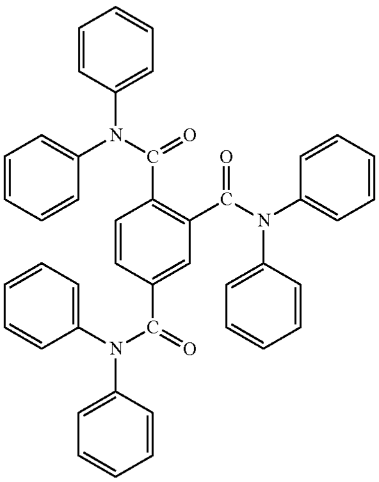
FA-28
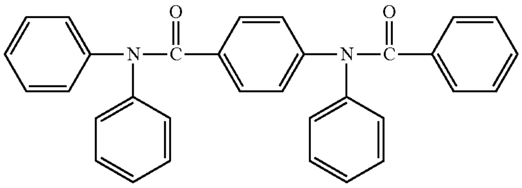
FB-1
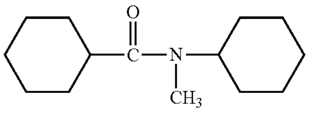

-continued
FB-2
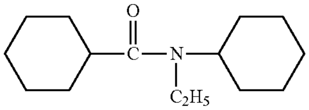
FB-3
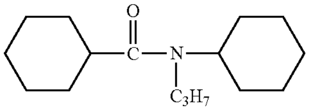
FB-4
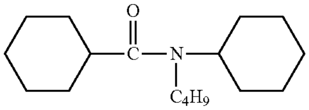
FB-5
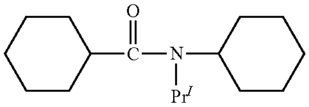
FB-6
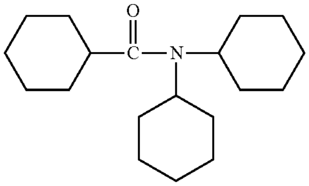
FB-7
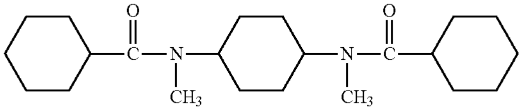
FB-8
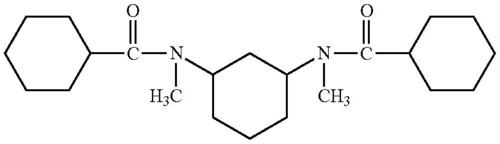
FB-9
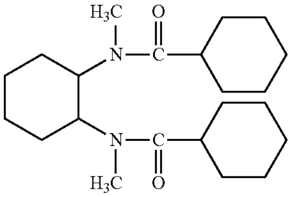
FB-10
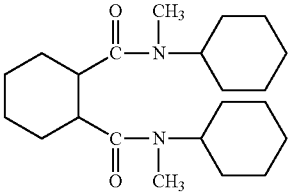
FB-11
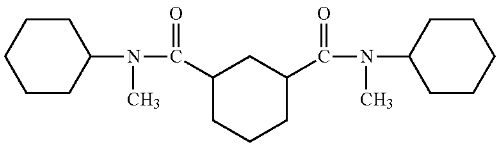
-continued
FB-12
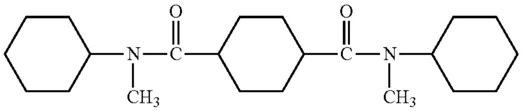
FB-13
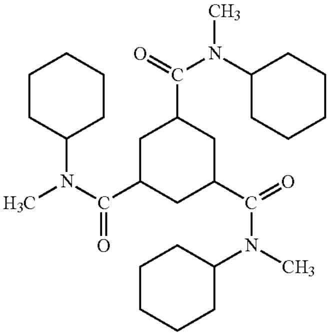
FB-14
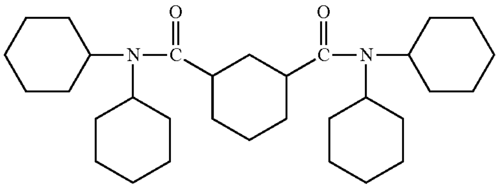
FB-15
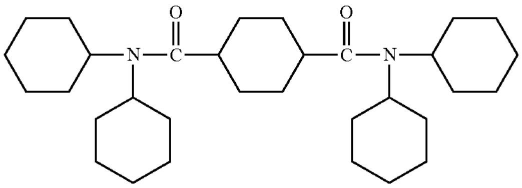
FB-16
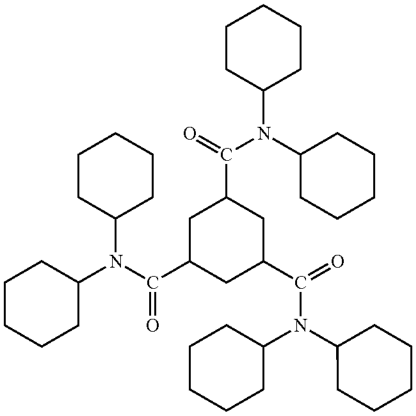
FB-17
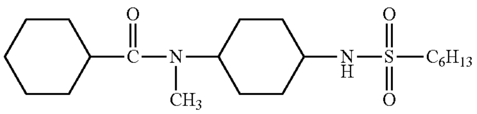
FB-18
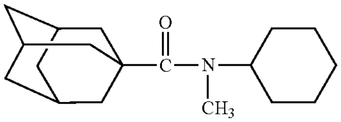

-continued
FB-19
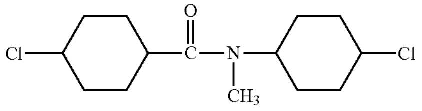
FB-20
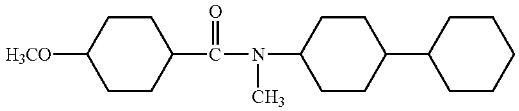
FB-21
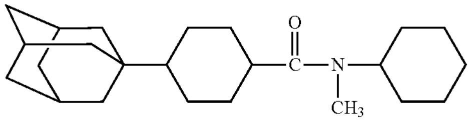
FB-22
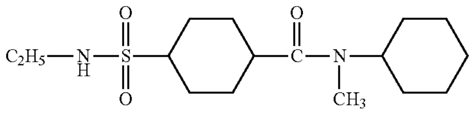
FB-23
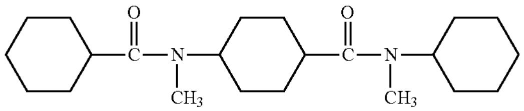
FB-24
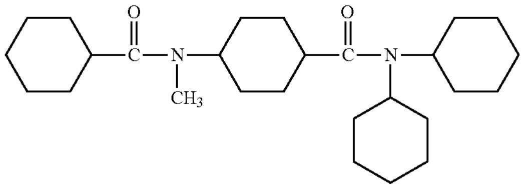
FC-1
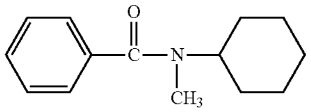
FC-2
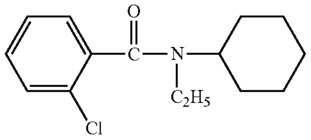
FC-3
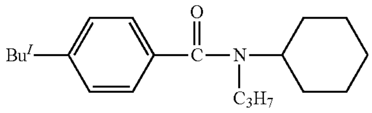
FC-4
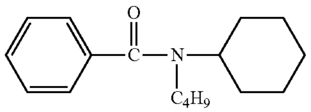
FC-5
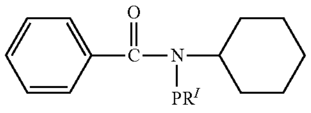
-continued
FC-6
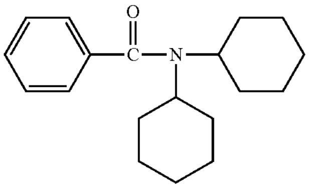
FC-7
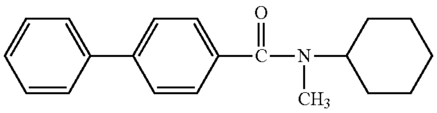
FC-8
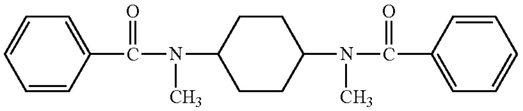
FC-9
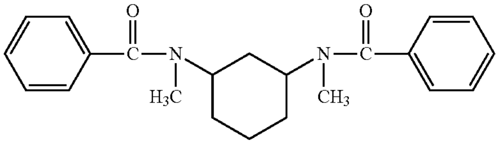
FC-10
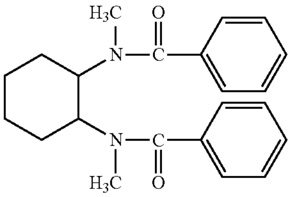
FC-11
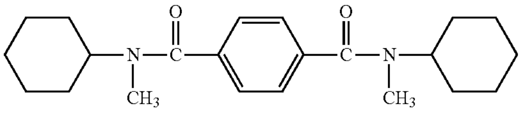
FC-12
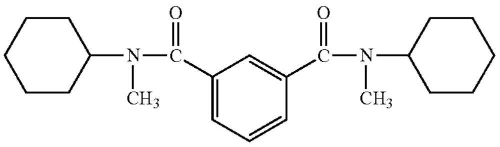
FC-13
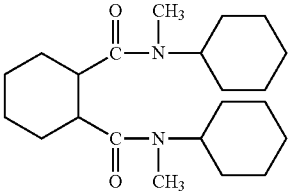

-continued
FC-14
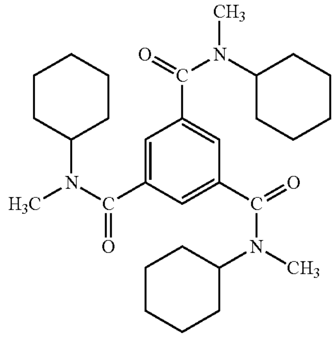
FC-15
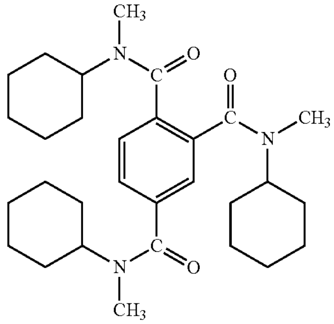
FC-16
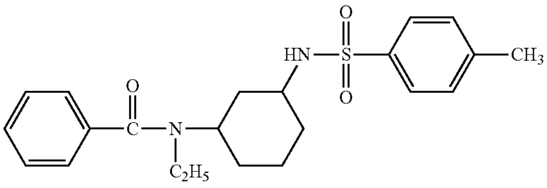
FC-17
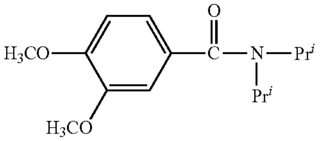
FC-18
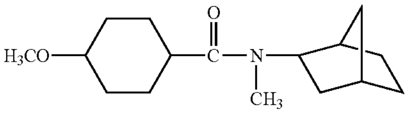
FC-19
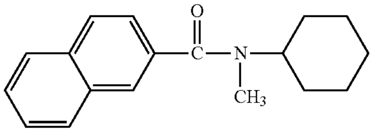
FC-20
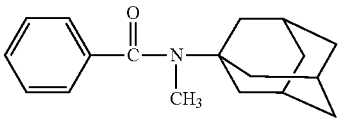
FC-21
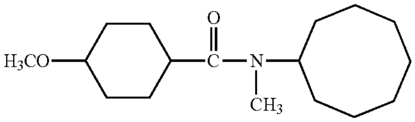
-continued
FC-22
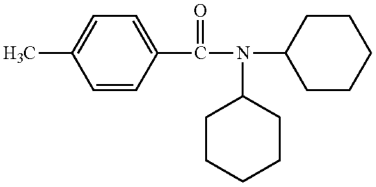
FC-23
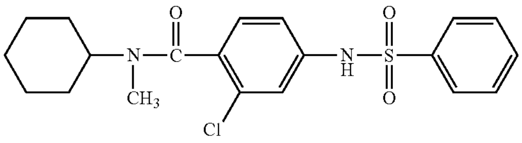
FC-24
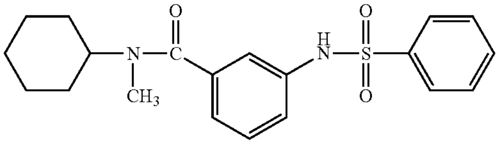
FC-25
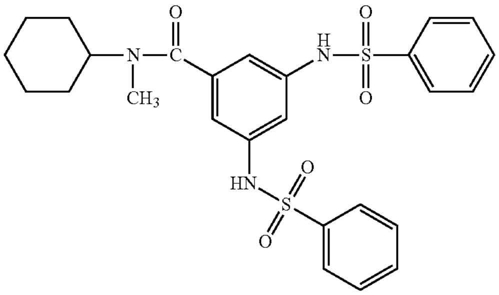
FD-1
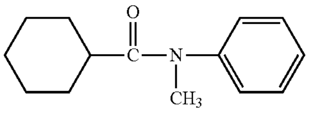
FD-2
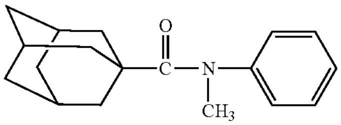
FD-3
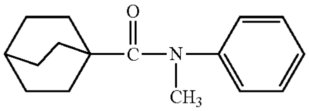
FD-4
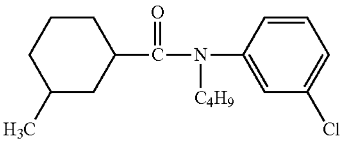
FD-5
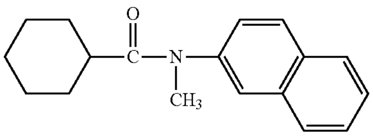

-continued
FD-6
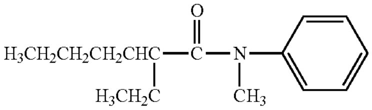
FD-7
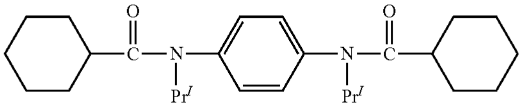
FD-8
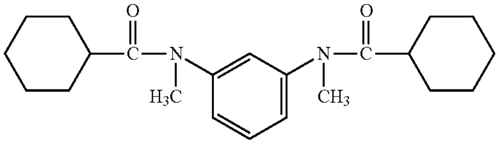
FD-9
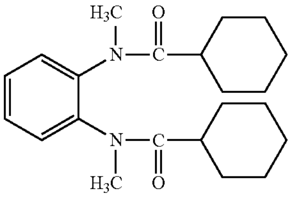
FD-10
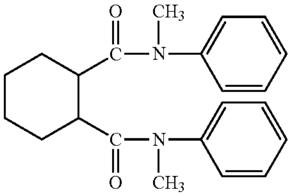
FD-11
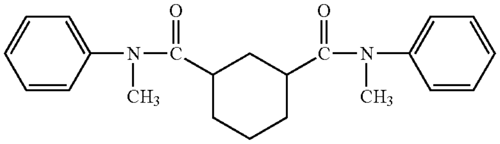
FD-12
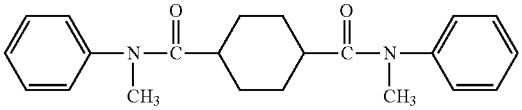
FD-13
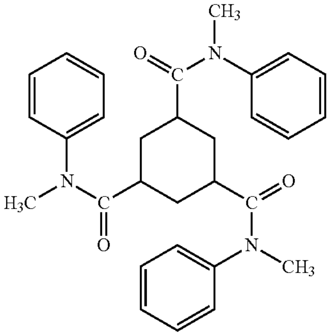
-continued
FD-14
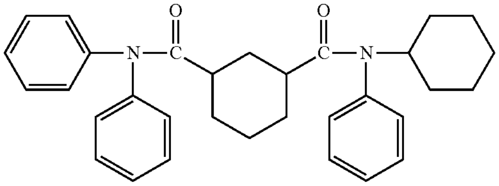
FD-15
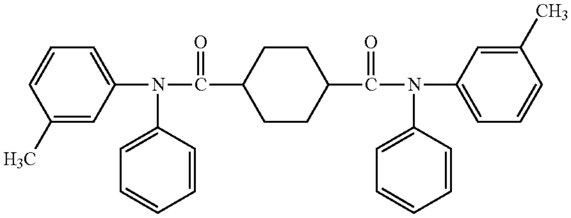
FD-16
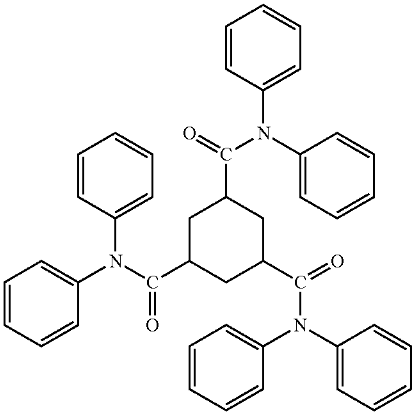
FD-17
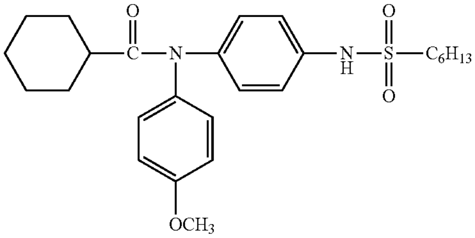
FD-18
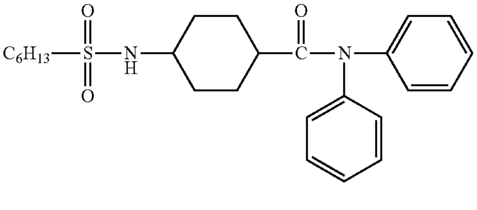
FD-19
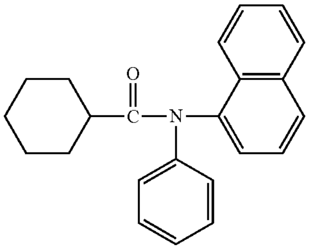

-continued

FD-20

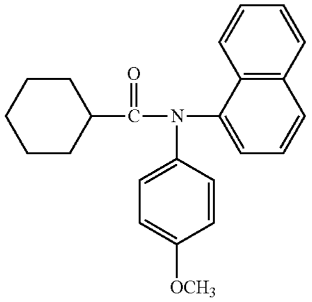

FD-21

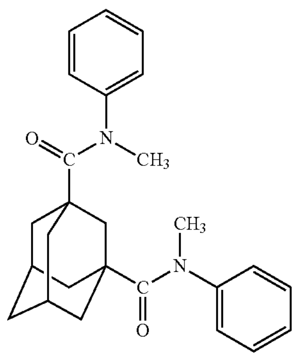

FD-22

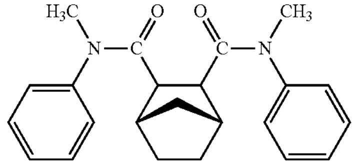

In addition, preferred examples of the association inhibitor also include a compound having an alkoxycarbonyl group on the benzene ring. The number of alkoxycarbonyl groups on the benzene ring is not particularly limited, and it is preferably 1 to 3 and more preferably 2 or 3. In addition, the benzene ring may have a substituent other than the alkoxycarbonyl group, and examples thereof include a sulfamoyl group and a sulfonyl group. The sulfamoyl group preferably has 0 to 20 carbon atoms, more preferably has 0 to 12 carbon atoms, and still more preferably has 0 to 6 carbon atoms, and the sulfonyl group preferably has 0 to 20 carbon atoms and more preferably has 0 to 12 carbon atoms. These sulfamoyl group and sulfonyl group may be further substituted with a substituent, examples of which include an alkoxycarbonyl group and an acyloxy group.

Among the above, the compound having an alkoxycarbonyl group on the benzene ring is preferably a phthalic acid ester compound or a trimellitic acid ester compound.

The phthalic acid ester compound is preferably an ester compound of phthalic acid (which may be any isomer of ortho, meta, or para) and an alcohol having 4 to 10 carbon atoms. Specific examples thereof include dicyclohexyl phthalate, diphenyl phthalate, and ditolyl phthalate. Among them, dicyclohexyl phthalate or diphenyl phthalate is preferable.

The trimellitic acid ester compound is preferably an ester compound of trimellitic acid and an alcohol having 4 to 10 carbon atoms. Specific examples thereof include tributyl trimellitate, tri(2-ethylhexyl) trimellitate, trinormal octyl trimellitate, trinormal decyl trimellitate, and triisodecyl trimellitate. Among them, tributyl trimellitate, tri(2-ethylhexyl) trimellitate, or triisodecyl trimellitate is preferable.

The content of the association inhibitor in the wavelength selective absorption filter according to the embodiment of the present invention is preferably 0.1% to 30% by mass, more preferably 1% to 20% by mass, and still more preferably 2% to 15% by mass.

In the wavelength selective absorption filter according to the embodiment of the present invention, the association inhibitor is preferably contained at a proportion of 10 to 1,000 parts by mass, more preferably contained at a proportion of 30 to 700 parts by mass, and still more preferably contained at a proportion of 50 to 500 parts by mass, with respect to 100 parts by mass of the total contents of the dye A and the dye C.

<Other Components>

In addition to the dye, the matrix resin, and the association inhibitor described above, the wavelength selective absorption filter according to the embodiment of the present invention may contain an antifading agent for a dye, a matting agent, a leveling agent (a surfactant), and the like.

(Antifading Agent)

The wavelength selective absorption filter according to the embodiment of the present invention may contain an antifading agent for a dye (simply, also referred to as an antifading agent) in order to prevent the fading of the dye including at least one of the dye A or D.

As the antifading agent, it is possible to use commonly used antifading agents without particular limitation, such as the antioxidants described in paragraphs [0143] to [0165] of WO2015/005398A, the radical scavengers described in paragraphs [0166] to [0199] of WO2015/005398A, and the deterioration preventing agents described in paragraphs [0205] to [0206] of WO2015/005398A.

The content of the antifading agent in the wavelength selective absorption filter according to the embodiment of the present invention is preferably 0.1% to 15% by mass and more preferably 1% to 15% by mass in 100% by mass of the total mass of the wavelength selective absorption filter.

In a case where the antifading agent is contained within the above-described preferred range, it is possible to improve the light resistance of the dye (the coloring agent) without causing side effects such as discoloration of the wavelength selective absorption filter.

(Matting Agent)

It is preferable to add fine particles (also referred to as a matting agent) onto the surface of the wavelength selective absorption filter according to the embodiment of the present invention in order to impart sliding properties and prevent blocking. As the matting agent, the description regarding the matting agent described in [0253] to [0255] of WO2019/189463A can be used without particular limitation. It is noted that "the filter according to the present invention" in WO2019/189463A shall be read as "the wavelength selective absorption filter according to the embodiment of the present invention".

However, in a case where the wavelength selective absorption filter according to the embodiment of the present invention has a gas barrier layer described later, it is preferable to apply the above-described matting agent fine particles to the surface of the wavelength selective absorption filter, where the surface is in contact with the gas barrier layer as long as the effect of the present invention is not impaired.

(Leveling Agent)

A leveling agent (a surfactant) can be appropriately mixed with the wavelength selective absorption filter according to the embodiment of the present invention. As the leveling agent, a commonly used compound can be used, and a fluorine-containing surfactant is particularly preferable. Specific examples thereof include the compounds described in paragraphs [0028] to [0056] of JP2001-330725A.

The content of the leveling agent in the wavelength selective absorption filter according to the embodiment of the present invention is appropriately adjusted depending on the intended purpose.

The wavelength selective absorption filter according to the embodiment of the present invention may contain, in addition to the above components, a low-molecular plasticizer, an oligomer-based plasticizer, a retardation modifier, an ultraviolet absorbing agent, a deterioration preventing agent, a peeling accelerating agent, an infrared absorbing agent, an antioxidant, a filler, a compatibilizer.

<Manufacturing Method for Wavelength Selective Absorption Filter>

The wavelength selective absorption filter can be produced by a solution film-forming method, a melt extrusion method, or a method of forming a coating layer on a base material film (a release film) (a coating method) according to any method, according to a conventional method, and stretching can also be appropriately combined.

Regarding the solution film-forming method and the melt extrusion method, the solution film-forming method and the melt extrusion method, which are described in [0259] to [0265] of WO2019/189463A, can be used without particular limitation. It is noted that "the filter according to the present invention" or "the filter" in WO2019/189463A shall be read as the wavelength selective absorption filter according to the embodiment of the present invention.

The wavelength selective absorption filter according to the embodiment of the present invention is preferably produced by a coating method.

(Coating Method)

In the coating method, a solution of the material of the wavelength selective absorption filter according to the embodiment of the present invention is appropriately subjected to a concentration step, a filtration step, or the like, and then applied onto a release film and dried to form a coating layer. A release agent or the like may be appropriately applied to the surface of the release film in advance in order to control the adhesiveness to the coating layer. The coating layer can be used by peeling off the release film after being laminated with another member while interposing an adhesive layer in a later step. Any adhesive can be appropriately used as the adhesive constituting the adhesive layer. It is noted that the release film can be appropriately stretched together with the release film coated in a state where a solution of the material of the wavelength selective absorption filter according to the embodiment of the present invention is applied or a coating layer is laminated on the release film.

The solvent that is used for the solution of the wavelength selective absorption filter material can be appropriately selected from the viewpoints that the wavelength selective absorption filter material can be dissolved or dispersed, a uniform surface shape can be easily achieved during the coating step and drying step, liquid storability can be secured, and a proper saturated vapor pressure is provided.

—Addition of Dye (Coloring Agent) and Association Inhibitor—

The timing of adding the dye and the association inhibitor to the wavelength selective absorption filter material is not particularly limited as long as the dye and the antifading agent are added at the time of film formation. For example, the dye may be added at the time of synthesizing the matrix resin or may be mixed with the wavelength selective absorption filter material at the time of preparing the coating liquid for the wavelength selective absorption filter material. In addition, the same applies to other components that may be contained in the wavelength selective absorption filter, such as the leveling agent.

—Release Film—

The release film that is used for forming the wavelength selective absorption filter by a coating method or the like preferably has a film thickness of 5 to 100 μm, more preferably has 10 to 75 μm, and still more preferably has 15 to 55 μm. In a case where the film thickness is equal to or larger than the above-described preferred lower limit value, sufficient mechanical strength can be easily secured, and failures such as curling, wrinkling, and buckling are less likely to occur. In addition, in a case where the film thickness is equal to or smaller than the above-described preferred upper limit value, in the storage of a multi-layer film of the release film and the wavelength selective absorption filter according to the embodiment of the present invention, for example, in the form of a long roll, the surface pressure applied to the multi-layer film is easily adjusted to be in an appropriate range, and adhesion defect is less likely to occur.

The surface energy of the release film is not particularly limited, and in a case of adjusting the relationship between the surface energy of the material of the wavelength selective absorption filter or coating solution and the surface energy of the surface of the release film on which the wavelength selective absorption filter is to be formed, it is possible to adjust the adhesive force between the wavelength selective absorption filter and the release film. In a case where the surface energy difference is reduced, the adhesive force tends to increase, and in a case where the surface energy difference is increased, the adhesive force tends to decrease, and thus the surface energy can be set appropriately.

The surface energy of the release film can be calculated from the contact angle value between water and methylene iodide using the Owen's method. For the measurement of the contact angle, for example, DM901 (contact angle meter, manufactured by Kyowa Interface Science Co., Ltd.) can be used.

The surface energy of the surface of the release film on which the wavelength selective absorption filter is to be formed is preferably 41.0 to 48.0 mN/m and more preferably 42.0 to 48.0 mN/m. In a case where the surface energy is equal to or larger than the above-described preferred lower limit value, the evenness of the thickness of the wavelength selective absorption filter is increased. In a case where the surface energy is equal to or smaller than the above-described preferred upper limit value, it is easy to control the peeling force of the wavelength selective absorption filter from the release film within an appropriate range.

The surface unevenness of the release film is not particularly limited. However, the surface unevenness of the release film can be adjusted in response to the relationship between the surface energy, hardness, and surface unevenness of the surface of the wavelength selective absorption filter, and the surface energy and hardness of the surface of the release film opposite to the side on which the wavelength selective absorption filter is formed, for example, in order to prevent adhesion defect in a case where the multi-layer film of the release film and the wavelength selective absorption filter according to the embodiment of the present invention is stored in the form of a long roll. In a case where the surface unevenness is increased, adhesion defect tends to be suppressed, and in a case where the surface unevenness is reduced, the surface unevenness of the wavelength selective absorption filter tends to be decreased and the haze of the wavelength selective absorption filter tends to be small. Thus, the surface unevenness can be set appropriately.

For such a release film, any material and film can be appropriately used. Specific examples of the material include a polyester-based polymer (including polyethylene terephthalate-based film), an olefin-based polymer, a cycloolefin-based polymer, a (meth)acrylic polymer, a cellulose-based polymer, and a polyamide-based polymer. In addition, a surface treatment can be appropriately carried out for the intended purpose of adjusting the surface properties of the release film. For example, a corona treatment, a room temperature plasma treatment, or a saponification treatment can be carried out to decrease the surface energy, and a silicone treatment, a fluorine treatment, an olefin treatment, or the like can be carried out to raise the surface energy.

—Peeling Force Between Wavelength Selective Absorption Filter and Release Film—

In a case where the wavelength selective absorption filter according to the embodiment of the present invention is formed by a coating method, the peeling force between the wavelength selective absorption filter and the release film can be controlled by adjusting the material of the wavelength selective absorption filter, the material of the release film, and the internal strain of the wavelength selective absorption filter. The peeling force can be measured by, for example, a test of peeling off the release film in a direction of 90°, and the peeling force in a case of being measured at a rate of 300 mm/min is preferably 0.001 to 5 N/25 mm, more preferably 0.01 to 3 N/25 mm, and still more preferably 0.05 to 1 N/25 mm. In a case where the peeling force is equal to or larger than the above-described preferred lower limit value, peeling off the release film in a step other than the peeling step can be prevented, and in a case where the peeling force is equal to or smaller than the above-described preferred upper limit value, peeling failure in the peeling step (for example, zipping and cracking of the wavelength selective absorption filter) can be prevented.

<Film Thickness of Wavelength Selective Absorption Filter>

The film thickness of the wavelength selective absorption filter according to the embodiment of the present invention is not particularly limited, and it is preferably 1 to 18 μm, more preferably 1 to 12 μm, and still more preferably 1 to 8 μm. In a case where the film thickness is equal to or smaller than the above-described preferred upper limit value, the decrease in the degree of polarization due to the fluorescence emitted by a dye (a coloring agent) can be suppressed by adding the dye to the thin film at a high concentration. In addition, the effects of the quencher and the antifading agent are easily exhibited. On the other hand, in a case where the film thickness is equal to or larger than the above-described preferred lower limit value, it becomes easy to maintain the evenness of the in-plane absorbance.

In the present invention, the film thickness of 1 to 18 μm means that the thickness of the wavelength selective absorption filter is within a range of 1 to 18 μm in a case of being measured at any portion. The same applies to the film thicknesses of 1 to 12 μm and 1 to 8 μm. The film thickness can be measured with an electronic micrometer manufactured by Anritsu Corporation.

<Transmittance of Wavelength Selective Absorption Filter>

The minimum transmittance of the wavelength selective absorption filter according to the embodiment of the present invention at a wavelength of 390 to 440 nm is preferably 0% or more and 98% or less, more preferably 0% or more and 90% or less, and still more preferably 0% or more and 80% or less.

In addition, the minimum transmittance of the wavelength selective absorption filter according to the embodiment of the present invention at a wavelength of 480 to 520 nm is preferably 5% or more and 98% or less, more preferably 10% or more and 95% or less, and still more preferably 20% or more and 90% or less.

In addition, the minimum transmittance of the wavelength selective absorption filter according to the embodiment of the present invention at a wavelength of 580 to 620 nm is preferably 0% or more and 99% or less, more preferably 0% or more and 98% or less, and still more preferably 0% or more and 95% or less.

In addition, the minimum transmittance of the wavelength selective absorption filter according to the embodiment of the present invention at a wavelength of 680 to 780 nm is preferably 0% or more and 95% or less, more preferably 0% or more and 90% or less, and still more preferably 0% or more and 80% or less.

In a case of incorporating the wavelength selective absorption filter according to the embodiment of the present invention, in which the transmittance is adjusted in the above-described range, into a display device (preferably, a self-luminous display device), it is possible to obtain a display performance in which the brightness is higher, the reflection of external light is further suppressed, and the color difference of the reflected light is small. The transmittance of the wavelength selective absorption filter according to the embodiment of the present invention can be adjusted by the kind and addition amount of the dye, the kind and addition amount of the association inhibitor, the kind of resin.

<Treatment of Wavelength Selective Absorption Filter>

The wavelength selective absorption filter according to the embodiment of the present invention may be subjected to a hydrophilic treatment by any one of a glow discharge treatment, a corona discharge treatment, or an alkali saponification treatment, where a corona discharge treatment is preferably used. It is also preferable to apply the method disclosed in JP1994-94915A (JP-H6-94915A) and JP1994-118232A (JP-H6-118232A).

As necessary, the obtained film may be subjected to a heat treatment step, a superheated steam contact step, an organic solvent contact step, or the like. In addition, a surface treatment may be appropriately carried out.

Further, as the pressure sensitive adhesive layer, a layer consisting of a pressure sensitive adhesive composition in which a (meth)acrylic resin, a styrene-based resin, a silicone-based resin, or the like is used as a base polymer, and a crosslinking agent such as an isocyanate compound, an epoxy compound, or an aziridine compound is added thereto can be applied.

Preferably, the description regarding the pressure sensitive adhesive layer in the display device described later can be applied.

<<Gas Barrier Layer>>

The wavelength selective absorption filter according to the embodiment of the present invention contains a gas barrier layer directly disposed on at least one surface of the wavelength selective absorption filter according to the embodiment of the present invention, and this gas barrier layer contains a crystalline resin, where it is preferable that the thickness of the layer is 0.1 μm to 10 μm and the oxygen permeability of the layer is 60 $cc/m^2 \cdot day \cdot atm$ or less.

In the gas barrier layer, the "crystalline resin" is a resin having a melting point that undergoes a phase transition from a crystal to a liquid in a case where the temperature is raised, and it can impart gas barrier properties related to oxygen gas to the gas barrier layer.

Since the wavelength selective absorption filter according to the embodiment of the present invention has a gas barrier layer at least on a surface where the wavelength selective absorption filter according to the embodiment of the present invention comes into contact with air in a case where the gas barrier layer is incorporated in the display device according to the embodiment of the present invention, it is possible to suppress a decrease in the absorption intensity of the dye in the wavelength selective absorption filter according to the embodiment of the present invention and improve the light resistance. As long as the gas barrier layer is provided at an interface of the wavelength selective absorption filter according to the embodiment of the present invention in contact with air, the gas barrier layer may be provided on only one surface of the wavelength selective absorption filter or may be provided on both surfaces.

(Crystalline Resin)

The crystalline resin contained in the gas barrier layer is a crystalline resin having gas barrier properties, and it can be used without particular limitation as long as a desired oxygen permeability can be imparted to the gas barrier layer.

Examples of the crystalline resin include polyvinyl alcohol and polyvinylidene chloride, and the polyvinyl alcohol is preferable from the viewpoint that a crystalline portion can effectively suppress the permeation of gas.

The polyvinyl alcohol may be modified or may not be modified. Examples of the modified polyvinyl alcohol include modified polyvinyl alcohol into which a group such as an acetoacetyl group and a carboxy group is introduced.

The saponification degree of the polyvinyl alcohol is preferably 80.0% by mol or more, more preferably 90.0% by mol or more, still more preferably 97.0% by mol or more, and particularly preferably 98.0% by mol or more, from the viewpoint of further enhancing the oxygen gas barrier properties. The upper limit value thereof is not particularly limited, and it is practically 99.99% by mol or less. The saponification degree of the polyvinyl alcohol is a value calculated based on the method described in JIS K 6726 1994.

The gas barrier layer may contain any component generally contained in the gas barrier layer as long as the effect of the present invention is not impaired. For example, in addition to the above crystalline resin, organic-inorganic hybrid materials such as an amorphous resin material and a sol-gel material, and inorganic materials such as $SiO_2$, $SiO_x$, SiON, $SiN_x$, and $Al_2O_3$ may be contained.

Further, the gas barrier layer may contain a solvent such as water and an organic solvent derived from a manufacturing step as long as the effect of the present invention is not impaired.

The content of the crystalline resin in the gas barrier layer is, for example, preferably 90% by mass or more and more preferably 95% by mass or more in 100% by mass of the total mass of the gas barrier layer. The upper limit value thereof is not particularly limited, and it can be set to 100% by mass.

The oxygen permeability of the gas barrier layer is 60 cc/m$^2$·day·atm or less, preferably 50 cc/m$^2$·day·atm or less, more preferably 30 cc/m$^2$·day·atm or less, still more preferably 10 cc/m$^2$·day·atm or less, particularly preferably 5 cc/m$^2$·day·atm or less, and most preferably 1 cc/m$^2$·day·atm or less. The practical lower limit value thereof is 0.001 cc/m$^2$·day·atm or more, and it is preferably, for example, more than 0.05 cc/m$^2$·day·atm. In a case where the oxygen permeability is within the above-described preferred range, the light resistance can be further improved.

The oxygen permeability of the gas barrier layer is a value measured based on the gas permeability test method based on JIS K 7126-2 2006. As the measuring device, for example, an oxygen permeability measuring device OX-TRAN2/21 (product name) manufactured by MOCON can be used. The measurement conditions are set to a temperature of 25° C. and a relative humidity of 50%.

For the oxygen permeability, (fm)/(s·Pa) can be used as the SI unit. It is possible to carry out the conversion by (1 fm)/(s·Pa)=8.752 (cc)/(m$^2$·day·atm). fm is read as femtometer and represents 1 fm=$10^{-15}$ m.

The thickness of the gas barrier layer is preferably 0.5 μm to 5 μm, and more preferably 1.0 μm to 4.0 μm, from the viewpoint of further improving the light resistance. The thickness of the gas barrier layer is measured according to a method described in Examples to be described later.

The degree of crystallinity of the crystalline resin contained in the gas barrier layer is preferably 25% or more, more preferably 40% or more, and still more preferably 45% or more.

The upper limit value thereof is not particularly limited, and it is practically 55% or less and preferably 50% or less.

The degree of crystallinity of the crystalline resin contained in the gas barrier layer is a value measured and calculated according to the following method based on the method described in J. Appl. Pol. Sci., 81, 762 (2001).

Using a differential scanning calorimeter (DSC), a temperature of a sample peeled from the gas barrier layer is raised at 10° C./min over the range of 20° C. to 260° C., and a heat of fusion 1 is measured. Further, as a heat of fusion 2 of the perfect crystal, the value described in J. Appl. Pol. Sci., 81, 762 (2001) is used. Using the obtained heat of fusion 1 and heat of fusion 2, the degree of crystallinity is calculated according to the following expression.

$$[\text{Degree of crystallinity (\%)}]=([\text{heat of fusion 1}]/[\text{heat of fusion 2}])\times 100$$

Specifically, the degree of crystallinity is a value measured and calculated according to the method described in Examples to be described later. The heat of fusion 1 and heat of fusion 2 may have the same unit, which is generally $Jg^{-1}$.

<Manufacturing Method for Gas Barrier Layer>

The method of forming the gas barrier layer is not particularly limited, and examples thereof include a forming method according to a conventional method, according to a casting method such as spin coating or slit coating. In addition, examples thereof include a method of bonding a commercially available resin gas barrier film or a resin gas barrier film produced in advance to the wavelength selective absorption filter according to the embodiment of the present invention.

<Optical Film>

The wavelength selective absorption filter according to the embodiment of the present invention may appropriately have, in addition to the gas barrier layer, any optical film as long as the effect of the present invention is not impaired.

The optional optical film is not particularly limited in terms of any of optical properties and materials, and a film containing (or containing as a main component) at least any of a cellulose ester resin, an acrylic resin, a cyclic olefin resin, and a polyethylene terephthalate resin can be preferably used. It is noted that an optically isotropic film or an optically anisotropic phase difference film may be used.

For the above optional optical films, for example, Fujitac TD80UL (manufactured by FUJIFILM Corporation) or the like can be used as a film containing a cellulose ester resin.

Regarding the optional optical film, as those containing an acrylic resin, an optical film containing a (meth)acrylic resin containing a styrene-based resin described in JP4570042B, an optical film containing a (meth)acrylic resin having a glutarimide ring structure in a main chain described in JP5041532B, an optical film containing a (meth)acrylic resin having a lactone ring structure described in JP2009-122664A, and an optical film containing a (meth)acrylic resin having a glutaric anhydride unit described in JP2009-139754A can be used.

Further, regarding the optional optical films, as those containing a cyclic olefin resin, cyclic olefin-based resin film described in paragraphs [0029] and subsequent paragraphs of JP2009-237376A, and cyclic olefin resin film containing an additive reducing Rth described in JP4881827B or JP2008-063536B can be used.

In addition, the above-described optional optical film may contain an ultraviolet absorbing agent. As the ultraviolet absorbing agent, a commonly used compound can be used without particular limitation.

The content of the ultraviolet absorbing agent in the ultraviolet absorption layer is appropriately adjusted according to the intended purpose.

<<Manufacturing Method for Laminate>>

In a case where the laminate according to the embodiment of the present invention has the above-described gas barrier layer or any optical film, in addition to the wavelength selective absorption filter according to the embodiment of the present invention, a laminate consisting of these wavelength selective absorption filter and gas barrier layer and/or any optical film can be produced by using the above-described manufacturing method for a wavelength selective absorption filter and manufacturing method for a gas barrier layer.

Examples thereof include a method of directly producing the above-described gas barrier layer on the wavelength selective absorption filter produced according to the above-described production method. In this case, it is also preferable to apply a corona treatment to the surface of the wavelength selective absorption filter to which the gas barrier layer is provided.

Further, in a case where the above-described optional optical film is provided, it is also preferable to carry out bonding by interposing a pressure sensitive adhesive layer. For example, it is also preferable to provide the gas barrier layer on the wavelength selective absorption filter, and then bond an optical film containing an ultraviolet absorbing agent with a pressure sensitive adhesive layer or an adhesive layer being interposed.

[Display Device]

The display device according to the embodiment of the present invention includes the wavelength selective absorption filter according to the embodiment of the present invention.

As another configuration of the display device according to the embodiment of the present invention, a configuration of a generally used display device can be used without particular limitation, as long as it is a configuration in which the wavelength selective absorption filter according to the embodiment of the present invention is included at such a position at which the external light antireflection function is exhibited (as long as it is such a configuration that a gas barrier layer is positioned at least closer to the external light side than the wavelength selective absorption filter according to the embodiment of the present invention in a case where the gas barrier layer is included).

The display device is not particularly limited; however, it is preferably a self-luminous type display device (a self-luminous display device) that includes a light emitting diode as a light emitting source, such as an organic light emitting diode (OLED) display device, a micro light emitting diode (micro LED) display device, or a mini light emitting diode (mini LED) display device, from the viewpoint that the excellent light resistance exhibited by the wavelength selective absorption filter according to the embodiment of the present invention can be more effectively exhibited in a case where the wavelength selective absorption filter according to the embodiment of the present invention is included.

The configuration example of the self-luminous display device is not particularly limited, and examples thereof include a display device including glass, a layer containing a thin film transistor (TFT), a light emitting element, the wavelength selective absorption filter according to the embodiment of the present invention, and a surface film, in order from the opposite side to external light.

As a light source of the display light of the self-luminous display device, a single blue color may be used, or the three primary colors of blue, green, and red may be used, as long as the light emitting diode is provided as a light emitting source. Among the above, it is particularly preferable to use a combination of a blue light source that emits light in a wavelength range of 440 nm to 470 nm, a green light source that emits light in a wavelength range of 520 nm to 560 nm, and a red light source that emits light in a wavelength range of 620 nm to 660 nm.

In the present invention, the mini LED means an LED having a chip size of about 100 to 200 μm square, and the micro LED means an LED having a chip size of less than 100 m square. Preferred examples of the micro LED include the micro LED described in WO2014/204694A.

The self-luminous display device can maintain an excellent level of absorbance of the dye contained in the wavelength selective absorption filter according to the embodiment of the present invention even in a case where the laminate that is used in the present invention is configured to include the wavelength selective absorption filter according to the embodiment of the present invention as an antireflection unit instead of the circularly polarizing plate.

Furthermore, in a case where the dye contained in the wavelength selective absorption filter according to the embodiment of the present invention is in the form of containing four dyes A to D in combination as described above, it is possible to exhibit an excellent level of light resistance that outweighs the decrease in light resistance due to the mixing of the dyes.

That is, the circularly polarizing plate having the antireflection function is generally used as the surface film. However, by adopting the wavelength selective absorption filter according to the embodiment of the present invention, the display device according to the embodiment of the present invention which includes a self-luminous display device can exhibit an excellent effect without using the circularly polarizing plate. It is noted that it does not interfere the combination use of the antireflection film, as the configuration of the display device according to the embodiment of the present invention (including a self-luminous display device) as long as the effect of the present invention is not impaired.

<Pressure Sensitive Adhesive Layer>

In the self-luminous display device, it is preferable that the wavelength selective absorption filter according to the embodiment of the present invention is bonded to the glass (the base material) with a pressure sensitive adhesive layer being interposed, on a surface positioned opposite to the side of the external light.

The composition of the pressure sensitive adhesive composition that is used for forming the pressure sensitive adhesive layer is not particularly limited, and for example, a pressure sensitive adhesive composition containing a base resin having a mass average molecular weight ($M_w$) of 500,000 or more may be used. In a case where the mass average molecular weight of the base resin is less than 500,000, the durability reliability of the pressure sensitive adhesive may decrease due to a decrease in cohesive force causing bubbles or peeling phenomenon under at least one of the high temperature condition or the high humidity condition. The upper limit of the mass average molecular weight of the base resin is not particularly limited. However, in a case where the mass average molecular weight is excessively increased, the coating property may deteriorate due to the increase in viscosity, and thus the upper limit thereof is preferably 2,000,000 or less.

The specific kind of the base resin is not particularly limited, and examples thereof include an acrylic resin, a silicone-based resin, a rubber-based resin, and an ethylene-vinyl acetate (EVA)-based resin. In a case of being applied to an optical device such as a liquid crystal display device, an acrylic resin is mainly used in that the acrylic resin is excellent in transparency, oxidation resistance, and resistance to yellowing, and it is not limited thereto.

Examples of the acrylic resin include a polymer of monomer mixture containing 80 parts by mass to 99.8 parts by mass of the (meth)acrylic acid ester monomer; and 0.02 parts by mass to 20 parts by mass (preferably 0.2 parts by mass to 20 parts by mass) of another crosslinkable monomer.

The kind of the (meth)acrylic acid ester monomer is not particularly limited, and examples thereof include alkyl (meth)acrylate. In this case, in a case where the alkyl group contained in the monomer becomes an excessively long chain, the cohesive force of the pressure sensitive adhesive may decrease, and it may be difficult to adjust the glass transition temperature ($T_g$) or the adhesiveness. Therefore, it is preferable to use a (meth)acrylic acid ester monomer having an alkyl group having 1 to 14 carbon atoms. Examples of such a monomer include methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate, isobornyl (meth)acrylate, and tetradecyl (meth)acrylate. In the present invention, the above-described monomers may be used alone or two or more kinds thereof may be used in combination. The (meth)acrylic acid ester monomer is preferably contained in an amount of 80 parts by mass to 99.8 parts by mass in 100 parts by mass of the monomer mixture. In a case where the content of the (meth)acrylic acid ester monomer is less than 80 parts by mass, the initial adhesive force may decrease, and in a case where the content exceeds 99.8 parts by mass, the durability may decrease due to the decrease in cohesive force.

The other crosslinkable monomer contained in the monomer mixture reacts with a polyfunctional crosslinking agent described later to impart a cohesive force to the pressure sensitive adhesive, and can impart a crosslinking functional group having a role of adjusting the pressure sensitive adhesive force and durability reliability to the polymer. Examples of such a crosslinkable monomer include a hydroxy group-containing monomer, a carboxy group-containing monomer, and a nitrogen-containing monomer. Examples of the hydroxy group-containing monomer include 2-hydroxyethyl (meth)acrylate, 2-hydroxypropyl (meth)acrylate, 4-hydroxybutyl (meth)acrylate, 6-hydroxyhexyl (meth)acrylate, and 8-hydroxyoctyl (meth)acrylate, 2-hydroxyethylene glycol (meth)acrylate, and 2-hydroxypropylene glycol (meth)acrylate. Examples of the carboxy group-containing monomer include acrylic acid, methacrylic acid, 2-(meth)acryloyloxyacetic acid, 3-(meth)acryloyloxypropyl acid, 4-(meth)acryloyloxybutyl acid, an acrylic acid dimer, itaconic acid, maleic acid, and a maleic acid anhydride. Examples of the nitrogen-containing monomer include (meth)acrylamide, N-vinylpyrrolidone, and N-vinylcaprolactam. In the present invention, these crosslinkable monomers may be used alone, or two or more kinds thereof may be used in combination.

The other crosslinkable monomer may be contained in an amount of 0.02 parts by mass to 20 parts by mass in 100 parts by mass of the monomer mixture. In a case where the content is less than 0.02 parts by mass, the durability reliability of the pressure sensitive adhesive may decrease, and in a case where the content exceeds 20 parts by mass, at least one of the adhesiveness or the peelability may decrease.

The method of producing a polymer using a monomer mixture is not particularly limited, and the polymer can be produced, for example, through a general polymerization method such as solution polymerization, photopolymerization, bulk polymerization, suspension polymerization, or emulsion polymerization. In the present invention, it is particularly preferable to use a solution polymerization method, and solution polymerization is preferably carried out at a polymerization temperature of 50° C. to 140° C. by mixing an initiator in a state where each monomer is uniformly mixed. In this case, examples of the initiator used include azo-based polymerization initiators such as azobisisobutyronitrile and azobiscyclohexanecarbonitrile; and ordinary initiators such as peroxides such as benzoyl peroxide and acetyl peroxide.

The pressure sensitive adhesive composition may further contain 0.1 parts by mass to 10 parts by mass of a crosslinking agent with respect to 100 parts by mass of the base resin. Such a crosslinking agent can impart cohesive force to the pressure sensitive adhesive through a crosslinking reaction with the base resin. In a case where the content of the crosslinking agent is less than 0.1 parts by mass, the cohesive force of the pressure sensitive adhesive may decrease. On the other hand, in a case where the content exceeds 10 parts by mass, durability reliability may decrease due to delamination and floating phenomenon.

The kind of the crosslinking agent is not particularly limited, and for example, any crosslinking agent such as an isocyanate-based compound, an epoxy-based compound, an aziridine-based compound, and a metal chelate-based compound can be used.

Examples of the isocyanate-based compound include tolylene diisocyanate, xylene diisocyanate, diphenylmethane diisocyanate, hexamethylene diisocyanate, isophorone diisocyanate, tetramethylxylene diisocyanate, and naphthalene diisocyanate, and a reactant of any one of these compounds and polyol (for example, trimethylolpropane); examples of the epoxy-based compound include ethylene glycol diglycidyl ether, triglycidyl ether, trimethylolpropane triglycidyl ether, N,N,N', N'-tetraglycidyl ethylenediamine, and glycerin diglycidyl ether; and examples of aziridine-based compounds include N,N'-toluene-2,4-bis(1-aziridine carboxamide), N,N'-diphenylmethane-4,4'-bis(1-aziridine carboxamide), triethylene melamine, bisprothaloyl-1-(2-methylaziridine), and tri-1-aziridinylphosphine oxide. Examples of the metal chelate-based compound include compounds in which at least any one of polyvalent metals such as aluminum, iron, zinc, tin, titanium, antimony, magnesium, and vanadium is coordinated with acetylacetone or ethyl acetoacetate.

The pressure sensitive adhesive composition may further contain 0.01 parts by mass to 10 parts by mass of a silane-based coupling agent with respect to 100 parts by mass of the base resin. The silane-based coupling agent can contribute to the improvement of adhesive reliability in a case where the pressure sensitive adhesive is left for a long time under high temperature or high humidity conditions, particularly improve the adhesive stability in a case where adhering to a glass base material, and improve heat resistance and moisture resistance. Examples of the silane-based coupling agent include γ-glycidoxypropyltrimethoxysilane, γ-glycidoxypropylmethyldiethoxysilane, γ-glycidoxypropyltriethoxysilane, 3-mercaptopropyltrimethoxysilane, vinyltrimethoxysilane, vinyl triethoxysilane, γ-methacryloxypropyltrimethoxysilane, γ-methacryloxypropyltriethoxysilane, γ-aminopropyltriethoxysilane, 3-isocyanuppropyltriethoxysilane, γ-acetoacetatepropyltrimethoxysilane. These silane-based coupling agents may be used alone, or two or more kinds thereof may be used in combination.

The silane-based coupling agent is preferably contained in an amount of 0.01 parts by mass to 10 parts by mass, and still more preferably contained in an amount of 0.05 parts by mass to 1 part by mass, with respect to 100 parts by mass of the base resin. In a case where the content is less than 0.01 parts by mass, the effect of increasing the pressure sensitive adhesive force may not be sufficient, and in a case where the content exceeds 10 parts by mass, durability reliability may decrease, which includes the occurrence of bubbling or peeling phenomenon.

The above-described pressure sensitive adhesive composition can further contain an antistatic agent. As the antistatic agent, any compound can be used, as long as the antistatic agent has excellent compatibility with other components contained in the pressure sensitive adhesive composition such as an acrylic resin, not adversely affect the transparency of the pressure sensitive adhesive, workability, and durability and can impart the antistatic performance to the pressure sensitive adhesive. Examples of the antistatic agent include inorganic salts and organic salts.

The inorganic salt is a salt containing an alkali metal cation or an alkaline earth metal cation as a cation component. Examples of the cation include one or two or more of a lithium ion ($Li^+$), a sodium ion ($Na^+$), a potassium ion ($K^+$), a rubidium ion ($Rb^+$), a cesium ion ($Cs^+$), a beryllium ion ($Be^{2+}$), a magnesium ion ($Mg^{2+}$), a calcium ion ($Ca^{2+}$), a strontium ion ($Sr^{2+}$), and a barium ion ($Ba^{2+}$), and preferred examples thereof include a lithium ion ($Li^+$), a sodium ion ($Na^+$), a potassium ion ($K^+$), a cesium ion ($Cs^+$), a beryllium ion ($Be^{2+}$), a magnesium ion ($Mg^{2+}$), a calcium ion ($Ca^{2+}$), and a barium ion ($Ba^{2+}$). The inorganic salt may be used alone or two or more kinds thereof may be used in combination. A lithium ion ($Li^+$) is particularly preferable in terms of ion safety and mobility within the pressure sensitive adhesive.

The organic salt is a salt containing onium cations as a cation component. The term "onium cation" means ion charged to the cation (+), where at least some of the charge is unevenly distributed on one or more atoms of the nitrogen (N), phosphorus (P), and sulfur (S). The onium cation is a cyclic or acyclic compound, and in the case of a cyclic compound, a non-aromatic or aromatic compound can be adopted. Further, in the case of a cyclic compound, one or more heteroatoms (for example, oxygen) other than nitrogen, phosphorus, or a sulfur atom can be contained. Further, the cyclic or acyclic compound is optionally substituted with a substituent such as a hydrogen atom, a halogen atom, alkyl, or aryl. Further, in the case of an acyclic compound, one or more, preferably four or more substituents can be contained, and in this case, the substituent is a cyclic type or an acyclic substituent or an aromatic or non-aromatic substituent.

The onium cation is preferably a cation containing a nitrogen atom and more preferably an ammonium ion. The ammonium ion is a quaternary ammonium ion or an aromatic ammonium ion.

The pressure sensitive adhesive composition contains an antistatic agent in an amount of 0.01 parts by mass to 5 parts by mass, preferably 0.01 parts by mass to 2 parts by mass, more preferably 0.1 parts by mass to 2 parts by mass, with respect to 100 parts by mass of the base resin. In a case where the content is less than 0.01 parts by mass, the desired antistatic effect may not be obtained, and in a case where the content exceeds 5 parts by mass, the compatibility with other components is reduced and the durability reliability of the pressure sensitive adhesive or the transparency may be deteriorated.

The pressure sensitive adhesive composition further includes a compound capable of forming a coordinate bond with an antistatic agent, specifically, with a cation contained in the antistatic agent (hereinafter, referred to as a "coordinate-bonding compound"). In a case where a coordinate-bonding compound is properly contained, it is possible to effectively impart antistatic performance by increasing the anion concentration inside the pressure sensitive adhesive layer even in a case where a relatively small amount of antistatic agent is used.

The kind of the coordinate-bonding compound that can be used is not particularly limited as long as it has a functional group capable of forming a coordinate bond with the antistatic agent in the molecule, and examples thereof include alkylene oxide-based compounds.

The alkylene oxide-based compound is not particularly limited, and it is preferable to use an alkylene oxide-based compound containing an alkylene oxide unit that has a basic unit having 2 or more carbon atoms, preferably 3 to 12 carbon atoms, and more preferably 3 to 8 carbon atoms.

The alkylene oxide-based compound preferably has a molecular weight of 5,000 or less. The term "molecular weight" that is used in the present invention means the molecular weight or mass average molecular weight of a compound. In the present invention, in a case where the molecular weight of the alkylene oxide-based compound exceeds 5,000, the viscosity may be excessively increased and the coating property may be deteriorated, or the complex forming ability with the metal may be lowered. On the other hand, the lower limit of the molecular weight of the alkylene oxide compound is not particularly limited; however, it is preferably 500 or more, and more preferably 4,000 or more.

In the present invention, in addition to the above-described alkylene oxide-based compound, various coordinate-bonding compounds such as an ester compound having one or more ether bonds disclosed in KR2006-0018495A, an oxalate group-containing compound disclosed in KR2006-0128659A, a diamine group-containing compound, a polyvalent carboxy group—containing compound, or a ketone group-containing compound can be appropriately selected and used as necessary.

The coordinate-bonding compound is preferably contained in the pressure sensitive adhesive composition at a ratio of 3 parts by mass or less with respect to 100 parts by mass of the base resin, more preferably 0.1 parts by mass to 3 parts by mass, and still more preferably, 0.5 parts by mass to 2 parts by mass. In a case where the content exceeds 3 parts by mass, the pressure sensitive adhesive physical properties such as peelability may deteriorate.

From the viewpoint of adjusting the adhesive performance, the pressure sensitive adhesive composition may further contain 1 part by mass to 100 parts by mass of a tackifying resin with respect to 100 parts by mass of the base resin. In a case where the content of the tackifying resin is less than 1 part by mass, the addition effect may not be sufficient, and in a case where the exceeds 100 parts by mass, at least one of the compatibility or the cohesive force improving effect may be lowered. The tackifying resin is not particularly limited, and examples thereof include a (hydrogenated) hydrocarbon resin, a (hydrogenated) rosin resin, a (hydrogenated) rosin ester resin, a (hydrogenated) terpene resin, a (hydrogenated) terpene phenol resin, a polymerized rosin resin, and a polymerized rosin ester resin. These tackifying resins may be used alone, or two or more kinds thereof may be used in combination.

The pressure sensitive adhesive composition may contain one or more additives, as long as the effect of the present invention is not affected, a polymerization initiator such as a thermal polymerization initiator a photopolymerization initiator; an epoxy resin; a curing agent; an ultraviolet stabilizer; an antioxidant; a toning agent, a reinforcing agent; a filler; an antifoaming agent; a surfactant; a photopolymerizable compound such as a polyfunctional acrylate; and a plasticizer.

<Base Material>

In the self-luminous display device, it is preferable that the wavelength selective absorption filter according to the embodiment of the present invention is bonded to the glass (the base material) with a pressure sensitive adhesive layer being interposed, on a surface positioned opposite to the side of the external light.

The method of forming the pressure sensitive adhesive layer is not particularly limited, and for example, a method of applying the pressure sensitive adhesive composition to the wavelength selective absorption filter according to the embodiment of the present invention by a general means such as a bar coater, drying, and curing the pressure sensitive adhesive composition; a method of applying the pressure sensitive adhesive composition first to the surface of a peelable base material, and drying the composition, and then transferring the pressure sensitive adhesive layer using the peelable base material to the wavelength selective absorption filter according to the embodiment of the present invention and then aging and curing the composition is used.

The peelable base material is not particularly limited, and any peelable base material can be used. For example, the release film in the manufacturing method for the wavelength selective absorption filter according to the embodiment of the present invention described above is exampled.

In addition, the conditions of application, drying, aging, and curing can be appropriately adjusted based on a conventional method.

EXAMPLES

Hereinafter, the present invention will be described in more detail based on Examples. The materials, using amount, ratio, details of treatment, procedures of treatment, and the like described in Examples below can be appropriately changed without departing from the spirit of the present invention. Therefore, it is to be understood that the scope of the present invention is not limited to Examples described below.

It is noted that "parts" and "%" that indicate the composition in Examples below are based on mass unless otherwise specified. In addition, $\lambda_{max}$ means the maximal absorption wavelength at which the maximum absorbance is exhibited in the measurement of the absorbance maximal value and the 20% value wavelength of the wavelength selective absorption filter described later.

[Production of Wavelength Selective Absorption Filter]

A wavelength selective absorption filter was produced according to the following procedure.

The materials used in the production of the wavelength selective absorption filter are shown below.

<Matrix Resin>

(Resin 9)

Apel APL6011T (product name, manufactured by Mitsui Chemicals, Inc., a copolymer of ethylene and norbornene, Tg: 105° C.), which is a cyclic polyolefin resin, was used as the resin 9.

(Resin 10)

Arton RX4500 (product name, manufactured by JSR Corporation, a norbornene-based polymer, Tg: 132° C.), which is a cyclic polyolefin resin, was used as a resin 10.

(Peelability Control Resin Component 2)

TUFTEC H1043 (product name, manufactured by Asahi Kasei Corporation, a hydrogenated styrene-based thermoplastic elastomer (SEBS))

(Peelability Control Resin Component 3)

TUFTEC M1943 (product name, manufactured by Asahi Kasei Corporation, a hydrogenated styrene-based thermoplastic elastomer (SEBS))

<Coloring Agent>

As the dye A, each of the E-14, E-24, and E-40, as well as the following Compound Example 5 used in Example of WO2014/208749A were used. In addition, as the dye B, each of the following 7-11 and 7-23, as the dye C, each of the following C-73 and C-80, and as the dye D, each of the following F-34 and F-35 were used.

E-24

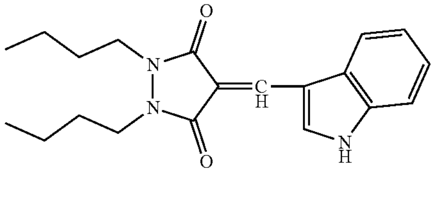

E-40

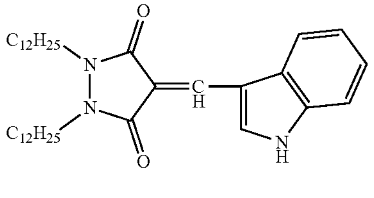

-continued
7-11
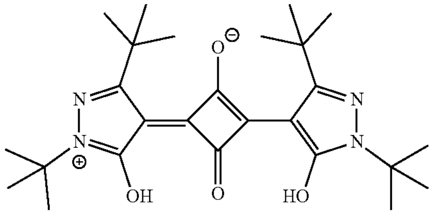
C-73
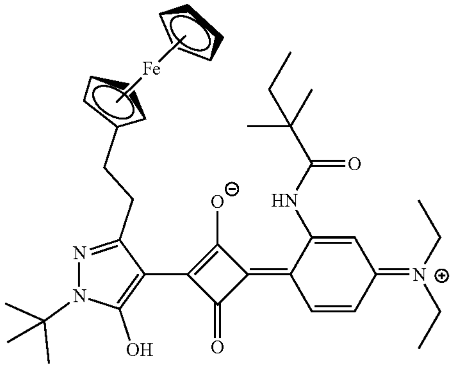
F-34
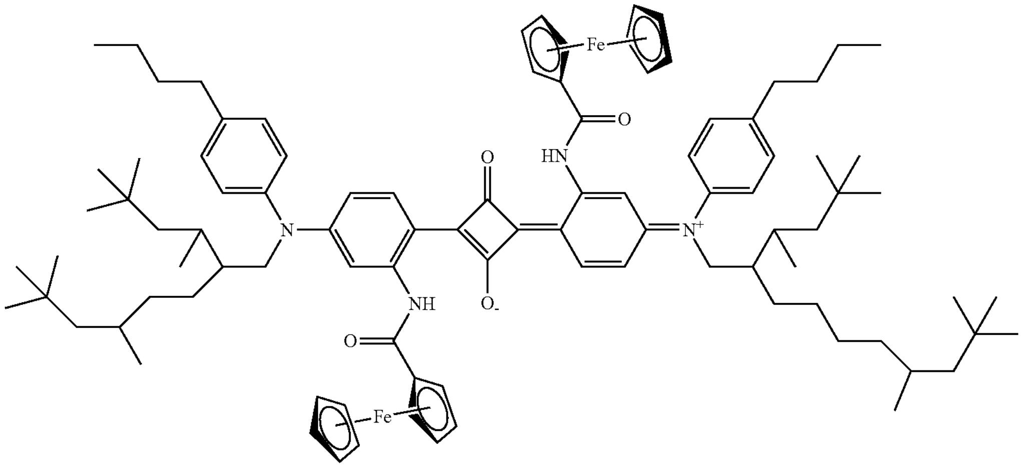
Compound Example 5
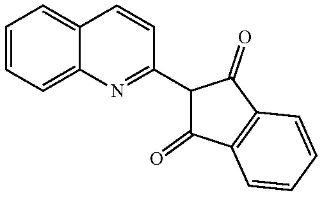
E-14
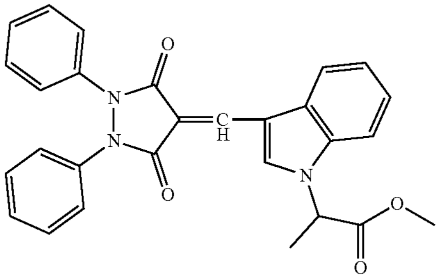
7-23
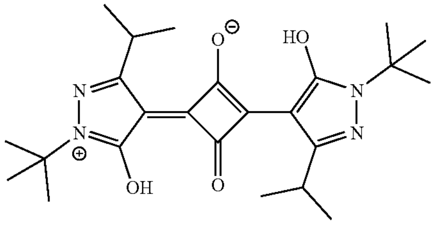
C-80
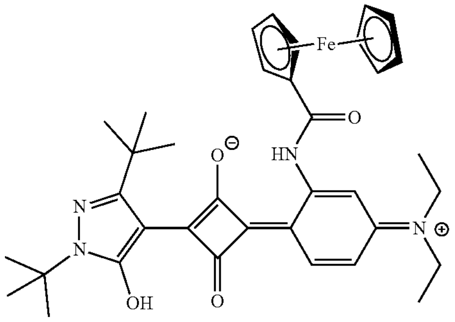

-continued
F-35
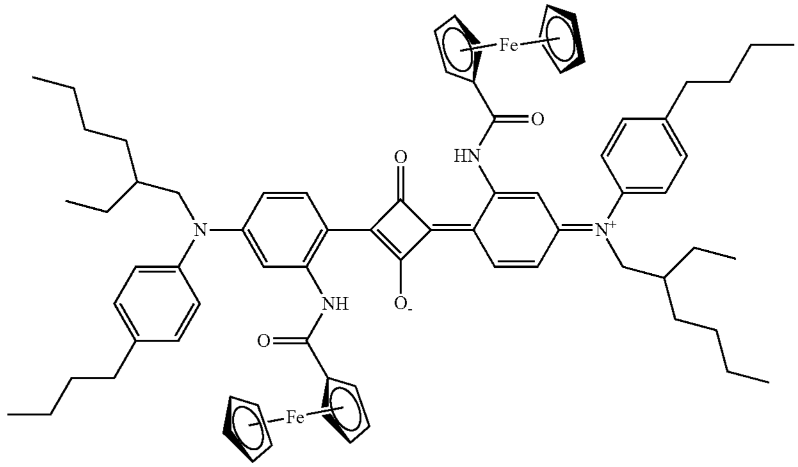
<Additive>
(Association Inhibitor)
The following compounds were used as the association inhibitor.
Association inhibitor 301
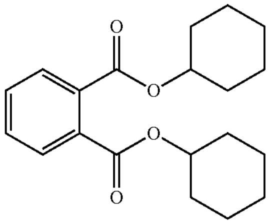
Association inhibitor 302
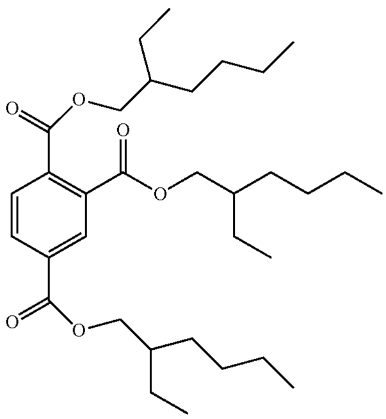
-continued
Association inhibitor 303
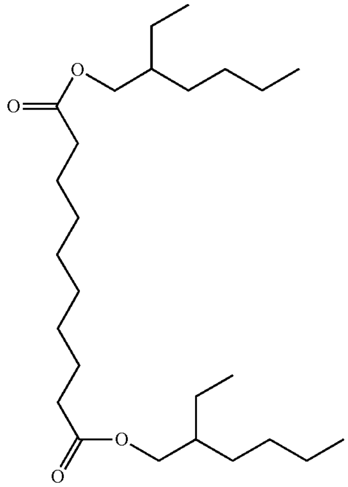
Association inhibitor 304
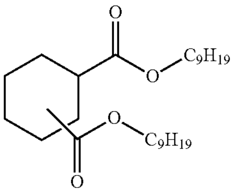
mixture of branced chain isomers
Association inhibitor 305
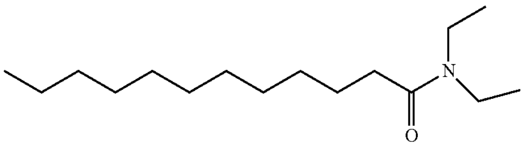

-continued

Association inhibitor 306

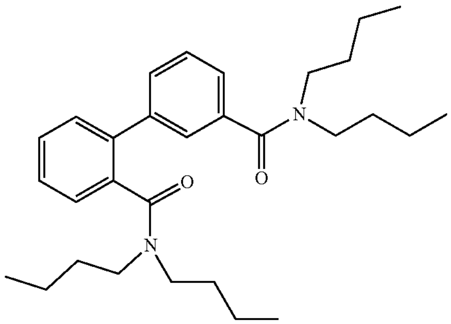

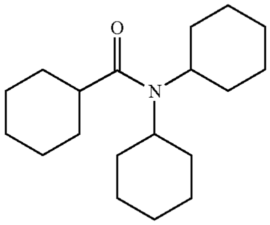

FB-6

(Base Material 1)

A cellulose acylate film (manufactured by FUJIFILM Corporation, product name: ZRD40SL) was used as a base material 1.

(Base Material 4)

A polyethylene terephthalate film (manufactured by Mitsubishi Chemical Corporation, product name: DIAFOIL, T600E50, film thickness: 50 m) was used as a base material 4.

EXAMPLES

<Production a of Base Material-Attached Wavelength Selective Absorption Filter>

(1) Preparation of Wavelength Selective Absorption Layer Forming Liquid A

Each component was mixed according to the composition shown below to prepare a wavelength selective absorption layer forming liquid A.

| Composition of wavelength selective absorption layer forming liquid A | |
|---|---|
| Resin 9 | 87.4 parts by mass |
| Peelability control resin component 2 | 3.4 parts by mass |
| Leveling agent: MEGAFACE F-554 (manufactured by DIC Corporation, fluoropolymer) | 0.16 parts by mass |
| Dye E-40 | 3.80 parts by mass |
| Association inhibitor 301 | 5.20 parts by mass |
| Cyclohexane (solvent) | 655.0 parts by mass |
| Ethyl acetate (solvent) | 115.0 parts by mass |

Subsequently, the obtained wavelength selective absorption layer forming liquid A was filtered using a filter paper (#63, manufactured by Toyo Filter Paper Co., Ltd.) having an absolute filtration precision of 10 μm, and further filtered using a metal sintered filter (FH025, manufactured by Pall) with an absolute filtration precision of 2.5 μm.

(2) Production of Base Material-Attached Wavelength Selective Absorption Filter No. 101

The above-described wavelength selective absorption layer forming liquid A after the filtration treatment was applied onto the base material 1 by using a bar coater so that the film thickness after drying was 1.9 μm, and dried at 120° C. to produce a base material-attached wavelength selective absorption filter No. 101.

(3) Production of Base Material-Attached Wavelength Selective Absorption Filter Nos. 102 to 109 and C201 to C204

Base material-attached wavelength selective absorption filter Nos. 102 to 109 and C201 to C204 were produced in the same manner as in the production of No. 101, except that at least any one among the kind and amount of the dye and the kind and amount of the association inhibitor to the content shown in Table 1 below.

<Production B of Base Material-Attached Wavelength Selective Absorption Filter>

(Base Material 2)

A cellulose acylate film (manufactured by FUJIFILM Corporation, product name: ZRD40SL) was immersed in a 2.3 mol/L sodium hydroxide aqueous solution at 55° C. for 3 minutes. Washing was carried out in a water washing bath at room temperature (25° C.), and neutralization was carried out at 30° C. with 0.05 mol/L sulfuric acid. Washing was carried out again in a water washing bath at room temperature (25° C.), and drying was carried out with warm air at 100° C. A cellulose acylate film subjected to the saponification treatment in this way was used as a base material 2.

(1) Preparation of Wavelength Selective Absorption Layer Forming Liquid B

Each component was mixed according to the composition shown below to prepare a wavelength selective absorption layer forming liquid B.

| Composition of wavelength selective absorption layer forming liquid B | |
|---|---|
| Resin 10 | 86.1 parts by mass |
| Peelability control resin component 3 | 3.4 parts by mass |
| Leveling agent: MEGAFACE F-554 (manufactured by DIC Corporation, fluorine-based polymer) | 0.16 parts by mass |
| Dye E-24 | 3.43 parts by mass |
| Dye 7-11 | 0.53 parts by mass |
| Dye C-73 | 0.17 parts by mass |
| Dye F-34 | 2.08 parts by mass |
| Association inhibitor 303 | 4.10 parts by mass |
| Cyclohexane (solvent) | 1018.3 parts by mass |
| Ethyl acetate (solvent) | 548.3 parts by mass |

Subsequently, the obtained wavelength selective absorption layer forming liquid B was filtered using a filter paper (#63, manufactured by Toyo Filter Paper Co., Ltd.) having an absolute filtration precision of 10 μm, and further filtered using a metal sintered filter (FH025, manufactured by Pall) with an absolute filtration precision of 2.5 μm.

(2) Production of Base Material-Attached Wavelength Selective Absorption Filter No. 110

The above-described wavelength selective absorption layer forming liquid B after the filtration treatment was applied onto the base material 2 by using a bar coater so that the film thickness after drying was 1.2 μm, and dried at 120° C. to produce a base material-attached wavelength selective absorption filter No. 110.

(3) Production of Base Material-Attached Wavelength Selective Absorption Filter Nos. 111 to 115 and C205 and C206

Base material-attached wavelength selective absorption filter Nos. 111 to 115 and C205 and C206 were produced in the same manner as in the production of No. 110, except that at least any one among the kind of base material, the kind and amount of the dye, and the kind and amount of the association inhibitor to the content shown in Table 1 below.

Table 1 below summarizes the configuration of each base material-attached-attached wavelength selective absorption filter. The base material-attached wavelength selective absorption filter Nos. 101 to 115 are the base material-attached wavelength selective absorption filters according to the embodiment of the present invention, and the base material-attached wavelength selective absorption filter Nos. C201 to C206 are comparative base material-attached wavelength selective absorption filters.

Compound Example 5: Compound Example 5 Used in Example of WO2014/208749A

[Production of Laminate of Gas Barrier Layer and Wavelength Selective Absorption Filter]

A laminate of a gas barrier layer and a wavelength selective absorption filter (hereinafter, simply referred to as a laminate) was produced according to the following procedure. The materials used for the production are shown below.

TABLE 1

| | | | Association inhibitor | | Dye A | | | Dye B | | | Dye C | | | Dye D | | |
|---|---|---|---|---|---|---|---|---|---|---|---|---|---|---|---|---|
| No, | Base material | Resin | Kind | Adding amount | Kind | λmax (nm) | Adding amount | Kind | λmax (nm) | Adding amount | Kind | λmax (nm) | Adding amount | Kind | λmax (nm) | Adding amount |
| 101 | Base material 1 | Resin 9 | 301 | 5.20 | E-40 | 409 | 3.80 | — | — | — | — | — | — | — | — | — |
| 102 | Base material 1 | Resin 9 | 302 | 5.20 | E-40 | 409 | 3.80 | — | — | — | — | — | — | — | — | — |
| 103 | Base material 1 | Resin 9 | 303 | 5.20 | E-40 | 409 | 3.80 | — | — | — | — | — | — | — | — | — |
| 104 | Base material 1 | Resin 9 | 304 | 5.20 | E-40 | 409 | 3.80 | — | — | — | — | — | — | — | — | — |
| 105 | Base material 1 | Resin 9 | 305 | 5.20 | E-40 | 409 | 3.80 | — | — | — | — | — | — | — | — | — |
| 106 | Base material 1 | Resin 9 | 306 | 5.20 | E-40 | 409 | 3.80 | — | — | — | — | — | — | — | — | — |
| 107 | Base material 1 | Resin 9 | FB-6 | 5.20 | E-40 | 409 | 3.80 | — | — | — | — | — | — | — | — | — |
| 108 | Base material 1 | Resin 9 | 301 | 10.40 | E-40 | 409 | 3.80 | — | — | — | — | — | — | — | — | — |
| 109 | Base material 1 | Resin 9 | 301 | 5.20 | — | — | — | — | — | — | — | — | — | F-34 | 700 | 1.19 |
| 110 | Base material 2 | Resin 10 | 303 | 4.10 | E-24 | 409 | 3.43 | 7-11 | 513 | 0.53 | C-73 | 590 | 0.17 | F-34 | 700 | 2.08 |
| 111 | Base material 2 | Resin 10 | 303 | 4.10 | E-24 | 409 | 3.45 | 7-11 | 513 | 0.78 | — | — | — | F-34 | 700 | 2.40 |
| 112 | Base material 2 | Resin 10 | 303 | 4.10 | — | — | — | — | — | — | C-73 | 590 | 0.69 | F-34 | 700 | 2.14 |
| 113 | Base material 4 | Resin 10 | 303 | 4.10 | E-24 | 409 | 1.02 | 7-23 | 505 | 0.56 | C-73 | 590 | 0.30 | F-35 | 700 | 0.86 |
| 114 | Base material 4 | Resin 10 | 303 | 4.10 | E-24 | 409 | 1.02 | 7-23 | 505 | 0.56 | C-80 | 596 | 0.28 | F-35 | 700 | 0.86 |
| 115 | Base material 4 | Resin 10 | 303 | 5.20 | E-14 | 430 | 1.40 | — | — | — | — | — | — | — | — | — |
| C201 | Base material 1 | Resin 9 | — | — | — | — | — | — | — | — | — | — | — | — | — | — |
| C202 | Base material 1 | Resin 9 | — | — | E-40 | 409 | 3.80 | — | — | — | — | — | — | — | — | — |
| C203 | Base material 1 | Resin 9 | — | — | — | — | — | — | — | — | — | — | — | F-34 | 700 | 1.19 |
| C204 | Base material 1 | Resin 9 | 305 | 5.20 | Compound Example 5 | 416 | 2.99 | — | — | — | — | — | — | — | — | — |
| C205 | Base material 2 | Resin 10 | — | — | — | — | — | — | — | — | — | — | — | — | — | — |
| C206 | Base material 4 | Resin 10 | — | — | — | — | — | — | — | — | — | — | — | — | — | — |

(Note in Table 1)
The "—" notation in the column of the dye indicates that the corresponding dye is not contained.

The content of the dye means the content proportion of the dye in the wavelength selective absorption filter in terms of the mass ratio, and the unit thereof is % by mass. The content of the association inhibitor means the content proportion of the association inhibitor in the wavelength selective absorption filter in terms of the mass ratio, and the unit thereof is % by mass. In addition, $\lambda_{max}$ indicates the absorption maximum wavelength of the dye at which the maximum absorbance is exhibited in the measurement of the absorbance maximal value and the 20% value wavelength of the wavelength selective absorption filter described later.

<Resin>

(Resin 4)

AQ-4104 (manufactured by Kuraray Co., Ltd., Exceval AQ-4104 (product name), modified polyvinyl alcohol (a crystalline resin), saponification degree: 98% to 99% by mole)

(Base Material 3)

The wavelength selective absorption filter side of the base material-attached wavelength selective absorption filter No. 101 is subjected to a corona treatment using a corona treatment device (product name: Corona-Plus, manufactured by VETAPHONE), at a discharge amount of 1,000 W min/$m^2$, and at a processing speed of 3.2 m/min and used as a base material 3.

<Production of Laminate No. 101>

(1) Preparation of Resin Solution

Each component was mixed according to the composition shown below, and the mixture was stirred in a constant-temperature tank at 90° C. for 1 hour to dissolve the resin 4 to prepare a gas barrier layer forming liquid 1.

| Composition of gas barrier layer forming liquid 1 | |
|---|---|
| Resin 4 | 4.0 parts by mass |
| Pure water | 96.0 parts by mass |

Subsequently, the obtained gas barrier layer forming liquid 1 was filtered using a filter having an absolute filtration precision of 5 μm (product name: Hydrophobic Fluorepore Membrane, manufactured by Millex).

(2) Production of Laminate

The gas barrier layer forming liquid 1 after the filtration treatment was applied to the corona-treated surface side of the base material 3 using a bar coater so that the film thickness after drying was 1.6 μm, and dried at 120° C. for 60 seconds, and the laminate No. 101 was produced.

This laminate No. 101 has a structure in which the base material 1, the wavelength selective absorption filter No. 101, and the gas barrier layer are laminated in this order.

<Production of Laminate Nos. 102 to 115 and C201 to C206>

Laminate Nos. 102 to 115 and C202 to C204 were produced in the same manner as in the production of the laminate No. 101, except that the kind of the base material-attached wavelength selective absorption filter was changed as shown in Table 2 below. In addition, laminate No. C201 was produced in the same manner as in the production of the laminate No. 101 except that the kind of the base material-attached wavelength selective absorption filter was changed to the wavelength selective absorption filter No. C201, laminate No. C205 was produced in the same manner as in the production of the laminate No. 101 except that the kind of the base material-attached wavelength selective absorption filter was changed to the wavelength selective absorption filter No. C205, and laminate No. C206 was produced in the same manner as in the production of the laminate No. 101 except that the kind of the base material-attached wavelength selective absorption filter was changed to the wavelength selective absorption filter No. C206. Each was prepared.

The laminate Nos. 101 to 115 are laminates including the wavelength selective absorption filters according to the embodiment of the present invention, the laminate Nos. C202 to C204 are comparative laminates, and laminate Nos. C201, C205, and C206 are reference laminates.

<Evaluation of Physical Properties of Gas Barrier Layer>

The degree of crystallinity, oxygen permeability, and thickness of the gas barrier layer were evaluated according to the following methods.

(Degree of Crystallinity)

The gas barrier layer was peeled off by 2 to 3 mg from the laminate produced as described above, and the temperature was raised at 10° C./min in the range of 20° C. to 260° C. using DSC7000X (product name) manufactured by Hitachi High-Tech Science Co., Ltd, and heat of fusion 1 was measured.

The degree of crystallinity of the gas barrier layer was calculated based on the method described in J. Appl. Pol. Sci., 81, 762 (2001). Specifically, the degree of crystallinity was calculated according to the following expression using the above-described heat of fusion 1 and the heat of fusion 2 of the perfect crystal described in J. Appl. Pol. Sci., 81, 762 (2001).

[Degree of crystallinity (%)]=([heat of fusion 1]/[heat of fusion 2])×100

The degree of crystallinity of the gas barrier layers of the laminate Nos. 101 to 112 and c201 to c205, measure in this way, was 53%.

(Thickness)

A cross-sectional image of the laminate was taken using a field emission scanning electron microscope S-4800 (product name) manufactured by Hitachi High-Technologies Corporation, and the thickness was read.

The thicknesses of the gas barrier layers of the laminate Nos. 101 to 115 and c201 to c206, measured in this way, was 1.6 μm.

(Oxygen Permeability)

Laminates were produced in the same manner except that the wavelength selective absorption filter was not subjected to the corona treatment in the production of the laminate Nos. 101 to 115 and Nos. C201 to C206. Next, a triacetyl cellulose film (product name: Fujitac TD80UL, manufactured by FUJIFILM Corporation) having a thickness of 80 μm was bonded on the side of the gas barrier layer of the laminate with a pressure sensitive adhesive 1 (product name: SK2057, manufactured by Soken Chemical Co., Ltd.) having a thickness of about 20 m being interposed. Subsequently, the base material 1, the base material 2, or the base material 4, which corresponds to the base material 3, and the wavelength selective absorption filter were peeled off to prepare oxygen permeability evaluation film Nos. L101 to L115 and LC201 to LC206, which were obtained by laminating a triacetyl cellulose film, the pressure sensitive adhesive 1, and a gas barrier layer in this order by.

Using OX-TRAN 2/21 (product name) manufactured by MOCON as an oxygen permeability measuring device, the oxygen permeability of the oxygen permeability evaluation film was measured by an isobaric method (JIS K 7126-2) under the condition of 25° C., relative humidity 50%, oxygen partial pressure 1 atm, and measurement area 50 $cm^2$.

The oxygen permeability of the laminate Nos. L101 to L115 and LC201 to LC206, measured in this way, was 0.6 $cc/m^2 \cdot day \cdot atm$.

[Evaluation]

The absorbance maximal value and the 20% value wavelength A or D of each of the produced base material-attached wavelength selective absorption filters, and the light resistance of each of the laminates were measured and evaluated as follows. The results are summarized in Table 2.

<1. Absorbance Maximal Value and 20% Value Wavelength of Wavelength Selective Absorption Filter>

(Absorbance of Wavelength Selective Absorption Filter)

Using a UV360 spectrophotometer (product name) manufactured by Shimadzu Corporation, the absorbance of a base material-attached wavelength selective absorption filter in the wavelength range of 380 to 800 nm was measured every 1 nm. An absorbance difference $Ab_x(\lambda)-Ab_0(\lambda)$ between an absorbance $Ab_x(\lambda)$ at each wavelength λ nm of the base material-attached wavelength selective absorption filter containing no dyes and an absorbance $Ab_0(\lambda)$ of the base material-attached wavelength selective absorption filter (that is, the wavelength selective absorption filter No. C201, C205, or C206) was calculated.

It is noted that in base material-attached wavelength selective absorption filter Nos. 101 to 109 and C202 to C204, a base material-attached wavelength selective absorption filter of the No. C201 was used as a base material-attached wavelength selective absorption filter containing no dye, in base material-attached wavelength selective absorption filter Nos. 110 to 112, a base material-attached wavelength selective absorption filter of the No. C205 was used as a base material-attached wavelength selective absorption filter containing no dye, and in base material-attached wavelength selective absorption filter Nos. 113 to 115, a base material-attached wavelength selective absorption filter of the No. C206 was used as a base material-attached wavelength selective absorption filter containing no dye.

(Determination of $\lambda_{max}$)

The maximal absorption wavelength $\lambda_{max}$ was determined based on the above-described $Ab_x(\lambda)-Ab_0(\lambda)$.

(Determination of 20% Value Wavelength)

Subsequently, at the above-described $Ab_x(\lambda)-Ab_0(\lambda)$, a determination was carried out to obtain a wavelength of two wavelengths, on the long wavelength side, which provide an absorbance of 20% with respect to an absorbance maximal value at a wavelength of 390 to 440 nm (the 20% value wavelength A) in a case where a dye having a main absorption wavelength range in a wavelength of 390 to 440 nm was contained. In addition, a determination was carried out to obtain a wavelength of two wavelengths, on the short wavelength side, which provide an absorbance of 20% with respect to an absorbance maximal value at a wavelength of 680 to 780 nm (the 20% value wavelength D) in a case where a coloring agent having a main absorption wavelength range in a wavelength of 680 to 780 nm was contained.

<2. Light Resistance>

(Production of Light Resistance Evaluation Film)

A triacetyl cellulose film (product name: Fujitac TG60UL, manufactured by FUJIFILM Corporation) having a thickness of 60 μm was bonded on the side of the gas barrier layer of the laminate with a pressure sensitive adhesive 1 (product name: SK2057, manufactured by Soken Chemical Co., Ltd.) having a thickness of about 20 μm being interposed. Subsequently, the base material 1, the base material 2, or the base material 4 was peeled off, and glass was bonded to the wavelength selective absorption filter side to which the base material 1, the base material 2, or the base material 4 was bonded while interposing the pressure sensitive adhesive 1, thereby producing a light resistance evaluation film.

The obtained light resistance evaluation film has a configuration in which the lamination is carried out in the following order; glass, a layer of the pressure sensitive adhesive 1, the wavelength selective absorption filter, the gas barrier layer, a layer of the pressure sensitive adhesive agent 1, and the triacetyl cellulose film.

(Absorption Maximum Value of Light Resistance Evaluation Film)

Using a UV3600 spectrophotometer (product name) manufactured by Shimadzu Corporation, the absorbance of the light resistance evaluation film in a wavelength range of 200 to 1,000 nm was measured for every 1 nm. The absorbance difference between the absorbance of the light resistance evaluation film at each wavelength and the absorbance of the light resistance evaluation film having the same configuration except that it does not contain the dye and the association inhibitor was calculated, and the maximum value of this absorbance difference was defined as the absorption maximum value.

It is noted that in light resistance evaluation films of the laminate Nos. 101 to 109 and C202 to C204, the absorbance difference laminate was calculated using the light resistance evaluation film of the laminate No. C201 containing neither dye nor association inhibitor, in light resistance evaluation films of the laminate Nos. 110 to 112, the absorbance difference laminate was calculated using the light resistance evaluation film of the laminate No. C205 containing neither dye nor association inhibitor, and in light resistance evaluation films of the laminate Nos. 113 to 115, the absorbance difference laminate was calculated using the light resistance evaluation film of the laminate No. C206 containing neither dye nor association inhibitor.

(Light Resistance)

The light resistance evaluation film was irradiated with light for 200 hours in an environment of 60° C. and 50% relative humidity with Super Xenon Weather Meter SX75 (product name) manufactured by Suga Test Instruments Co., Ltd., and each of the absorption maximum values before and after this irradiation was measured, and the light resistance was calculated according to the following expression.

[Light resistance (%)]=([absorption maximum value after light irradiation for 200 hours]/[absorption maximum value before light irradiation])×100

TABLE 2

| Base material-attached light absorption filter No. | Laminate No. | 20% value wavelength [nm] Dye A | 20% value wavelength [nm] Dye D | Light resistance residual rate after irradiation with xenon for 200 hours Dye A | Light resistance residual rate after irradiation with xenon for 200 hours Dye D |
|---|---|---|---|---|---|
| 101 | 101 | 451 | — | 83% | — |
| 102 | 102 | 451 | — | 85% | — |
| 103 | 103 | 451 | — | 84% | — |
| 104 | 104 | 451 | — | 84% | — |
| 105 | 105 | 448 | — | 79% | — |
| 106 | 106 | 445 | — | 92% | — |
| 107 | 107 | 445 | — | 87% | — |
| 108 | 108 | 449 | — | 89% | — |
| 109 | 109 | — | 650 | — | 95% |
| 110 | 110 | 445 | 658 | 92% | 95% |
| 111 | 111 | 446 | 657 | 92% | 95% |
| 112 | 112 | — | 657 | — | 95% |
| 113 | 113 | 445 | 658 | 93% | 95% |
| 114 | 114 | 445 | 658 | 93% | 95% |
| 115 | 115 | 454 | — | 85% | — |
| C202 | C202 | 456 | — | 73% | — |
| C203 | C203 | — | 639 | — | 91% |
| C204 | C204 | 465 | — | 73% | — |

(Note in Table 2)
The "—" notation in the columns of the 20% value wavelength and the light resistance evaluation indicates that the corresponding dye is not contained.

From the results in Table 2, the following facts can be seen.

In a case where the dye A having a main absorption wavelength range in a wavelength of 390 to 440 nm was contained, the 20% value wavelength A was 456 nm in the laminate No. C202 containing no association inhibitor, which was outside the range defined by the present invention, and the residual rate after irradiation with xenon for 200 hours was as low as 73%. In addition, in the comparative laminate NO. 204 having the 200% value wavelength A of 465 nm, which was outside the range specified by the present invention, the residual rate after irradiation with xenon for 200 hours was as low as 73% although the comparative laminate No. 204 contained the dye A and the association inhibitor, which are defined by the present invention.

In contrast to these, in any one of the laminate Nos. 101 to 108, 110, 111, and 113 to 115, which contained the dye A and the association inhibitor, which are defined by the present invention, and had the 20% value wavelength A of 455 nm or less, the residual rate of the dye A after irradiation with xenon for 200 hours was 79% or more, and thus excellent light resistance was exhibited.

In addition, in a case where the dye D having a main absorption wavelength range in a wavelength of 680 to 780 nm was contained, the 20% value wavelength A was 639 nm in the laminate No. C203 containing no association inhibitor, which was outside the range defined by the present invention, and the residual rate after irradiation with xenon for 200 hours was 91%.

On the other hand, In contrast to these, in any one of the laminate Nos. 109 to 114, which contained the dye D and the association inhibitor, which are defined by the present invention, and had the 20% value wavelength D of 640 nm or more, the residual rate of the dye D after irradiation with xenon for 200 hours was 95% or more, and thus the light resistance was excellent.

In particular, in a case where the results of Tables 1 and 2 are combined, it can be seen that from the comparison between Nos. C202 and Nos. 101 to 108, in which the same dye E-40 was used as the dye A, and the comparison between Nos. C203 and Nos. 109 to 112, in which the same dye E-34 was used as the dye A, the addition of the association inhibitor defined by the present invention sharpens the absorption waveform without causing a change in the absorption maximum wavelength (ma), and as a result, excellent light resistance is obtained. In addition, it can be seen that regarding Nos. 105 to 107 in which a carboxylic acid amide compound is used as an association inhibitor, more excellent light resistance is obtained in No. 107 in which an association inhibitor having a cyclohexane ring is used has a light resistance of 87%, and No. 106 in which an association inhibitor having a benzene ring is used has a light resistance of 92%, as compared with No. 105 in which an association inhibitor having no ring structure is used.

Although the present invention has been described with reference to the embodiments, it is the intention of the inventors of the present invention that the present invention should not be limited by any of the details of the description unless otherwise specified and rather be construed broadly within the spirit and scope of the invention appended in WHAT IS CLAIMED IS.

This application claims priority based on JP2020-217496 filed in Japan on Dec. 25, 2020, and JP2021-131753 filed in Japan on Aug. 12, 2021, which are incorporated herein by reference as a part of the description regarding the present specification.

EXPLANATION OF REFERENCES

91: wavelength selective absorption filter (wavelength selective absorption layer)
92: gas barrier layer
93: laminate

What is claimed is:

1. A wavelength selective absorption filter comprising:
a resin;
a coloring agent; and
a compound that has at least one polar group of a carboxylic acid ester bond, a carboxylic acid amide bond, a sulfonic acid amide bond, a urethane bond, or a sulfonyl bond and has a molecular weight of 1,000 or less,
wherein the coloring agent includes at least one of the following dye A or the dye D,
in a case of including the dye A, a wavelength of two wavelengths, on a long wavelength side, which provide an absorbance of 20% with respect to an absorbance maximal value at a wavelength of 390 to 440 nm is 455 nm or less, and
in a case of including the dye D, a wavelength of two wavelengths, on a short wavelength side, which provide an absorbance of 20% with respect to an absorbance maximal value at a wavelength of 680 to 780 nm is 640 nm or more,
the dye A: a coloring agent having a main absorption wavelength range at a wavelength of 390 to 440 nm
the dye D: a coloring agent having a main absorption wavelength range at a wavelength of 680 to 780 nm.

2. The wavelength selective absorption filter according to claim 1,
wherein the coloring agent includes both the dye A and the dye D.

3. The wavelength selective absorption filter according to claim 1,
wherein the dye A is a coloring agent represented by General Formula (A1), General Formula (A1)

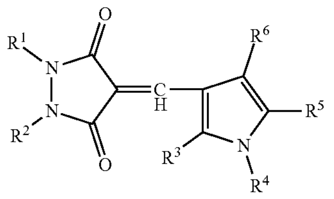

in the formula, $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

4. The wavelength selective absorption filter according to claim 1,
wherein the dye D is a squaraine-based coloring agent represented by General Formula (1), General Formula (1)

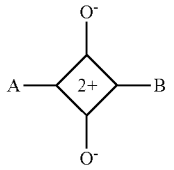

in the formula, A and B each independently represent an aryl group which may have a substituent, a heterocyclic group which may have a substituent, or —CH=G, and G represents a heterocyclic group which may have a substituent.

5. The wavelength selective absorption filter according to claim 1,
wherein the compound having a polar group is a compound having a carboxylic acid ester bond.

6. The wavelength selective absorption filter according to claim 1,
wherein the compound having a polar group is a compound having a carboxylic acid amide bond.

7. The wavelength selective absorption filter according to claim 1, wherein the resin includes a polystyrene resin.

8. The wavelength selective absorption filter according to claim 1, wherein the resin includes a cyclic polyolefin resin.

9. A display device comprising the wavelength selective absorption filter according to claim 1.

10. The display device according to claim 9, wherein the display device is a self-luminous display device.

* * * * *